(12) United States Patent
Yi et al.

(10) Patent No.: US 11,950,494 B2
(45) Date of Patent: Apr. 2, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Jeoungin Yi, Seoul (KR); Seungyeon Kwak, Suwon-si (KR); Juhyun Kim, Seoul (KR); Sangho Park, Anyang-si (KR); Sunyoung Lee, Seoul (KR); Jiyoun Lee, Anyang-si (KR); Yoonhyun Kwak, Seoul (KR); Hyun Koo, Seongnam-si (KR); Sunghun Lee, Hwaseong-si (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 725 days.

(21) Appl. No.: 17/060,677

(22) Filed: Oct. 1, 2020

(65) Prior Publication Data
US 2021/0288268 A1    Sep. 16, 2021

(30) Foreign Application Priority Data
Feb. 14, 2020    (KR) .................. 10-2020-0018566

(51) Int. Cl.
*C09K 11/06*    (2006.01)
*C07F 15/00*    (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 5,755,999 A * 5/1998 Shi ................ C07D 235/18
252/301.36
7,303,826 B2   12/2007 Igarashi et al.
(Continued)

FOREIGN PATENT DOCUMENTS

CN    105906669 A    8/2016
EP    3366690 A1    1/2020
(Continued)

OTHER PUBLICATIONS

Park, Hye Rim, et al. "Luminescence color tuning of the iridium complexes by interligand energy transfer (ILET) with ancillary ligands for organic light emitting diode." Journal of Nanoscience and Nanotechnology 14.7 (2014): 5304-5308. (Year: 2014).*
(Continued)

*Primary Examiner* — Robert S Loewe
(74) *Attorney, Agent, or Firm* — CANTOR COLBURN LLP

(57) ABSTRACT

Provided is an organometallic compound represented by Formula 1, an organic light-emitting device including the same, and an electronic apparatus including the organic light-emitting device.

$$M(L_1)_{n1}(L_2)_{n2} \quad \text{<Formula 1>}$$

M, $L_1$, $L_2$, n1, and n2 in Formula 1 are the same as described in the present specification.

18 Claims, 1 Drawing Sheet

(51) Int. Cl.
*H10K 85/30* (2023.01)
*H10K 50/11* (2023.01)
*H10K 50/15* (2023.01)
*H10K 50/16* (2023.01)
*H10K 50/17* (2023.01)
*H10K 50/18* (2023.01)

(52) U.S. Cl.
CPC .......... *C09K 2211/1007* (2013.01); *C09K 2211/1029* (2013.01); *C09K 2211/1033* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(56) References Cited

U.S. PATENT DOCUMENTS

| | | | |
|---|---|---|---|
| 7,601,436 | B2 | 10/2009 | Djurovich et al. |
| 7,667,228 | B2 | 2/2010 | Okuda et al. |
| 8,017,787 | B2 | 9/2011 | Ragini et al. |
| 8,227,093 | B2 | 7/2012 | Byun et al. |
| 2012/0326103 | A1 | 12/2012 | Mak et al. |
| 2014/0364611 | A1 | 12/2014 | Mak et al. |
| 2017/0309841 | A1 | 10/2017 | Kim et al. |
| 2018/0114928 | A1 | 4/2018 | Lee et al. |
| 2018/0254418 | A1 | 9/2018 | Yoon et al. |
| 2019/0036045 | A1 | 1/2019 | Hwang et al. |

FOREIGN PATENT DOCUMENTS

| | | | |
|---|---|---|---|
| ES | 2642114 | A1 | 11/2017 |
| JP | 1997328678 | A | 12/1997 |
| JP | 2007157899 | A | 6/2007 |
| KR | 1020070078600 | A | 8/2007 |
| KR | 1020070081406 | A | 8/2007 |
| KR | 1020110061920 | A | 6/2011 |
| KR | 1020160045604 | A | 4/2016 |

OTHER PUBLICATIONS

Wu, Chuan, et al. "Efficient and Stable Deep-Red Phosphorescent Organic Light-Emitting Diodes Based on an Iridium Complex Containing a Benzoxazole-substituted Ancillary Ligand." Chemistry—An Asian Journal 8.11 (2013): 2575-2578. (Year: 2013).*

Hao, Yuying, et al. "Multicolor emitting from a single component emitter: New iridium (III) complexes with ancillary ligand 2-(2-hydroxyphenyl) benzothiazole." Synthetic metals 160.11-12 (2010): 1210-1215. (Year: 2010).*

Machine translation of ES-2642114, translation generated May 2023, 71 pages. (Year: 2023).*

Park, Hye Rim, and Yunkyoung Ha. "Luminescence Comparison of Homoleptic and Heteroleptic 6-membered Iridium (III) Complexes." Molecular Crystals and Liquid Crystals 567.1 (2012): 149-155. (Year: 2012).*

Extended European Search Report dated Jun. 9, 2022, in corresponding EP Patent Application No. 21155703.8, 7 pp.

Martinez-Alonso Marta et al., "Strong Influence of the Ancillary Ligand over the Photodynamic Anticancer Properties of Neutral Biscyclometalated IrIII Complexes Bearing 2-Benzoazole-Phenolates," Chemistry—A European Journal, vol. 24, 2018, pp. 17523-17537.

Office Action dated Jun. 9, 2022, in corresponding EP Patent Application No. 21155703.8, 5 pp.

English Abstract of JP 1997-328678.
English Abstract of JP 2007157899.
English Abstract of KR 10-2011-0061920.

* cited by examiner

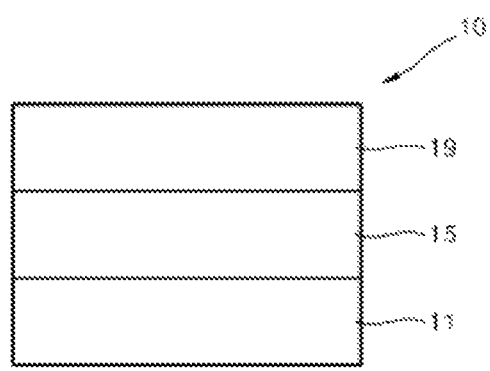

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2020-0018566, filed on Feb. 14, 2020, in the Korean Intellectual Property Office, the content of which is incorporated herein in its entirety by reference.

BACKGROUND

1. Field

One or more embodiments relate to an organometallic compound, an organic light-emitting device including the same, and an electronic apparatus including the organic light-emitting device.

2. Description of Related Art

Organic light-emitting devices are self-emission devices, which have improved characteristics in terms of viewing angles, response times, brightness, driving voltage, and response speed, and produce full-color images.

In an example, an organic light-emitting device includes an anode, a cathode, and an organic layer located between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

An aspect of the present disclosure provides an organometallic compound that emits phosphorescent light and is represented by Formula 1:

$$M(L_1)_{n1}(L_2)_{n2} \qquad \text{<Formula 1>}$$

wherein, in Formula 1,

M is a transition metal, $L_1$ is a ligand represented by Formula 2A or 2B, n1 is 1, 2, or 3, wherein, when n1 is 2 or more, two or more of $L_1$(s) are identical to or different from each other, $L_2$ is a monodentate ligand, a bidentate ligand, a tridentate ligand, or a tetradentate ligand, n2 is 0, 1, 2, 3, or 4, and when n2 is 2 or more, two or more of $L_2$(s) are identical to or different from each other, and $L_1$ and $L_2$ are different from each other,

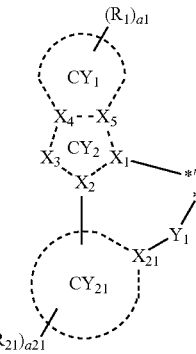

<Formula 2A>

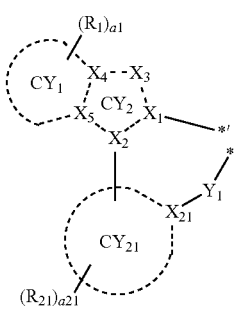

<Formula 2B> wherein, in Formulae 2A and 2B, $Y_1$ is O, S, N($R_a$), C($R_a$)($R_b$), or Si($R_a$)($R_b$), $X_1$, $X_4$, $X_5$ and $X_{21}$ are each independently C or N, $X_2$ is C, $X_3$ is O, S, Se, B($R_2$), N($R_2$), P($R_2$), C($R_2$)($R_3$), Si($R_2$)($R_3$), Ge($R_2$)($R_3$), N, C($R_2$), or Si($R_2$), ring $CY_1$ and ring $CY_{21}$ are each independently a $C_5$-$C_{30}$ carbocyclic group or a $C_1$-$C_{30}$ heterocyclic group, ring $CY_2$ is a 5-membered ring, $R_a$, $R_b$, $R_1$ to $R_3$, and $R_{21}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-N(Q_1)(Q_2)$, $-Si(Q_3)(Q_4)(Q_5)$, $-Ge(Q_3)(Q_4)(Q_5)$, $-B(Q_6)(Q_7)$, $-P(=O)(Q_8)(Q_9)$, or $-P(Q_8)(Q_9)$, a1 and a21 are each independently an integer from 0 to 20, two or more of a plurality of $R_1(s)$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_{21}(s)$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_a$, $R_b$, $R_1$ to $R_3$ and $R_{21}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as explained in connection with $R_{21}$,

* and *' each indicate a binding site to M in Formula 1, and at least one substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, each substituted with at least one deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{11})(Q_{12})$, $-Si(Q_{13})(Q_{14})(Q_{15})$, $-Ge(Q_{13})(Q_{14})(Q_{15})$, $-B(Q_{16})(Q_{17})$, $-P(=O)(Q_{18})(Q_{19})$, or $-P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, each unsubstituted or substituted with at least one deuterium, $-F$, $-Cl$, $-Br$, $-I$, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{21})(Q_{22})$, $-Si(Q_{23})(Q_{24})(Q_{25})$, $-Ge(Q_{23})(Q_{24})(Q_{25})$, $-B(Q_{26})(Q_{27})$, $-P(=O)(Q_{28})(Q_{29})$, $-P(Q_{28})(Q_{29})$, or any combination thereof;

$N(Q_{31})(Q_{32})$, $-Si(Q_{33})(Q_{34})(Q_{35})$, $-Ge(Q_{33})(Q_{34})(Q_{35})$, $-B(Q_{36})(Q_{37})$, $-P(=O)(Q_{38})(Q_{39})$, $-P(Q_{38})(Q_{39})$, or any combination thereof; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; $-F$; $-Cl$; $-Br$; $-I$; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer which is located between the first electrode and the second electrode and includes an emission layer, wherein the organic layer includes at least one organometallic compound represented by Formula 1.

The organometallic compound may be included in the emission layer of the organic layer, and the organometallic compound included in the emission layer may act as a dopant.

Another aspect of the present disclosure provides an electronic apparatus including the organic light-emitting device.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded. Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

$$M(L_1)_{n1}(L_2)_{n2} \qquad \text{<Formula 1>}$$

M in Formula 1 may be a transition metal.

For example, M may be a first-row transition metal of the Periodic Table of Elements, a second-row transition metal of the Periodic Table of Elements, or a third-row transition metal of the Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm)), or rhodium (Rh).

In one or more embodiments, M may be Ir, Pt, Os, or Rh.

$L_1$ in Formula 1 may be a ligand represented by Formula 2A or a ligand represented by Formula 2B:

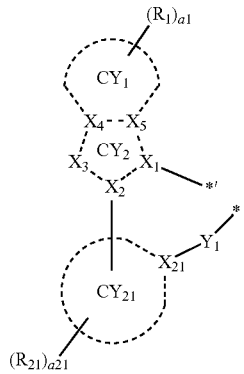

<Formula 2A>

-continued

<Formula 2B>

$$\begin{array}{c}(R_1)_{a1}\\CY_1\phantom{xx}X_4\text{--}X_3\\X_5\phantom{x}CY_2\phantom{x}X_1\\X_2\phantom{xxx}*'\\\phantom{xxxxx}Y_1\phantom{x}*\\\phantom{xxx}X_{21}\\CY_{21}\\(R_{21})_{a21}\end{array}$$

wherein the description of Formulae 2A and 2B are the same as described in the present specification.

n1 in Formula 1 indicates the number of $L_1$, and may be 1, 2, or 3, and when n1 is 2 or more, two or more of $L_1$(s) are identical to or different from each other.

$L_2$ in Formula 1 may be a monodentate ligand, a bidentate ligand, a tridentate ligand, or a tetradentate ligand. $L_2$ is the same as described above.

n2 in Formula 1 indicates the number of $L_2$(s), and may be 0, 1, 2, 3, or 4, and when n2 is 2 or more, two or more of $L_2$(s) are identical to or different from each other.

$L_1$ and $L_2$ in Formula 1 may be different from each other. Accordingly, when n2 in Formula 1 is not 0, the organometallic compound represented by Formula 1 may be a heteroleptic complex.

In one or more embodiments, in Formula 1, i) M may be Ir or Os, and the sum of n1 and n2 may be 3 or 4; or ii) M may be Pt, and the sum of n1 and n2 may be 2.

In one or more embodiments, n2 in Formula 1 may be 1 or 2.

$Y_1$ in Formulae 2A and 2B may be O, S, N($R_a$), C($R_a$)($R_b$), or Si($R_a$)($R_b$). For example, $Y_1$ may be O or S.

In Formulae 2A and 2B, i) $X_1$, $X_4$, $X_5$, and $X_{21}$ may each independently be C or N, ii) $X_2$ may be C, and iii) $X_3$ may be O, S, Se, B($R_2$), N($R_2$), P($R_2$), C($R_2$)($R_3$), Si($R_2$)($R_3$), Ge($R_2$)($R_3$), N, C($R_2$), or Si($R_2$). For example, $X_1$ may be N and $X_{21}$ may be C.

In one or more embodiments, a bond between $X_1$ of Formulae 2A and 2B and M of Formula 1 may be a coordination bond, and a bond between $Y_1$ of Formulae 2A and 2B and M of Formula 1 may be a covalent bond. Thus, the organometallic compound represented by Formula 1 may be electrically neutral.

Ring $CY_1$ and ring $CY_{21}$ in Formula 1 may each independently be a $C_5$-$C_{30}$ carbocyclic group or a $C_1$-$C_{30}$ heterocyclic group.

For example, ring $CY_1$ and ring $CY_{21}$ may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $CY_1$ and ring $CY_{21}$ may each independently be a cyclopentene group, a cyclohexene group, a benzene group, a naphthalene group, an anthracene group, a phenanthrene group, a triphenylene group, a pyrene group, a chrysene group, cyclopentadiene group, a 1,2,3,4-tetrahydronaphthalene group, a thiophene group, a furan group, a pyrrole group, an indole group, a borole group, a silole group, a phosphole group, a germole group, a selenophene group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, ring $CY_1$ may be a benzene group, a pyridine group, or a pyrimidine group, and ring $CY_{21}$ may be a benzene group, a naphthalene group, a fluorene group, a carbazole group, a dibenzofuran group, or a dibenzothiophene group.

Ring $CY_2$ in Formulae 2A and 2B may be a 5-membered ring.

$R_a$, $R_b$, $R_1$ to $R_3$, and $R_{21}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), $Q_1$ to $Q_9$ are the same as described in the present specification.

In one or more embodiments, $R_a$, $R_b$, $R_1$ to $R_3$, and $R_{21}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $R_2$ and $R_3$ may each independently be a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group.

In one or more embodiments, $R_a$, $R_b$, $R_1$ to $R_3$, and $R_{21}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-132, a group represented by one of Formulae 10-1 to 10-132 in which at least one hydrogen is substituted with deuterium, a group represented by one of Formulae 10-1 to 10-132 in which at least one hydrogen is substituted with —F, a group represented by one of Formulae 10-201 to 10-353, a group represented by one of Formulae 10-201 to 10-353 in which at least one hydrogen is substituted with deuterium, a group represented by one of Formulae 10-201 to 10-353 in which at least one hydrogen is substituted with —F, —$N(Q_1)(Q_2)$, —$Si(Q_3)(Q_4)(Q_5)$, or —$Ge(Q_3)(Q_4)(Q_5)$($Q_1$ to $Q_5$ are the same as described in the present specification):

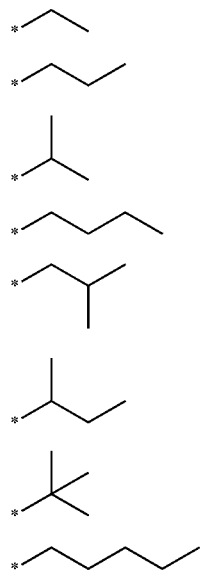

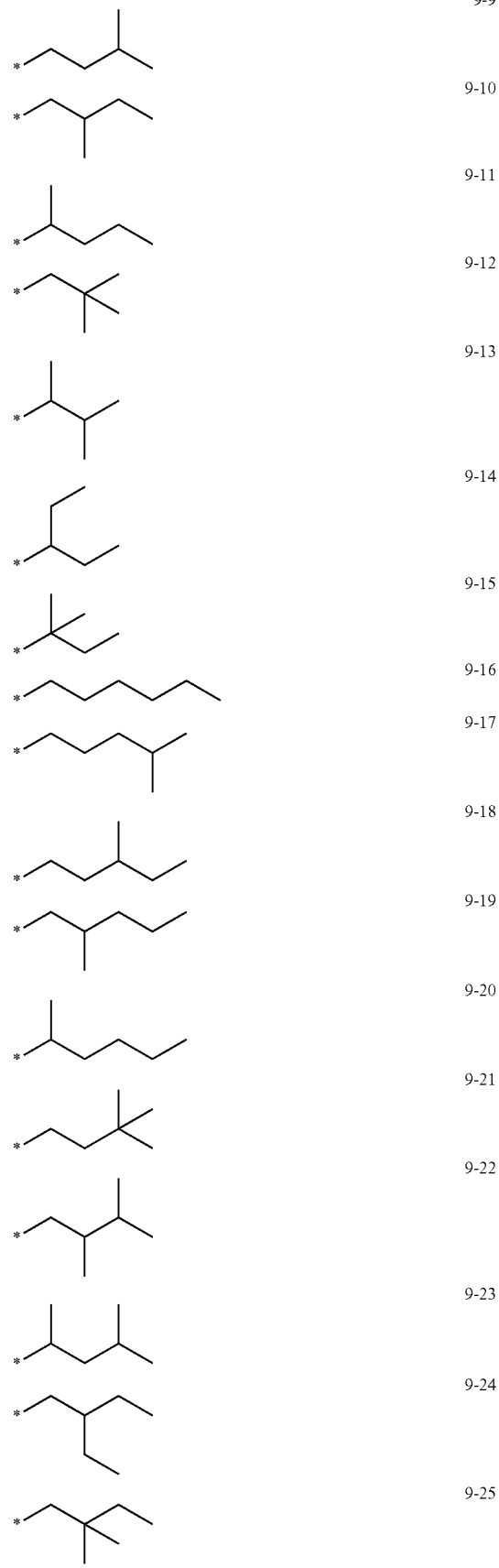

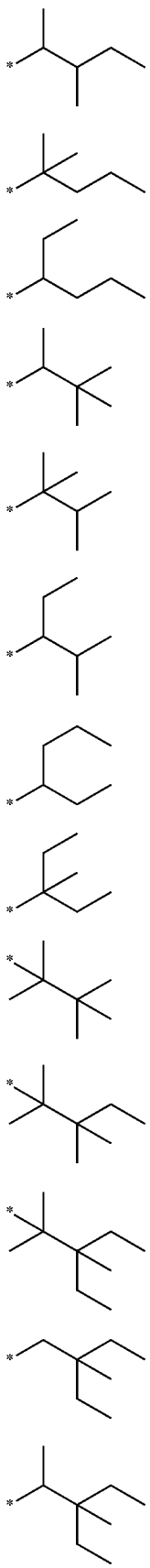
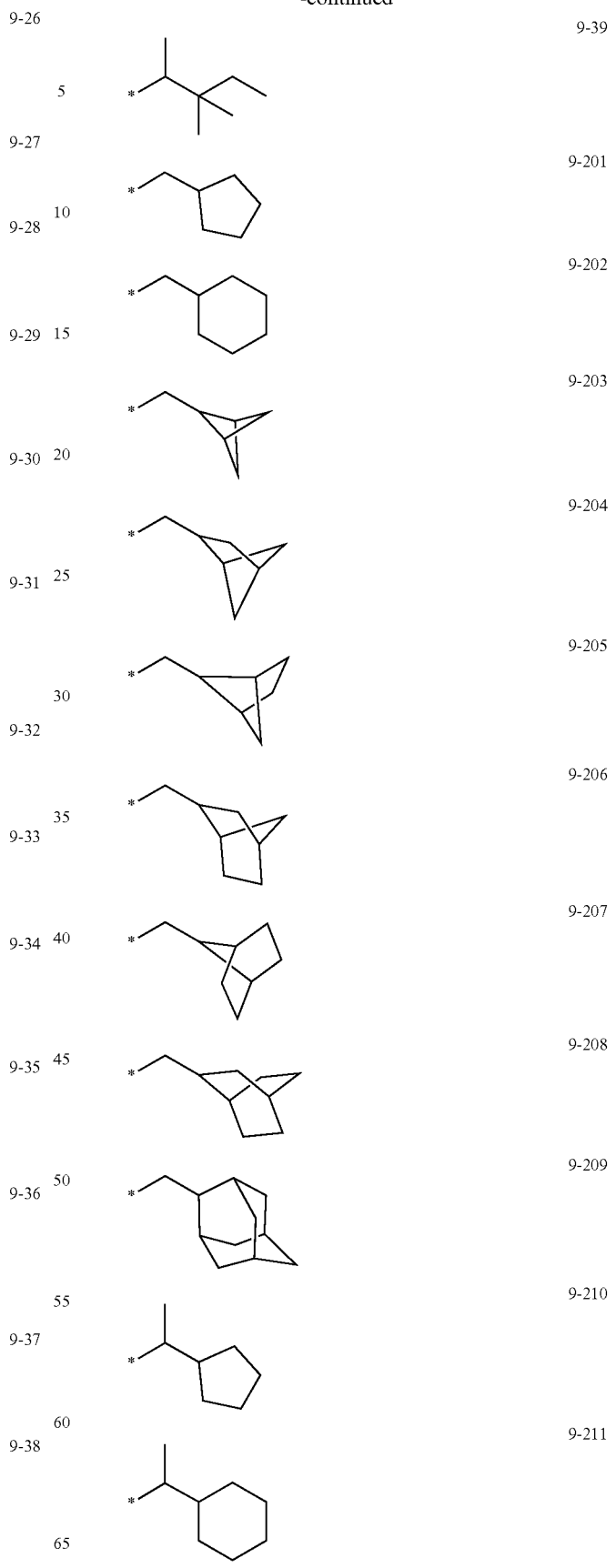

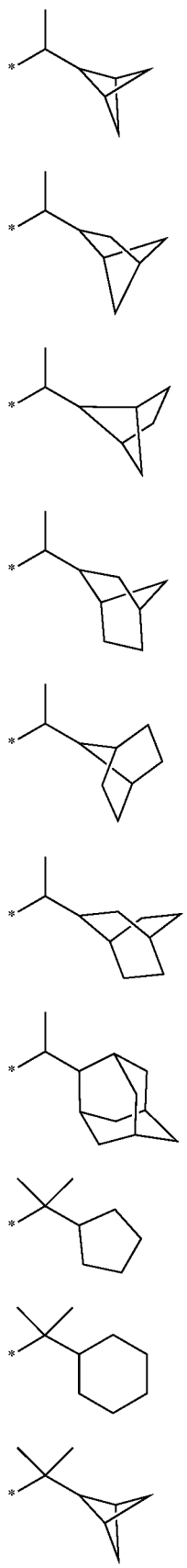
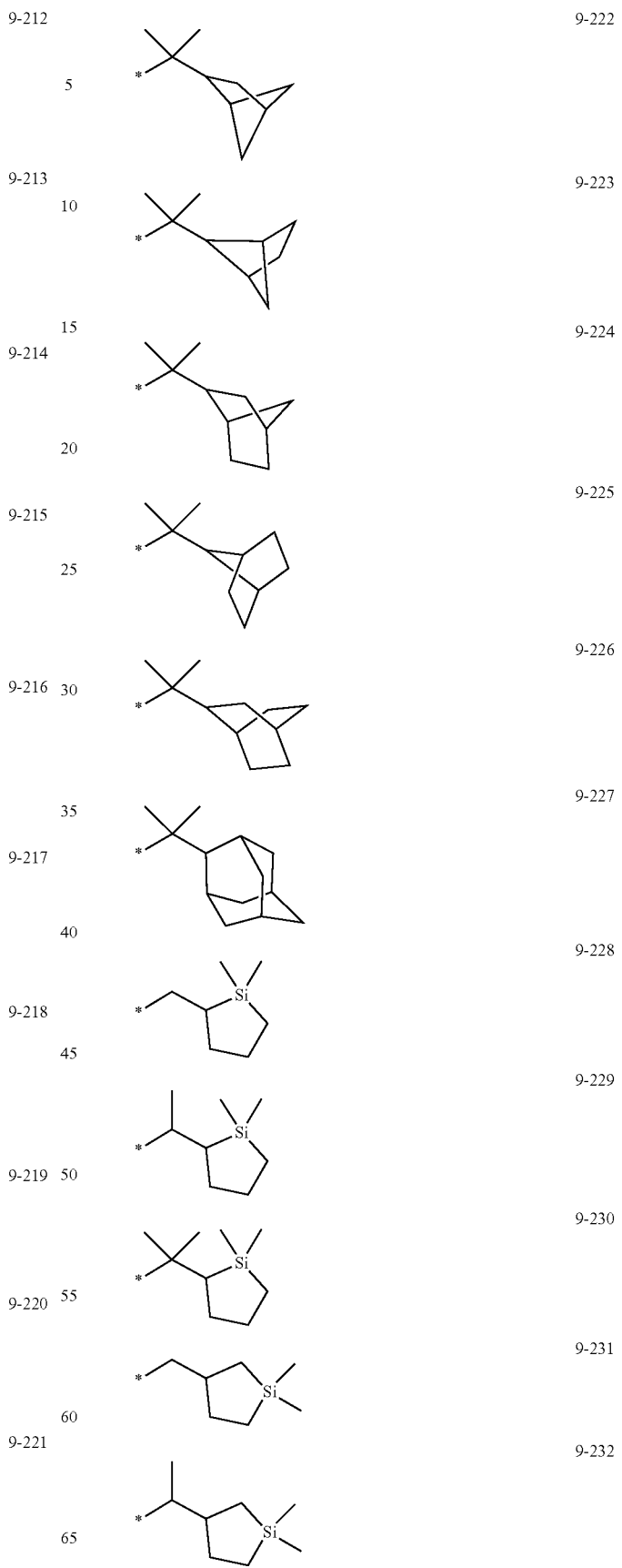

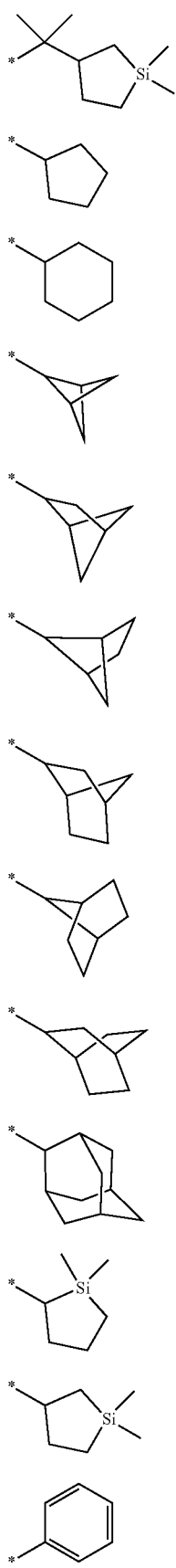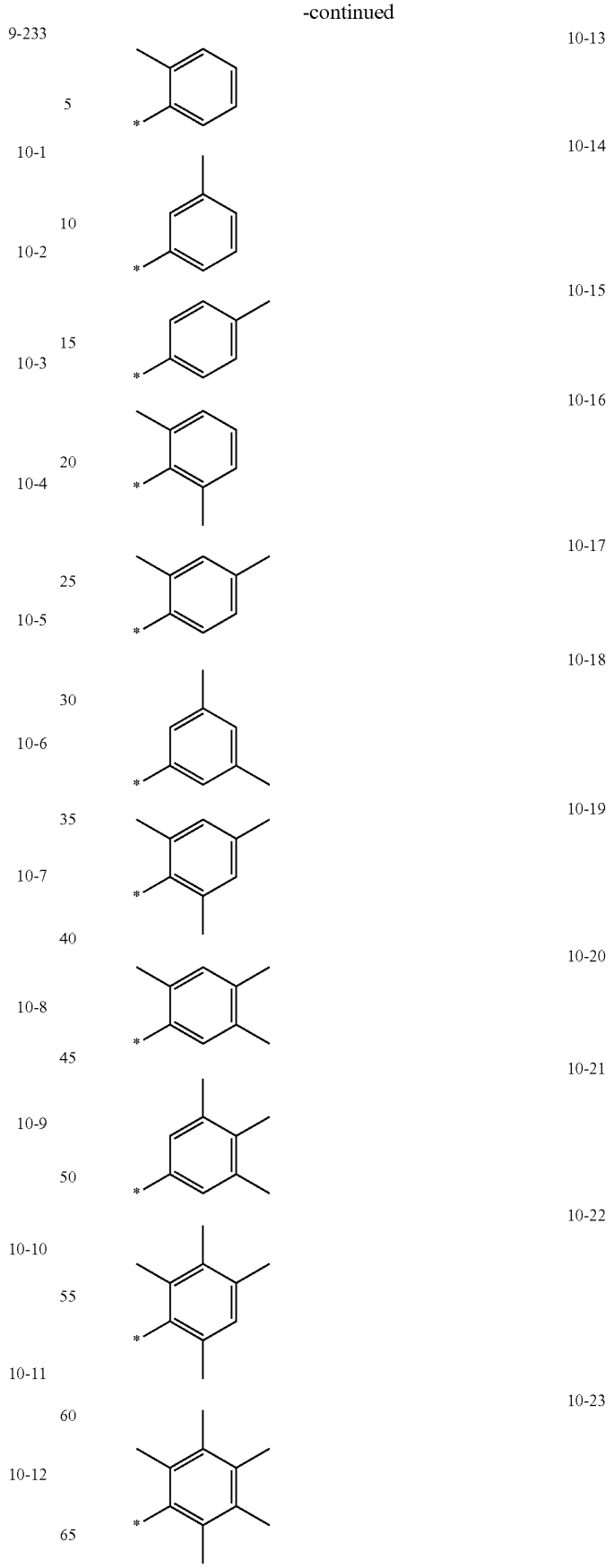

-continued
10-24 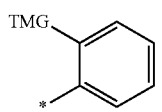
10-25 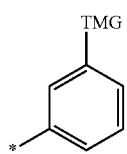
10-26 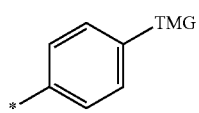
10-27 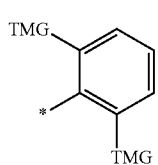
10-28 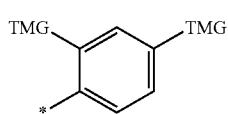
10-29 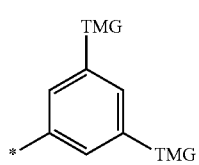
10-30 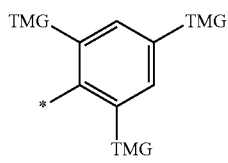
10-31 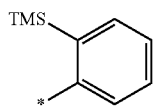
10-32 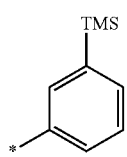
10-33 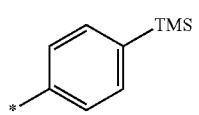
10-34 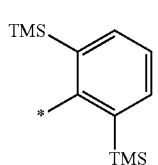
-continued
10-35 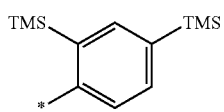
10-36 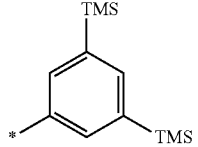
10-37 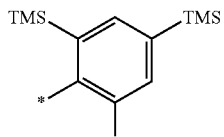
10-38 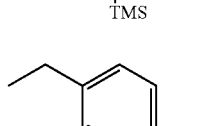
10-39 
10-40 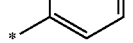
10-41 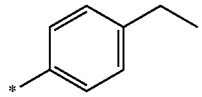
10-42 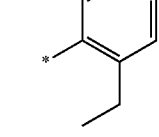
10-43 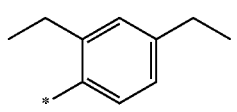
10-44 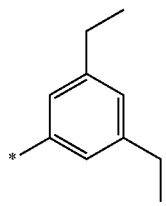
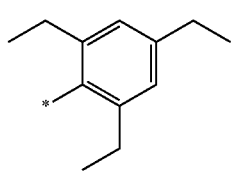

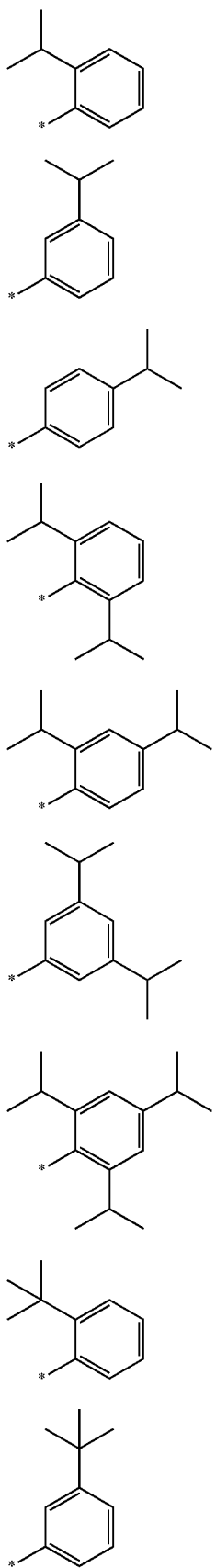
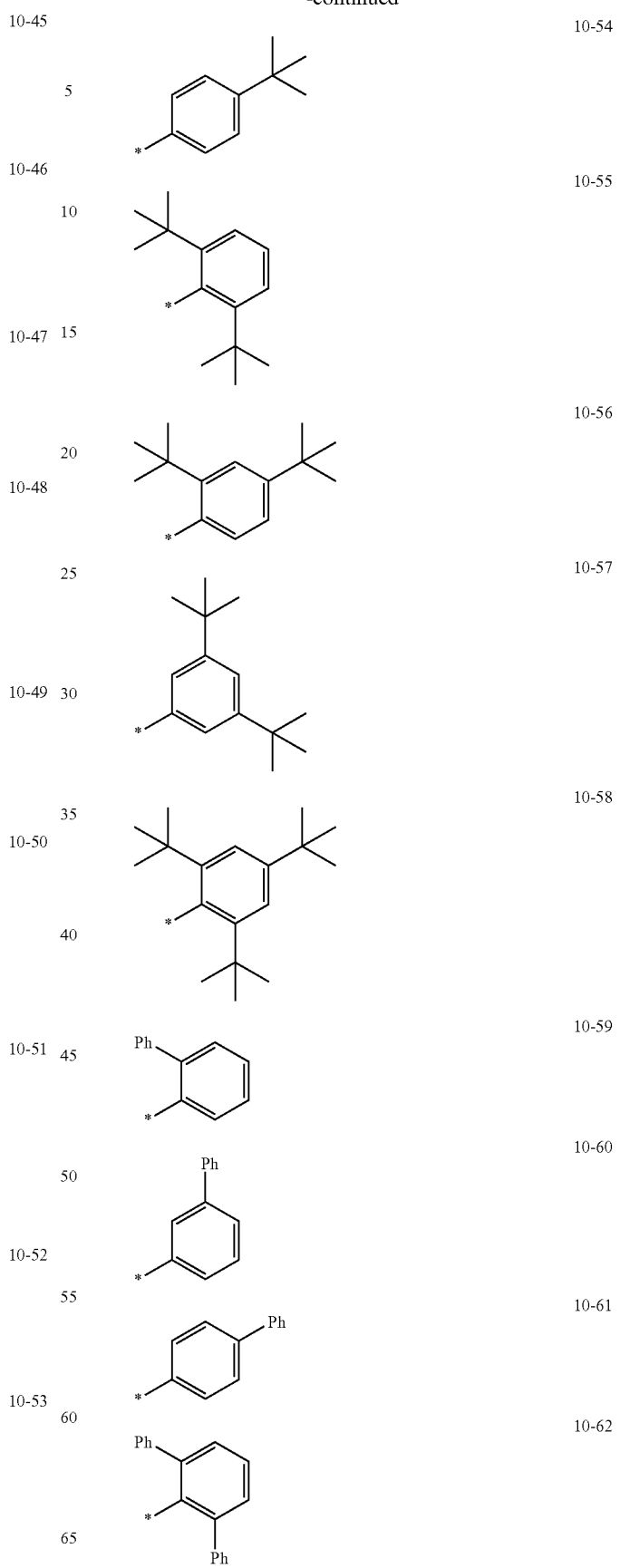

10-63
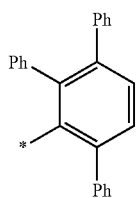
10-64
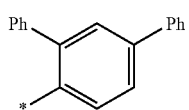
10-65
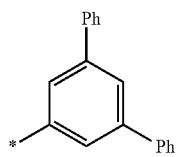
10-66
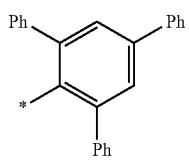
10-67
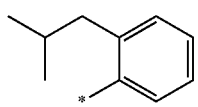
10-68
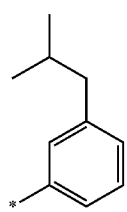
10-69
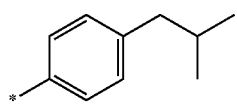
10-70
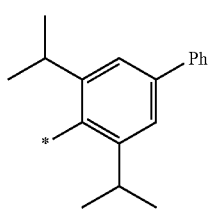
10-71
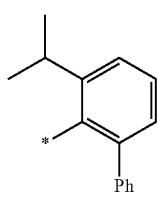
10-72
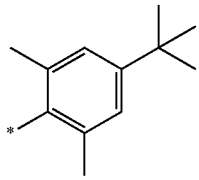
10-73
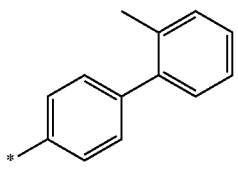
10-74
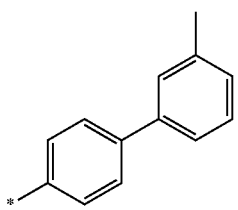
10-75
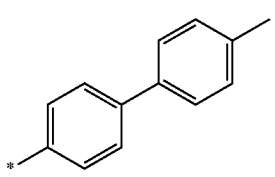
10-76
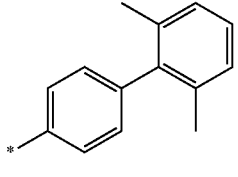
10-77
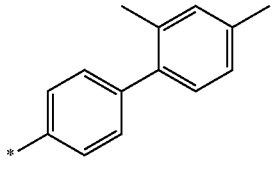
10-78
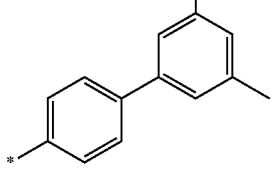
10-79
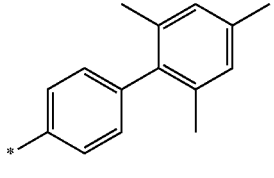

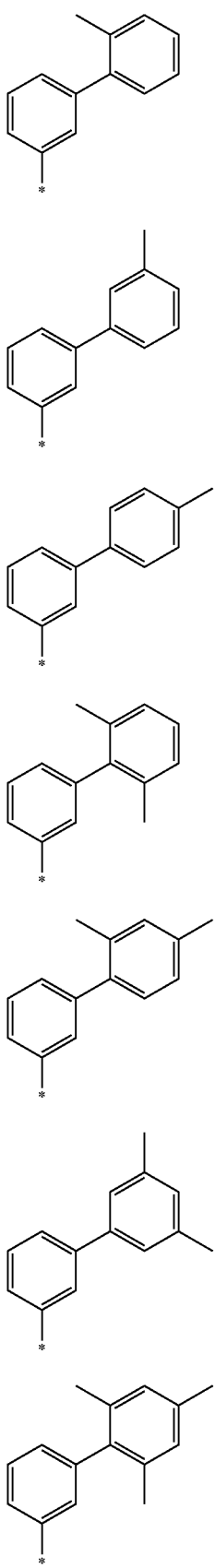
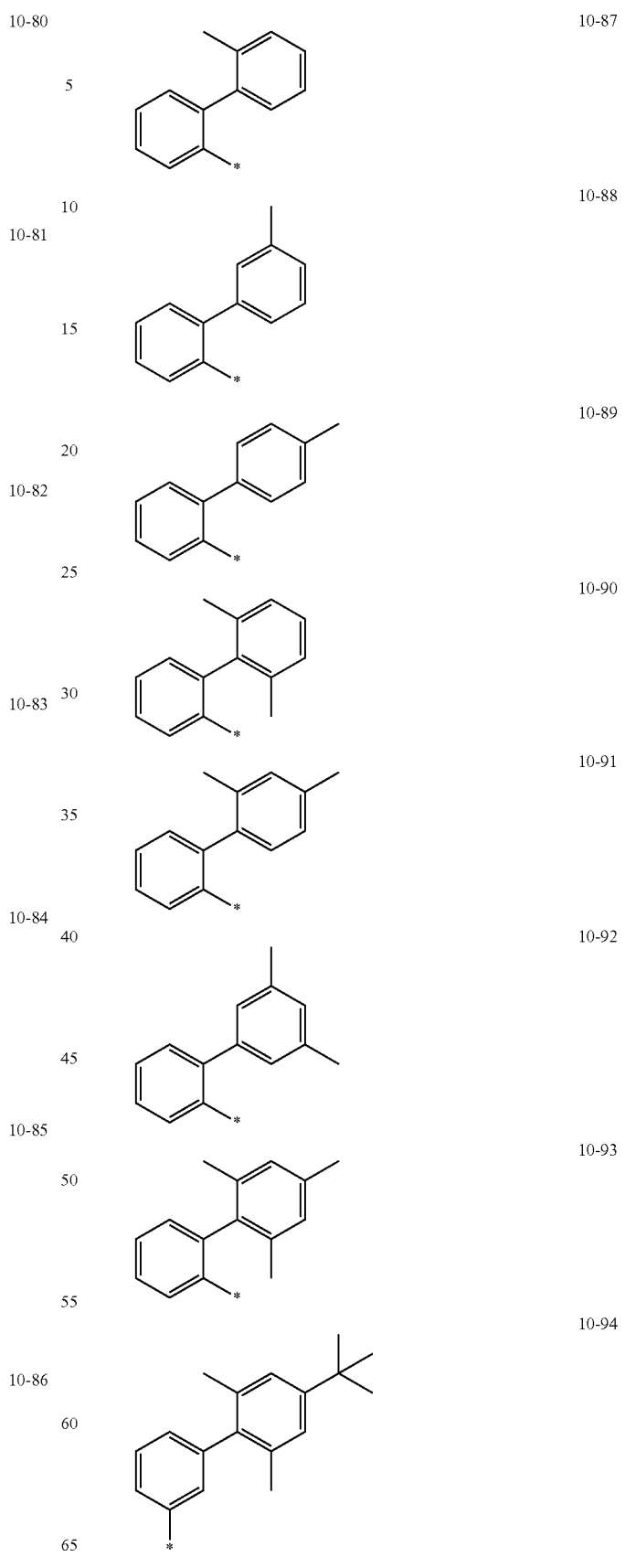

10-95
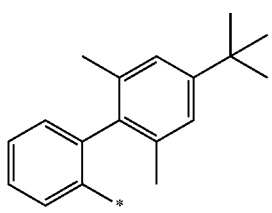
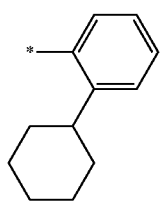
10-96
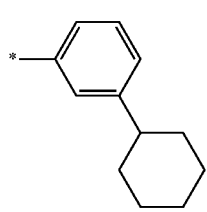
10-97
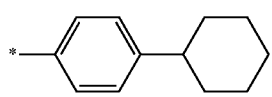
10-98
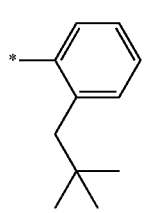
10-99
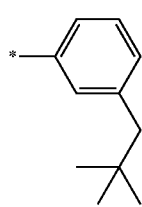
10-100
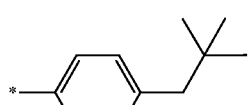
10-101
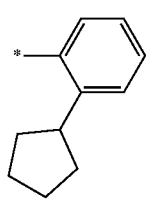
10-102
10-103
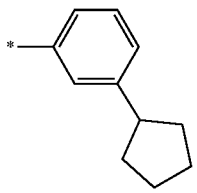
10-104
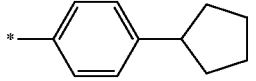
10-105
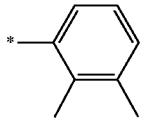
10-106
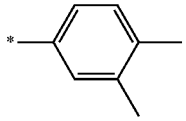
10-107
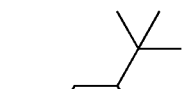
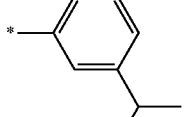
10-108
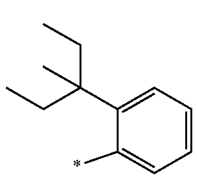
10-109
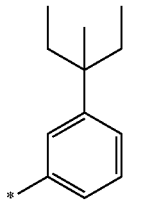
10-110
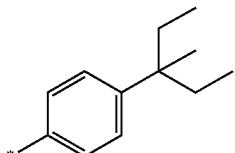
10-111
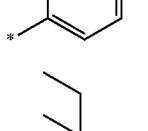
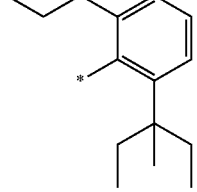

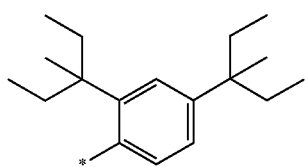
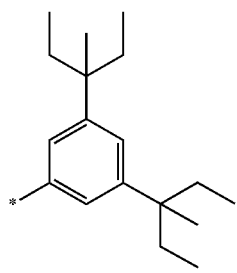
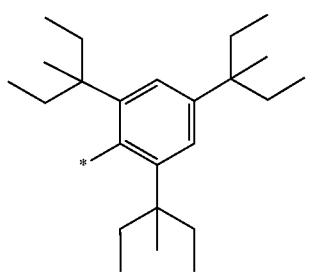
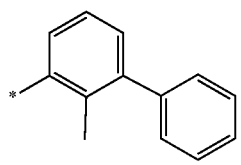
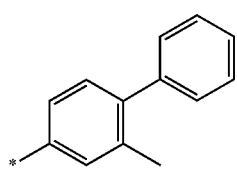
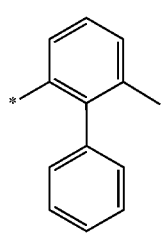
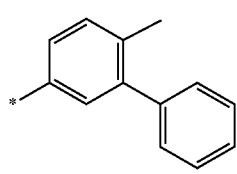
10-112
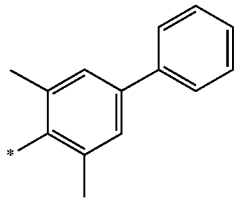
10-113
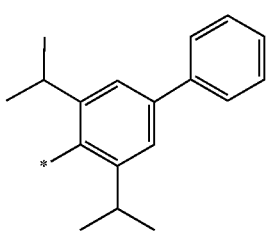
10-114
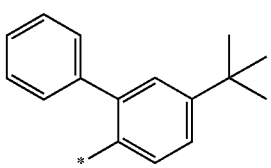
10-115
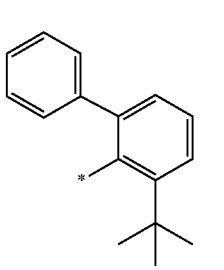
10-116
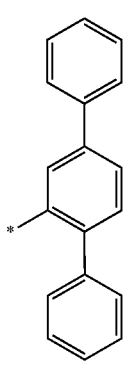
10-117
10-118
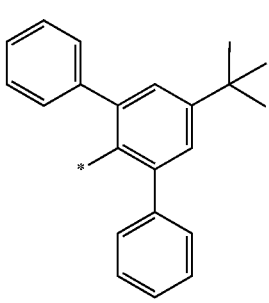
10-119
10-120
10-121
10-122
10-123
10-124

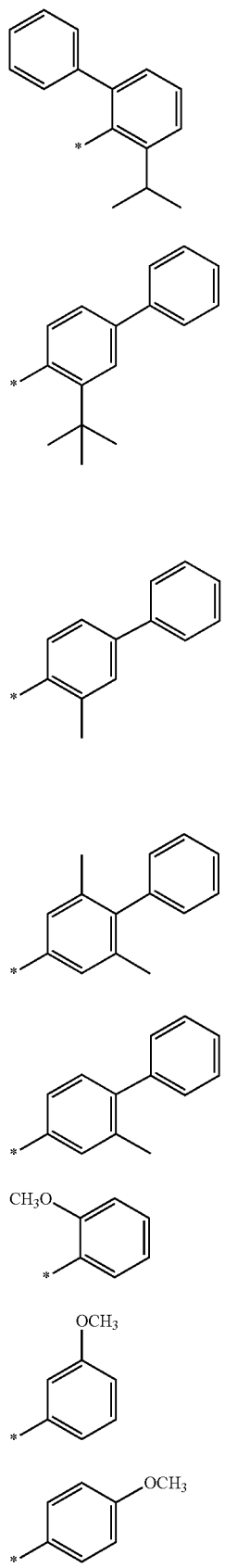
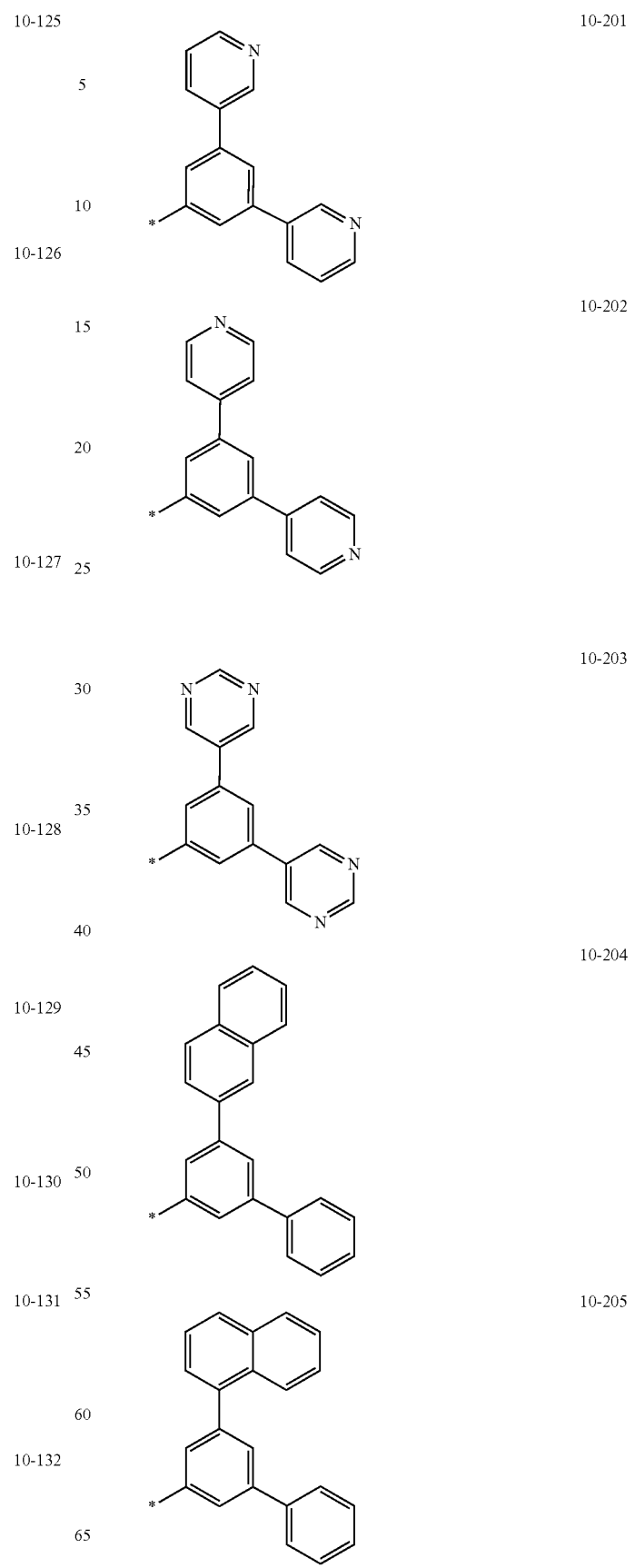

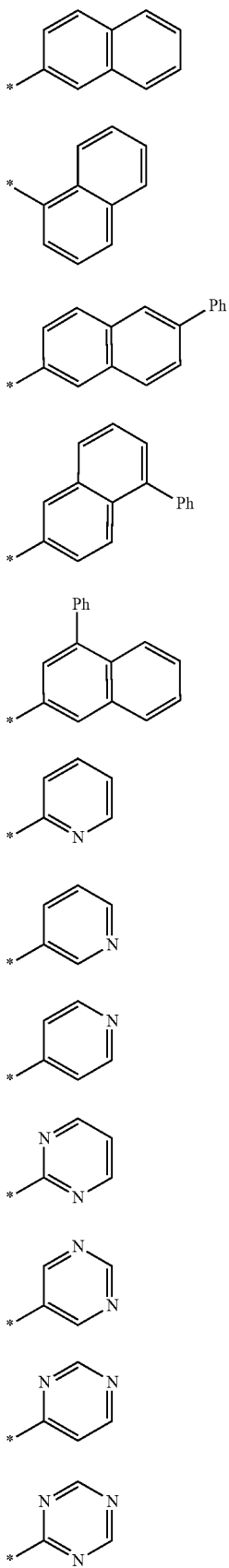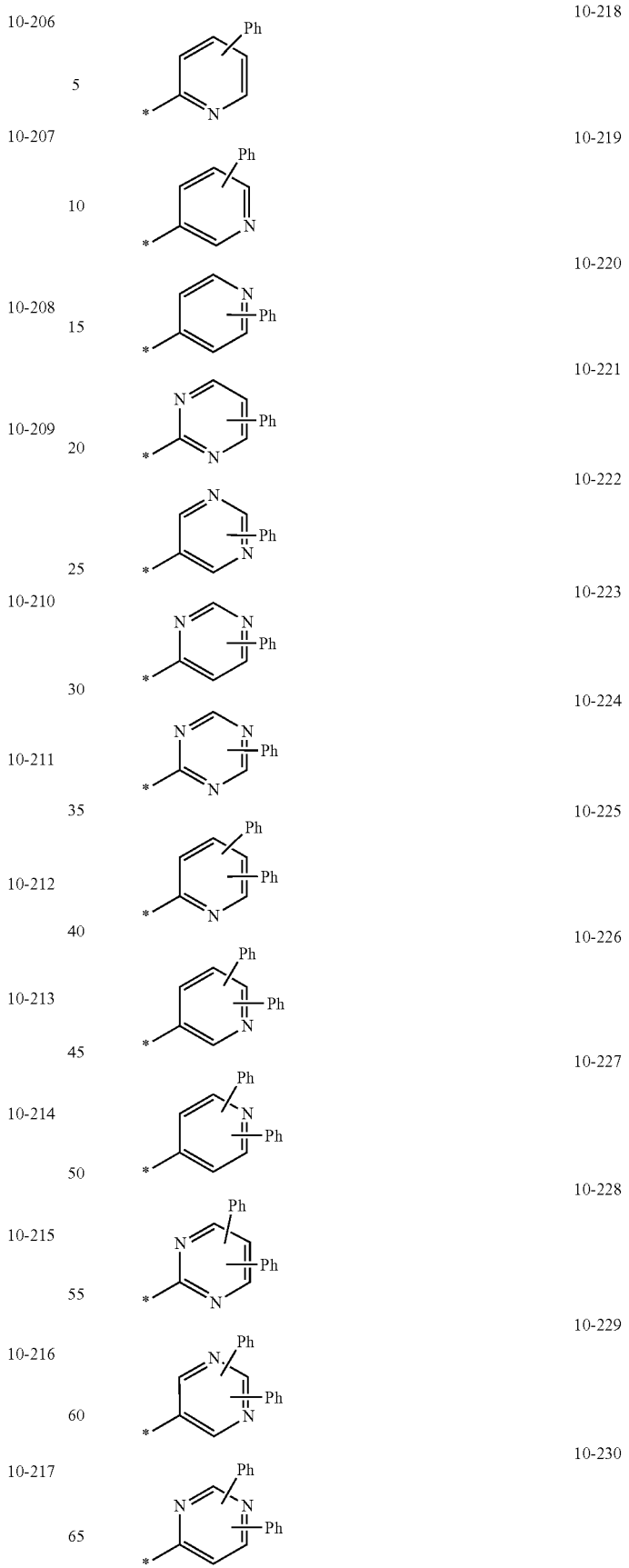

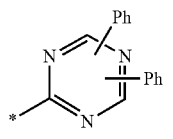
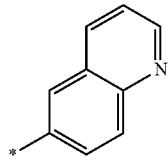
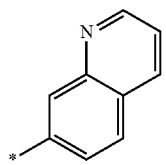
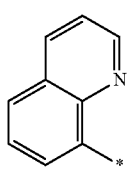
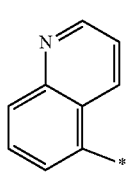
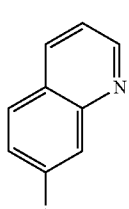
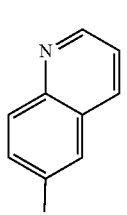
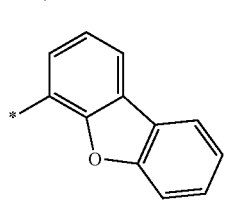
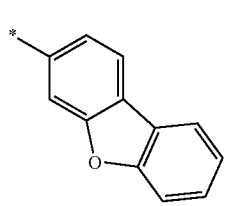
10-231 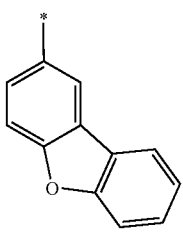
10-232
10-233 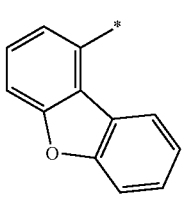
10-234 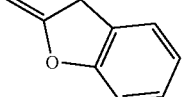
10-235 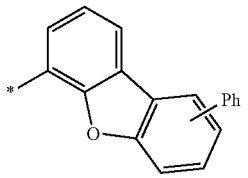
10-236 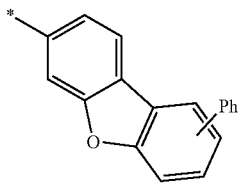
10-237 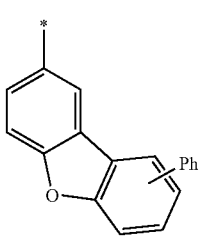
10-238 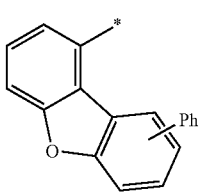
10-239 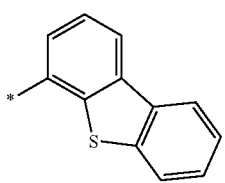
10-240
10-241
10-242
10-243
10-244
10-245
10-246 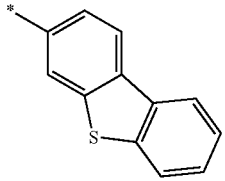
10-247

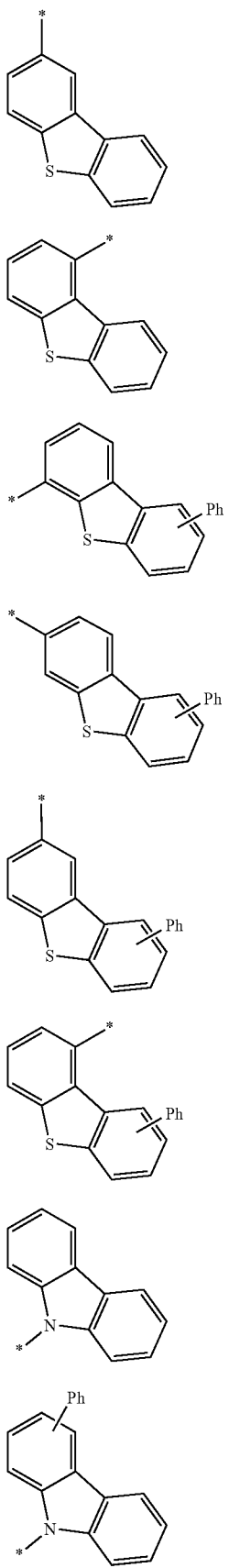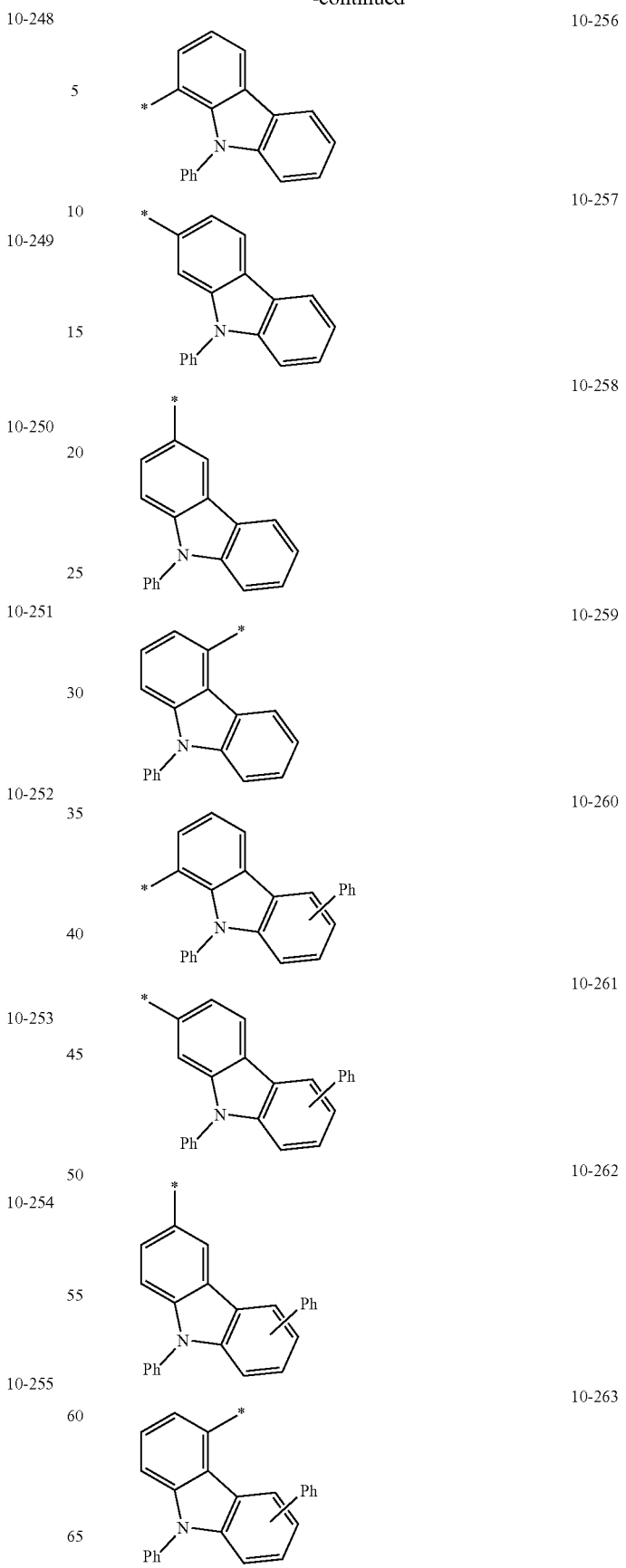

10-264 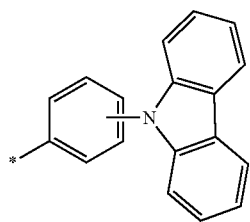
10-265 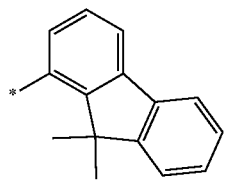
10-266 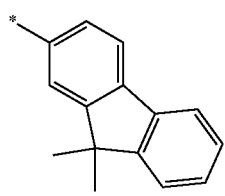
10-267 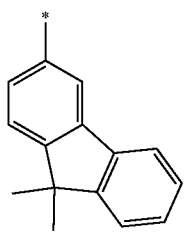
10-268 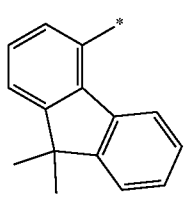
10-269 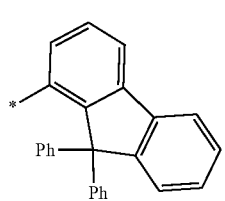
10-270 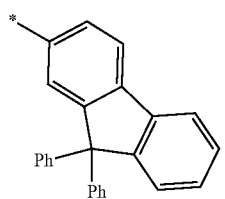
10-271 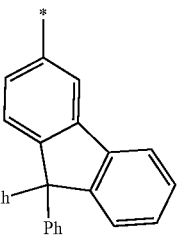
10-272 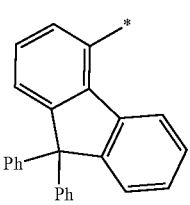
10-273 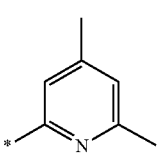
10-274 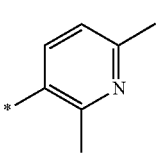
10-275 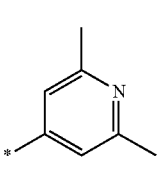
10-276 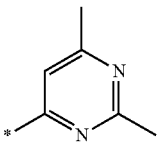
10-277 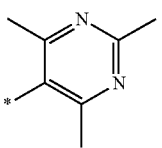
10-278 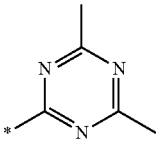
10-279

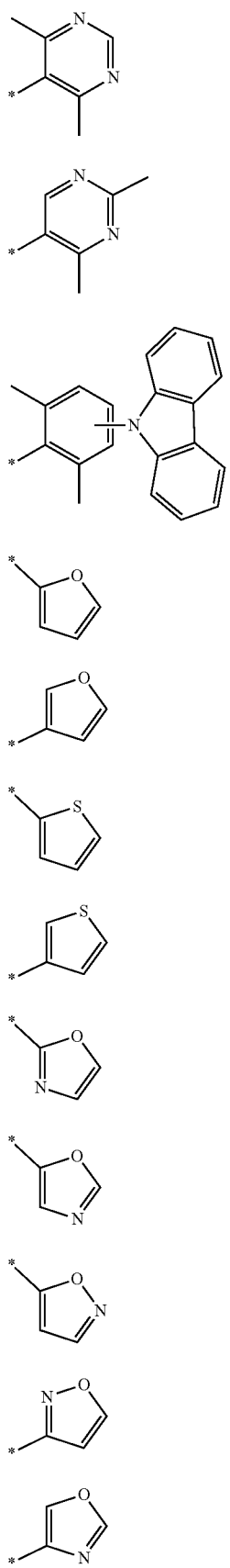
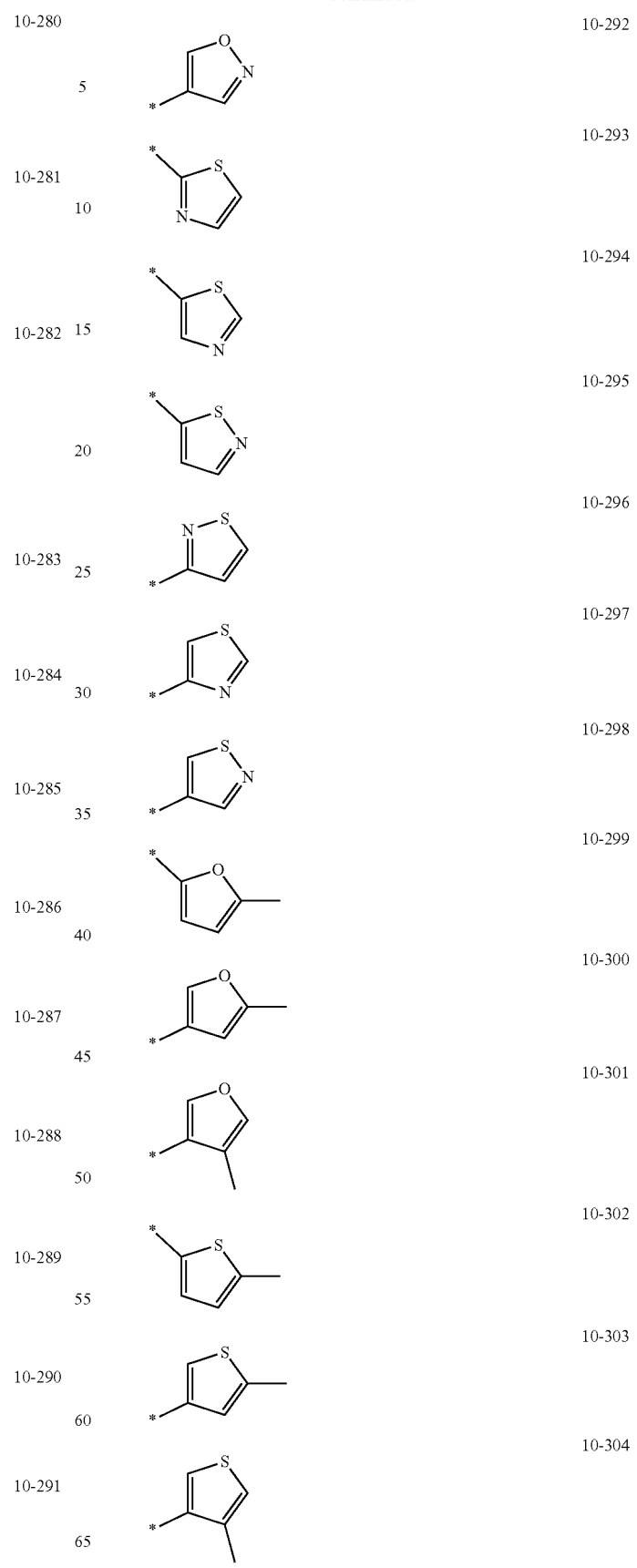

| | |
|---|---|
| 10-305 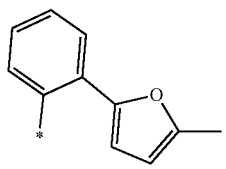 | 10-313 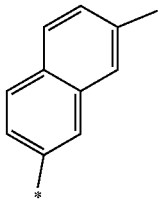 |
| 10-306 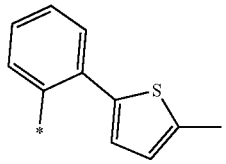 | 10-314 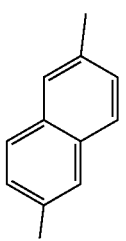 |
| 10-307 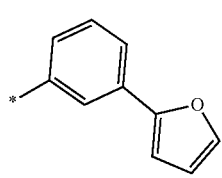 | 10-315 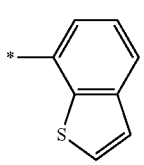 |
| 10-308 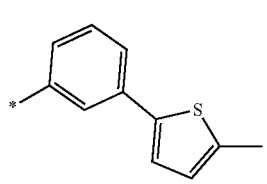 | 10-316 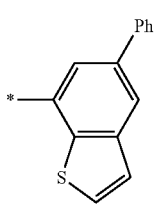 |
| 10-309 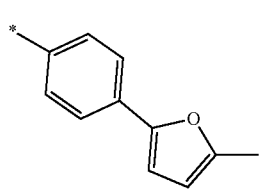 | 10-317 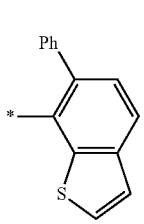 |
| 10-310 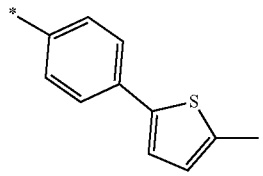 | 10-318 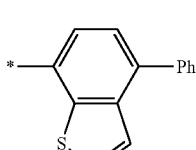 |
| 10-311 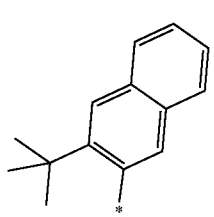 | 10-319 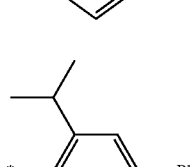 |
| 10-312 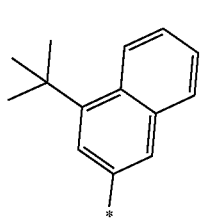 | 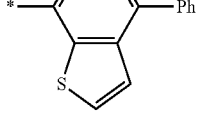 |

10-320 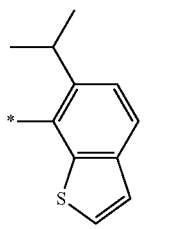
10-321 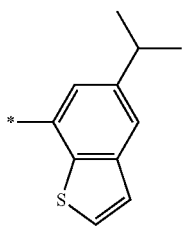
10-322 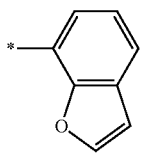
10-323 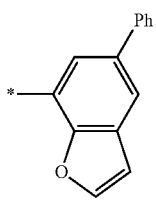
10-324 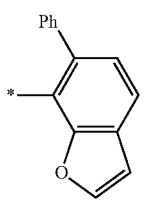
10-325 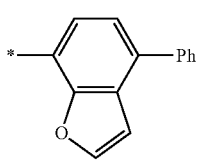
10-326 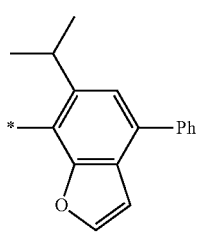
10-327 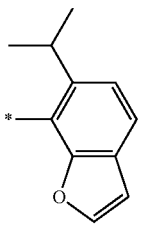
10-328 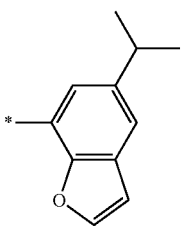
10-329 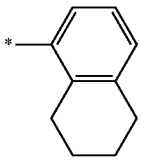
10-330 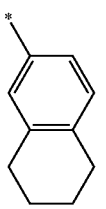
10-331 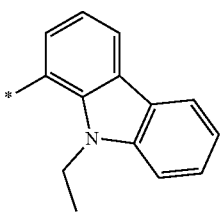
10-332 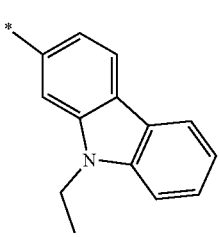
10-333 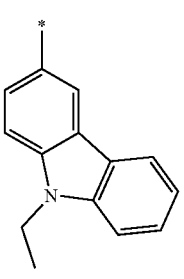

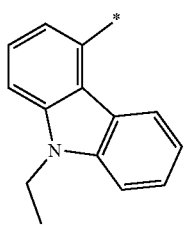
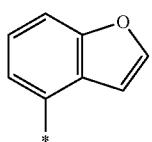
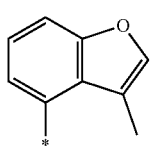
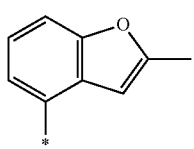
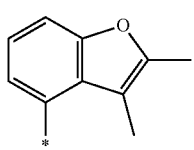
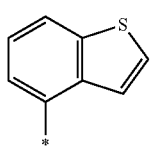
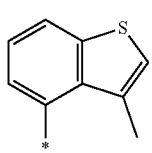
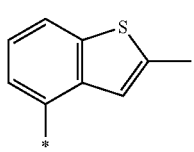
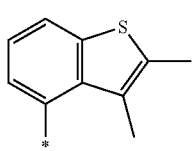
10-334
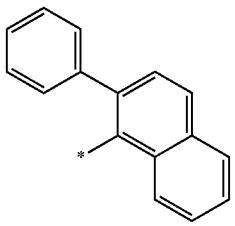
10-335
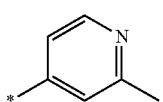
10-336
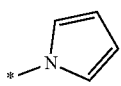
10-337
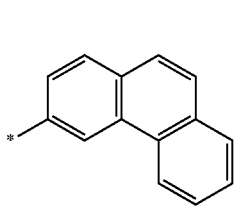
10-338
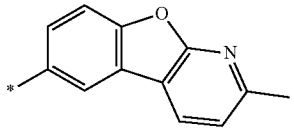
10-339
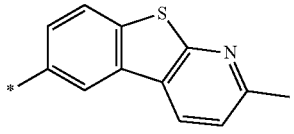
10-340
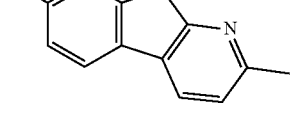
10-341
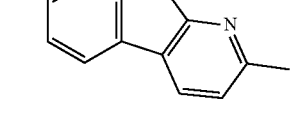
10-342
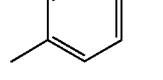
10-343
10-344
10-345
10-346
10-347
10-348
10-349
10-350
10-351
10-352
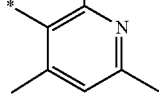

10-353

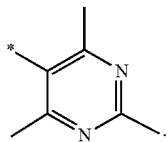

In Formulae 9-1 to 9-39, 9-201 to 9-233, 10-1 to 10-132, and 10-201 to 10-353, * indicates a binding site to a neighboring atom, Ph is a phenyl group, TMS is a trimethylsilyl group, TMG is a trimethylgermyl, and OMe is a methoxy group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may be, for example, a group represented by one of Formulae 9-501 to 9-514 and 9-601 to 9-635:

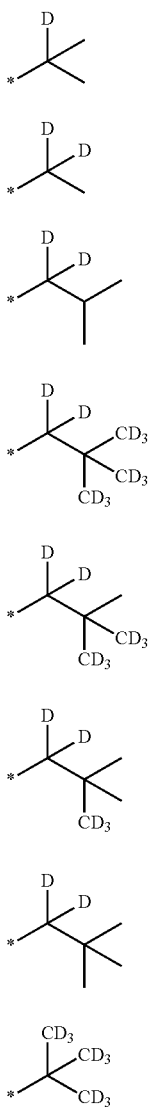

9-501

9-502

9-503

9-504

9-505

9-506

9-507

9-508

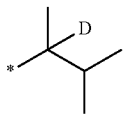

9-509

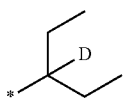

5-910

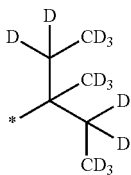

9-511

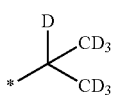

9-512

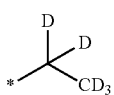

9-513

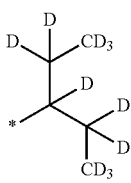

9-514

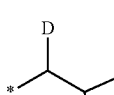

9-601

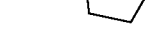

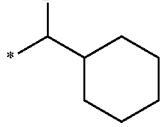

9-602

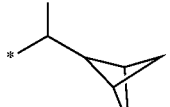

9-603

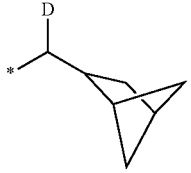

9-604

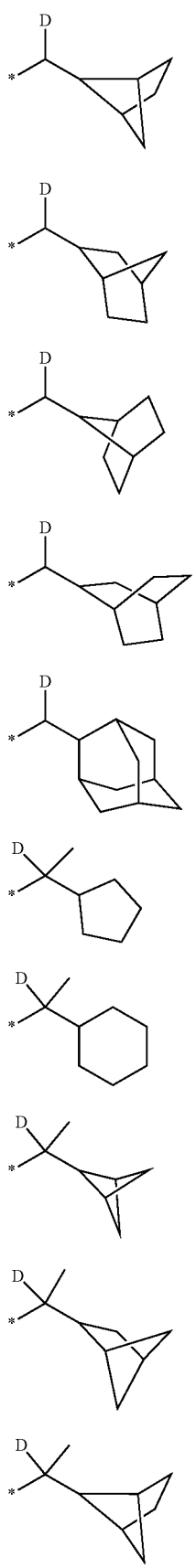
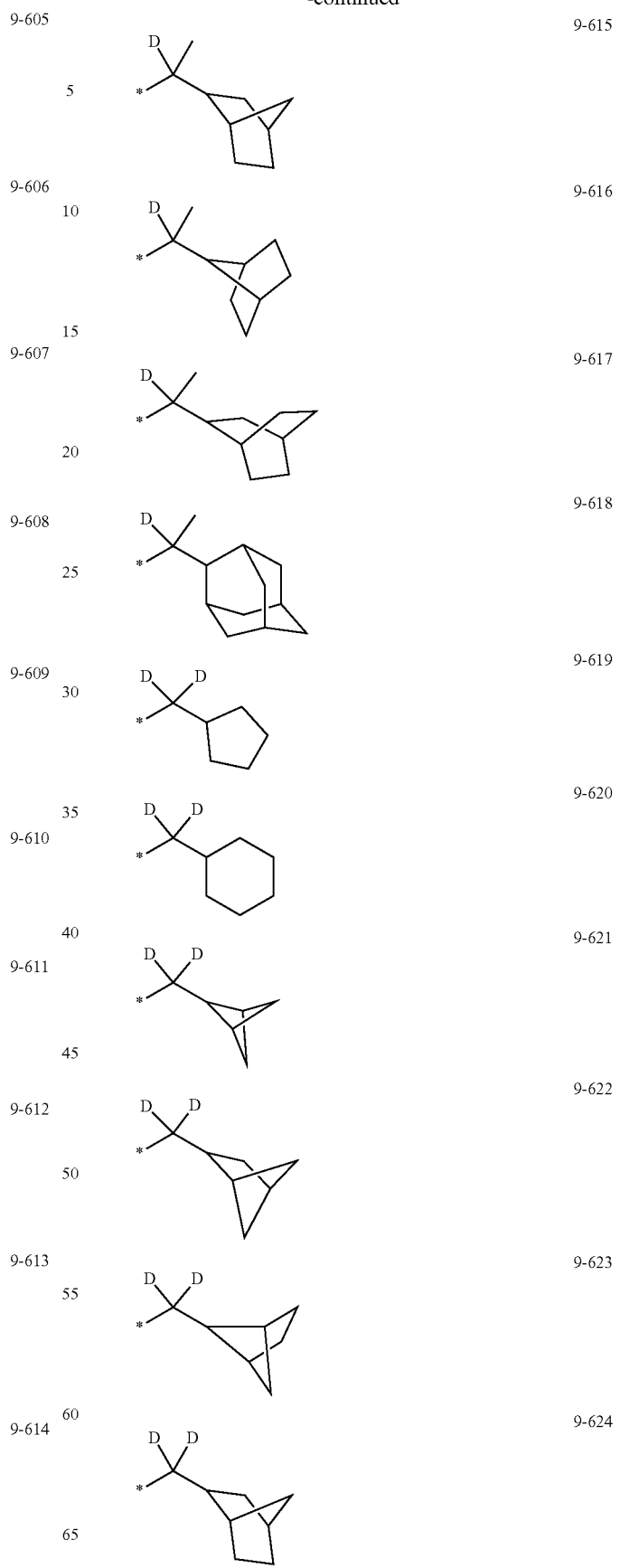

9-625 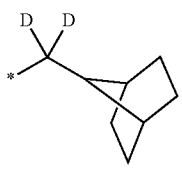

9-626 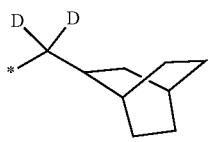

9-627 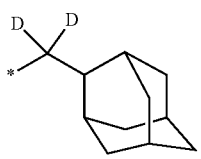

9-628 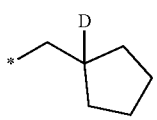

9-629 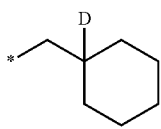

9-630 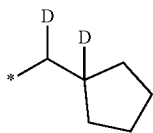

9-631 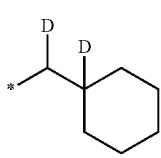

9-632 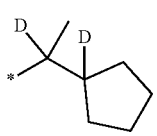

9-633 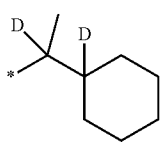

9-634 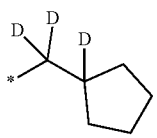

9-635 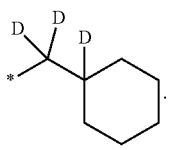

The "group represented by one of Formulae 9-1 to 9-39 in which at least one hydrogen is substituted with —F" and the "group represented by one of Formulae 9-201 to 9-233 in which at least one hydrogen is substituted with —F" may be, for example, a group represented by one of Formulae 9-701 to 9-710:

9-701 

9-702 

9-703 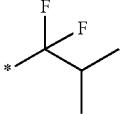

9-704 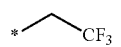

9-705 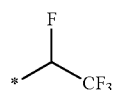

9-706 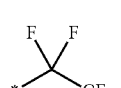

9-707 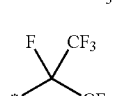

9-708 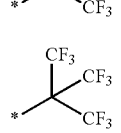

9-709 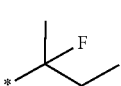

9-710 

The "group represented by one of Formulae 10-1 to 10-132 in which at least one hydrogen is substituted with deuterium" and the "group represented by one of Formulae 10-201 to 10-353 in which at least one hydrogen is substituted with deuterium" may be, for example, a group represented by one of Formulae 10-501 to 10-553:

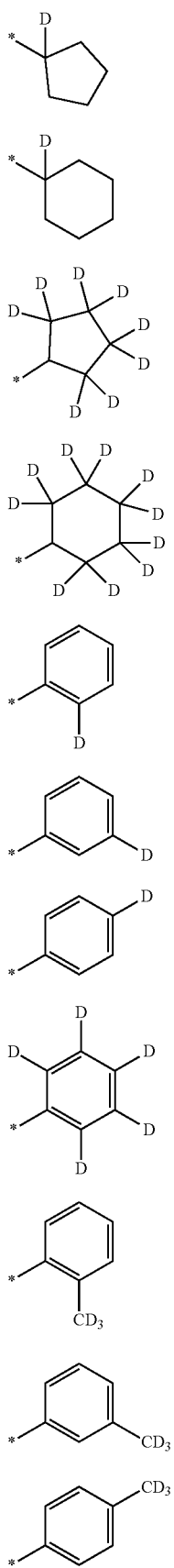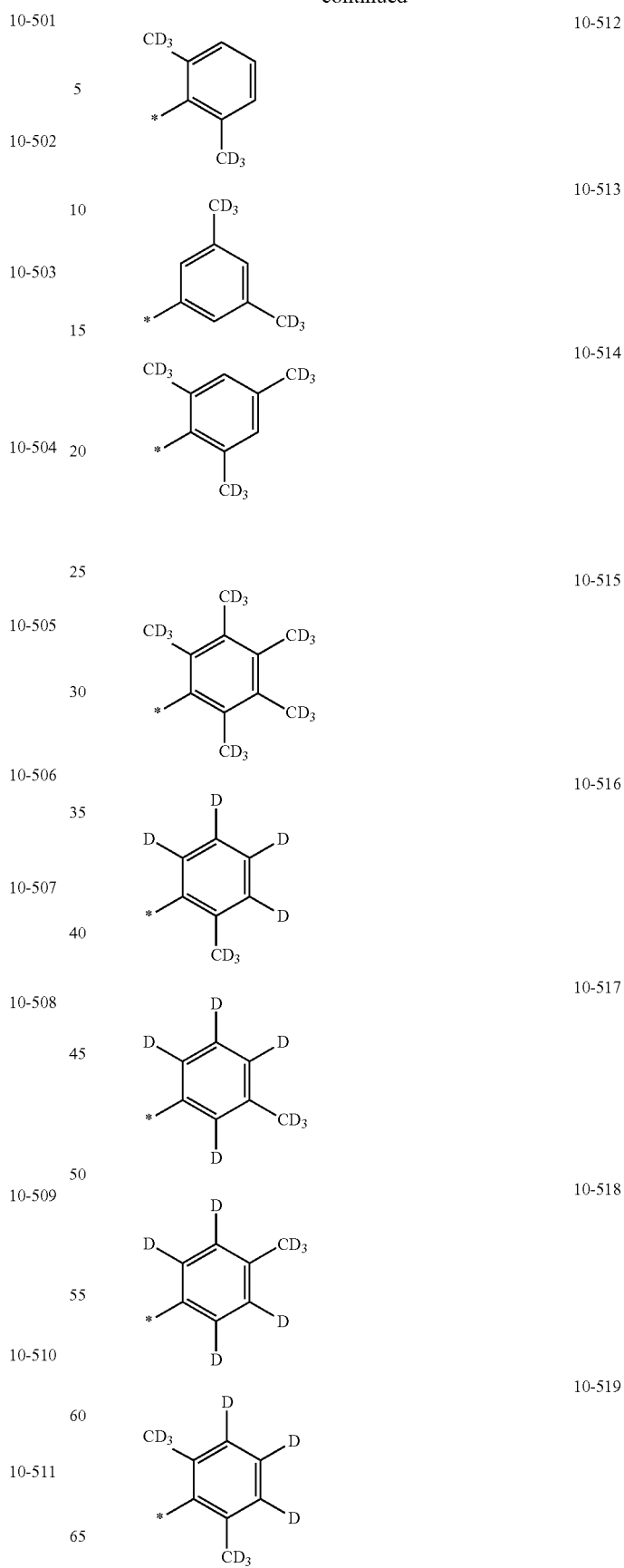

10-519
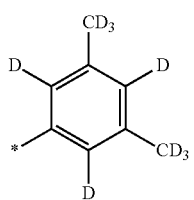
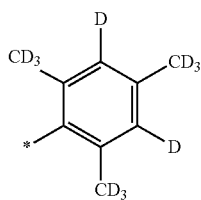
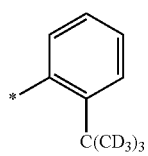
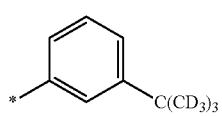
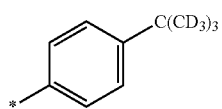
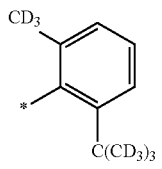
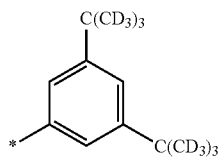
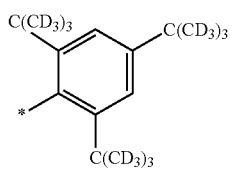
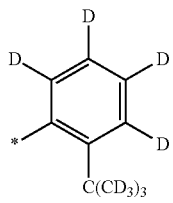
10-520
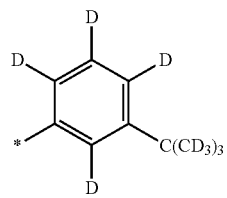
10-521
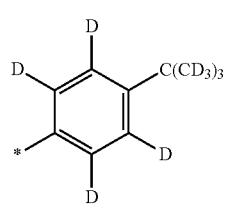
10-522
10-523
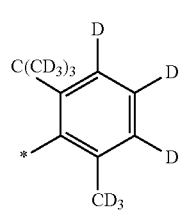
10-524
10-525
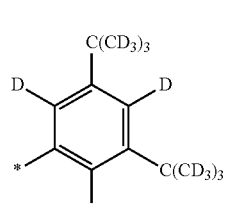
10-526
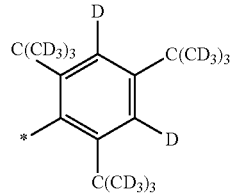
10-527
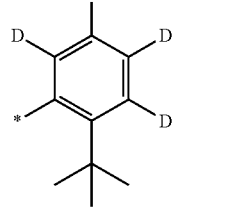
10-528
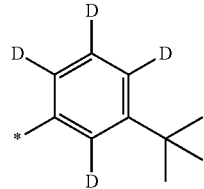
10-529
10-530
10-531
10-532
10-533
10-534
10-535

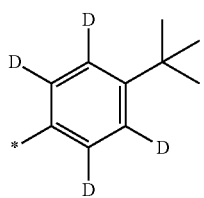
10-536
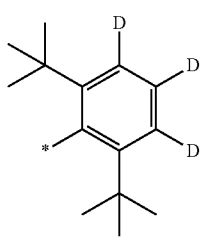
10-537
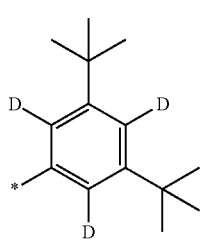
10-538
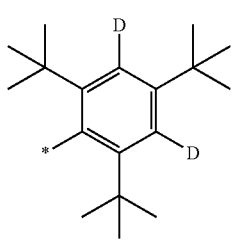
10-540
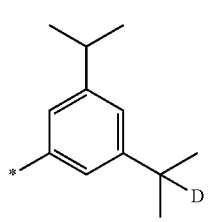
10-541
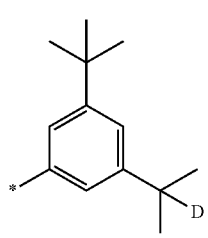
10-542
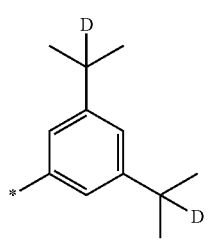
10-543
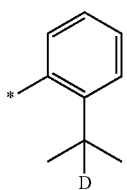
10-544
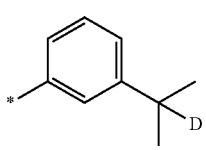
10-545
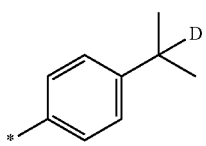
10-546
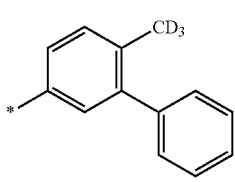
10-547
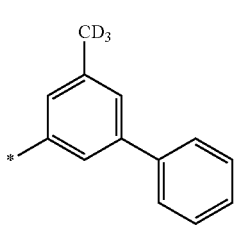
10-548
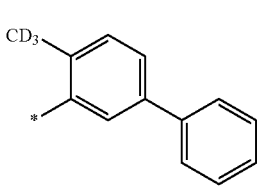
10-549
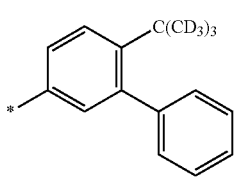
10-550
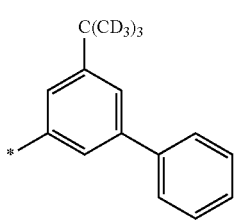
10-551

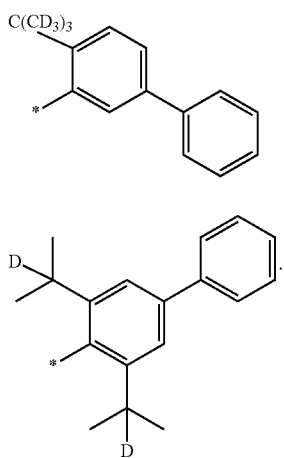
10-552
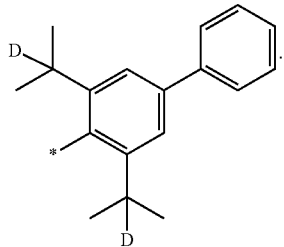
10-553
The "group represented by one of Formulae 10-1 to 10-132 in which at least one hydrogen is substituted with —F" and the "group represented by one of Formulae 10-201 to 10-353 in which at least one hydrogen is substituted with —F" may be, for example, a group represented by one of Formulae 10-601 to 10-620:
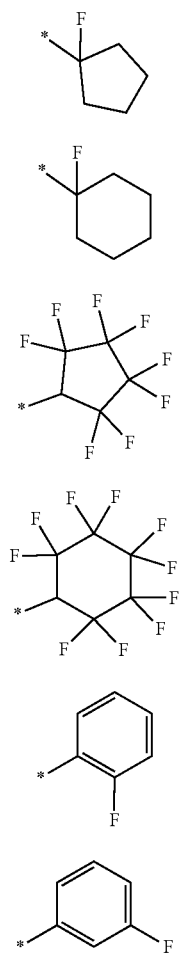
10-601
10-602
10-603
10-604
10-605
10-606
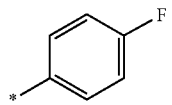
10-607
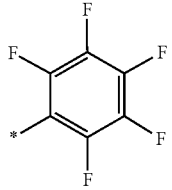
10-608
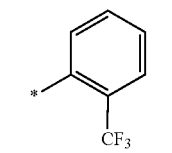
10-609
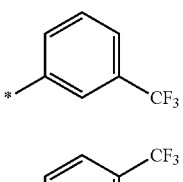
10-610
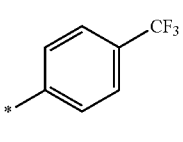
10-611
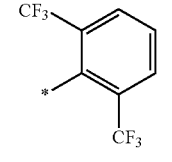
10-612
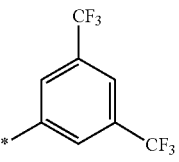
10-613
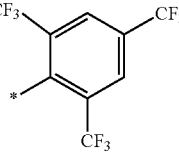
10-614
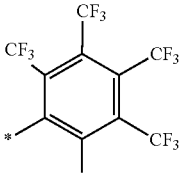
10-615
10-616

-continued

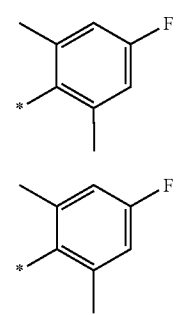
10-617

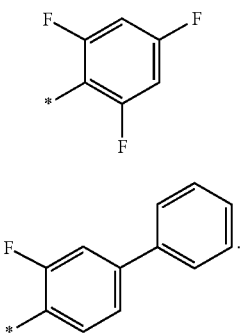
10-618

10-619

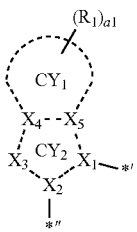
10-620 a1 and a21 in Formulae 2A and 2B indicate the number of $R_1$(s) and the number of $R_{21}$(s), respectively, and may each independently be an integer from 0 to 20. When a1 is 2 or more, two or more of $R_1$(s) are identical to or different from each other, and when a21 is 2 or more, two or more of $R_{21}$ are identical to or different from each other. For example, a1 and a21 may each independently be an integer from 0 to 6.

In Formulae 2A and 2B, i) two or more of a plurality of $R_1$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_{21}$ (s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and iii) two or more of $R_a$, $R_b$, $R_1$ to $R_3$, and $R_{21}$ may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ is the same as described in connection with $R_{21}$.

* and *' in Formula 2 each indicates a binding site to M in Formula 1.

In one or more embodiments, a group represented by

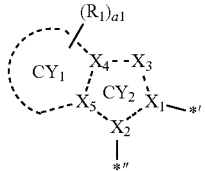

of Formula 2A may be a group represented by one of Formulae 2A-1 to 2A-3, (and/or)

a group represented by of

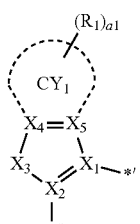

Formula 2B may be a group represented by one of Formulae 2B-1 to 2B-3:

2A-1

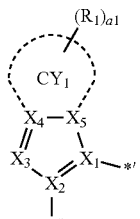

2A-2

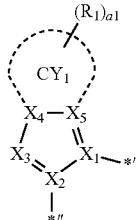

2A-3

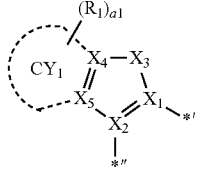

2B-1

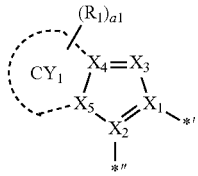

2B-2

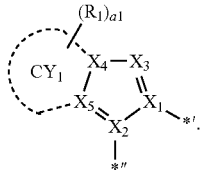

2B-3

In Formulae 2A-1 to 2A-3 and 2B-1 to 2B-3, $X_1$ may be N, $X_2$ may be C, ring $CY_1$, $R_1$, and a1 are the same as described in the present specification, *' is a binding site to M of Formula 1, and *'' is a binding site to ring $CY_{21}$ in Formulae 2A and 2B, in Formulae 2A-1 and 2B-1, $X_3$ may be O, S, Se, $B(R_2)$, $N(R_2)$, $P(R_2)$, $C(R_2)(R_3)$, $Si(R_2)(R_3)$, or $Ge(R_2)(R_3)$, and $X_4$ and $X_5$ may each be C, in Formulae 2A-2 and 2B-2, $X_3$ may be N, $C(R_2)$, or $Si(R_2)$, $X_4$ may be C, and $X_5$ may be C or N, and in Formulae 2A-3 and 2B-3, $X_3$ may be N, $C(R_2)$ or $Si(R_2)$, $X_4$ may be C or N, and $X_5$ may be C.

In one or more embodiments, a group represented by

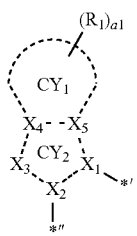

of Formula 2A may be a group represented by one of Formulae 2A(1) to 2A(7), (and/or) a group represented by

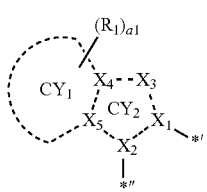

of Formula 2B may be a group represented by one of Formulae 2B(1) to 2B(7):

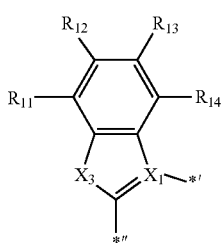

2A(1)

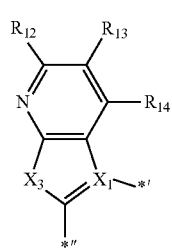

2A(2)

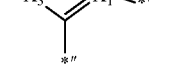

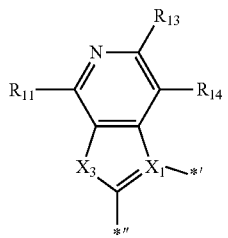

2A(3)

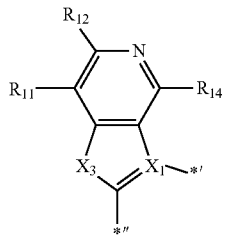

2A(4)

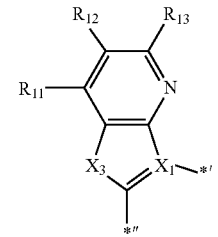

2A(5)

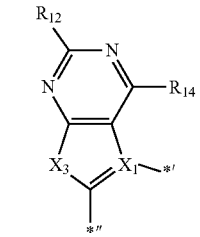

2A(6)

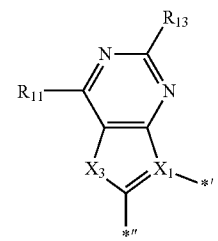

2A(7)

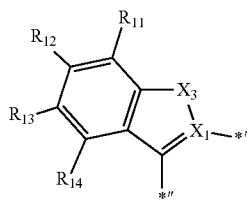

2B(1)

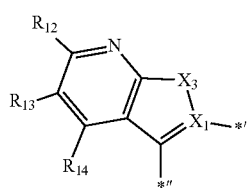

2B(2)

-continued

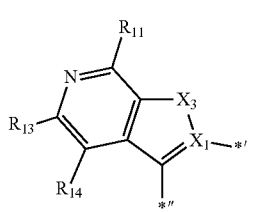
2B(3)

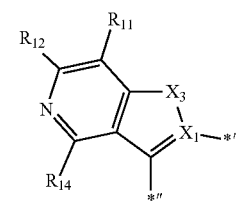
2B(4)

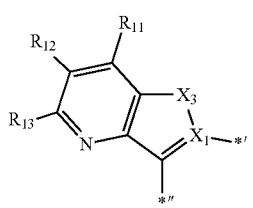
2B(5)

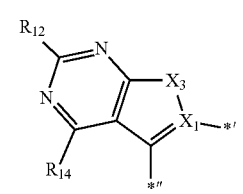
2B(6)

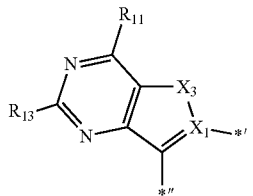
2B(7)

wherein, in Formulae 2A(1) to 2A(7) and 2B(1) to 2B(7), $X_1$ may be N,

*' indicates a binding site to M of Formula 1,

*'' is a binding site to ring $CY_{21}$ in Formulae 2A and 2B, $X_3$ may be O, S, Se, $B(R_2)$, $N(R_2)$, $P(R_2)$, $C(R_2)(R_3)$, $Si(R_2)(R_3)$, or $Ge(R_2)(R_3)$, and $R_{11}$ to $R_{14}$ are the same as described in connection with $R_1$ in the present specification, and $R_2$ and $R_3$ are the same as described in the present specification.

In one or more embodiments, a group represented by

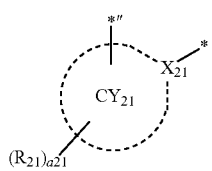

in Formulae 2A and 2B may be a group represented by one of Formulae Y21-1 to CY21-25:

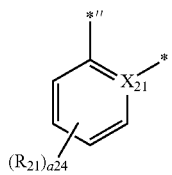
CY21-1

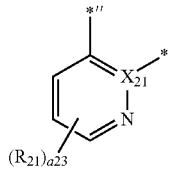
CY21-2

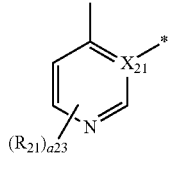
CY21-3

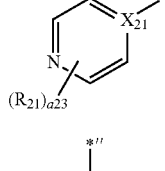
CY21-4

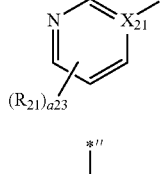
CY21-5

CY21-6

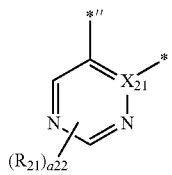

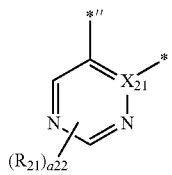
CY21-7

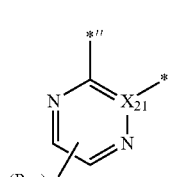
CY-21-8

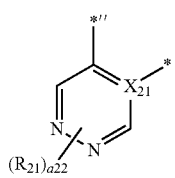
CY21-9

-continued
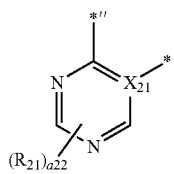
CY21-10
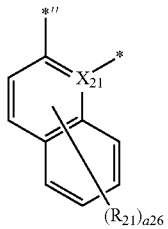
CY21-11
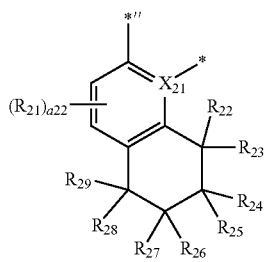
CY21-12
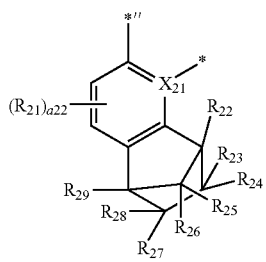
CY21-13
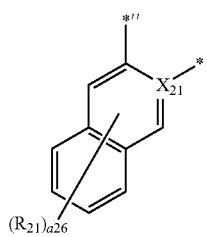
CY21-14
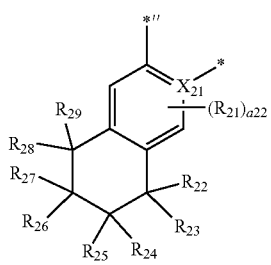
CY21-15
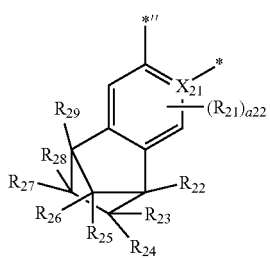
CY21-16
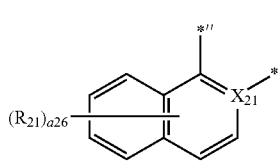
CY21-17
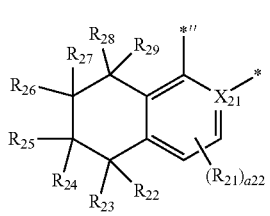
CY21-18
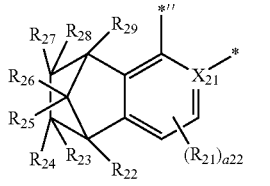
CY21-19
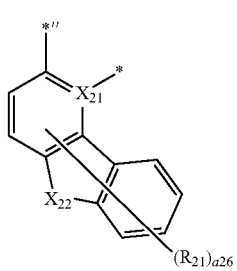
CY21-20
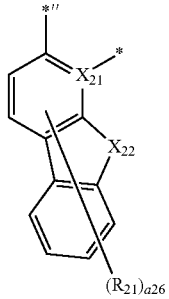
CY21-21

-continued

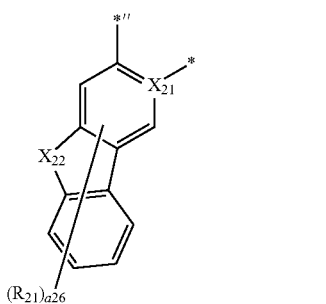
CY21-22

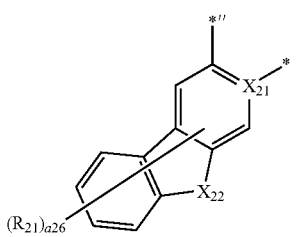
CY21-23

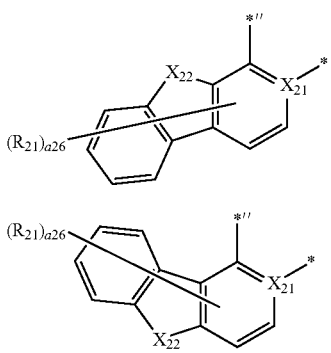
CY21-24

CY21-25 wherein, in Formulae CY21-1 to CY21-25, $X_{21}$ and $R_{21}$ are the same as described in the present specification, $X_{22}$ may be $C(R_{22})(R_{23})$, $N(R_{22})$, O, S, or $Si(R_{22})(R_{23})$, $R_{22}$ to $R_{29}$ are the same as described in connection with $R_{21}$, a26 may be an integer from 0 to 6, a24 may be an integer from 0 to 4, a23 may be an integer from 0 to 3, a22 may be an integer from 0 to 2,

*''' is a binding site to $X_2$ in Formulae 2A and 2B, and

* is a binding site to $Y_1$ in Formula 1.

In one or more embodiments, a group represented by

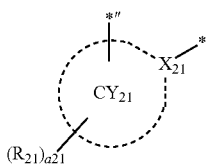

in Formulae 2A and 2B may be a group represented by one of Formulae CY21(1) to CY21(56) or a group represented by one of Formulae CY21-20 to CY21-25:

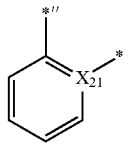
CY21(1)

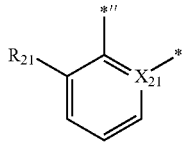
CY21(2)

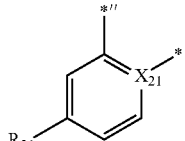
CY21(3)

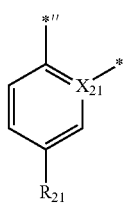
CY21(4)

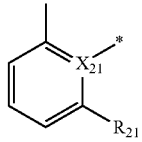
CY21(5)

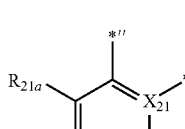
CY21(6)

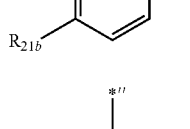
CY21(7)

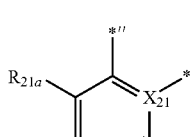
CY21(8)

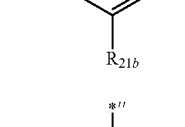
CY21(9)

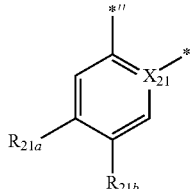

-continued
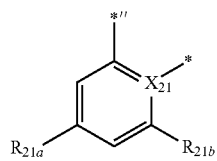
CY21(10)
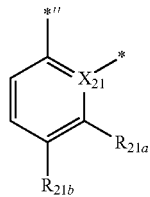
CY21(11)
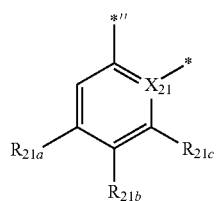
CY21(12)
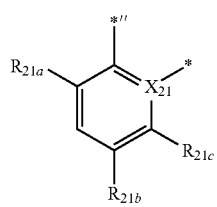
CY21(13)
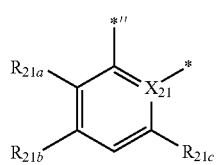
CY21(14)
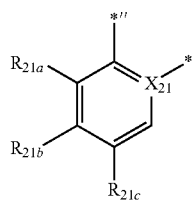
CY21(15)
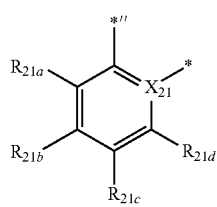
CY21(16)
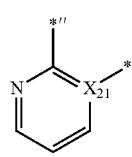
CY21(17)
-continued
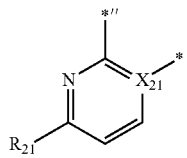
CY21(18)
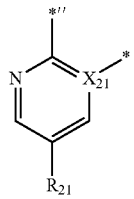
CY21(19)
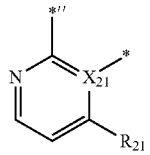
CY21(20)
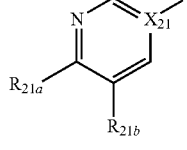
CY21(21)
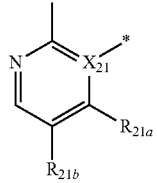
CY21(22)
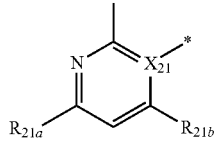
CY21(23)
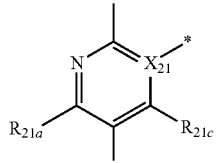
CY21(24)
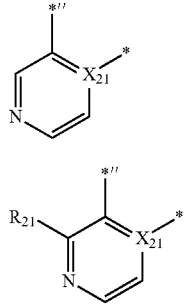
CY21(25)
CY21(26)

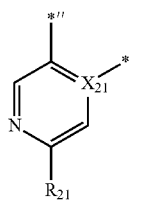
CY21(27)
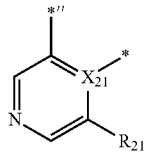
CY21(28)
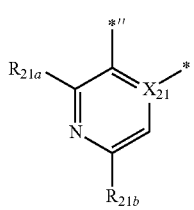
CY21(29)
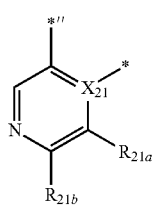
CY21(30)
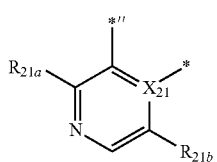
CY21(31)
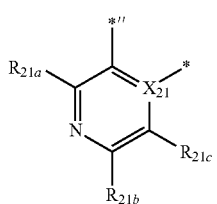
CY21(32)
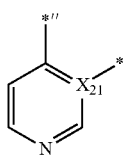
CY21(33)
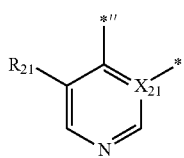
CY21(34)
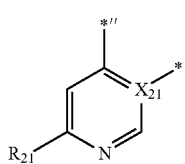
CY21(35)
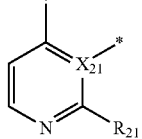
CY21(36)
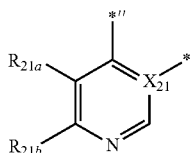
CY21(37)
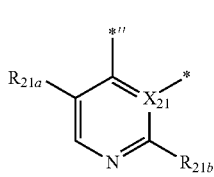
CY21(38)
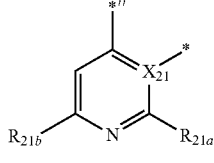
CY21(39)
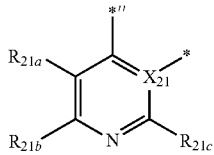
CY21(40)
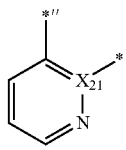
CY21(41)
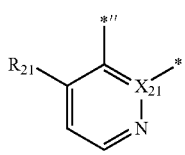
CY21(42)
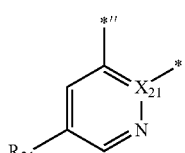
CY21(43)

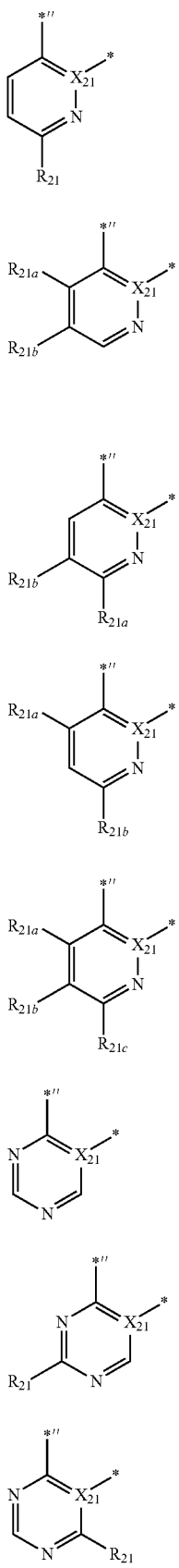

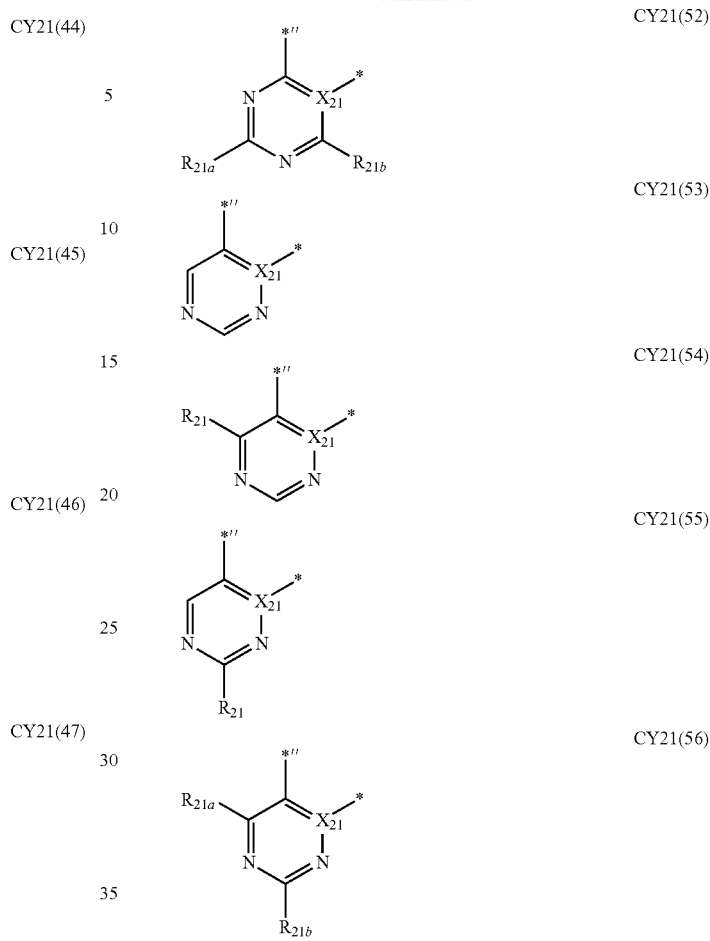

wherein, in Formulae CY21(1) to CY21(56),
X$_{21}$ and R$_{21}$ are the same as described in the present specification,
R$_{21a}$ to R$_{21d}$ are the same as described in connection with R$_{21}$, and each of R$_{21}$ and R$_{21a}$ to R$_{21d}$ is not hydrogen,
*″ is a binding site to X$_2$ in Formulae 2A and 2B, and
* is a binding site to Y$_1$ in Formula 1.

L$_2$ in Formula 1 may be a bidentate ligand that is linked to M in Formula 1 via O, S, N, C, P, Si or As.

In one or more embodiments, L$_2$ in Formula 1 may be a bidentate ligand represented by Formula 3:

wherein, in Formula 3,
X$_{31}$ and X$_{32}$ may each independently be O, S, N, C, P, Si, or As,
) indicates an atomic group that connects X$_{31}$ to X$_{32}$ each other, and
* and *′ each indicate a binding site to M in Formula 1.
For example, in Formula 3, i) X$_{31}$ and X$_{32}$ may each be O; or ii) X$_{31}$ may be N and X$_{32}$ may be C.

In one or more embodiments, L$_2$ in Formula 1 may be a monodentate ligand, for example, I$^-$, Br$^-$, Cl$^-$, sulfide, nitrate, azide, hydroxide, cyanate, isocyanate, thiocyanate, water, acetonitrile, pyridine, ammonia, carbon monoxide, P(Ph)$_3$, P(Ph)$_2$CH$_3$, PPh(CH$_3$)$_2$, or P(CH$_3$)$_3$.

In one or more embodiments, L$_2$ in Formula 1 may be a bidentate ligand, for example, oxalate, acetylacetonate, picolinic acid, 1,2-bis(diphenylphosphino)ethane, 1,1-bis(diphenylphosphino)methane, glycinate, or ethylenediamine.

In one or more embodiments, L$_2$ in Formula 1 may be a group represented by one of Formulae 3A to 3F:

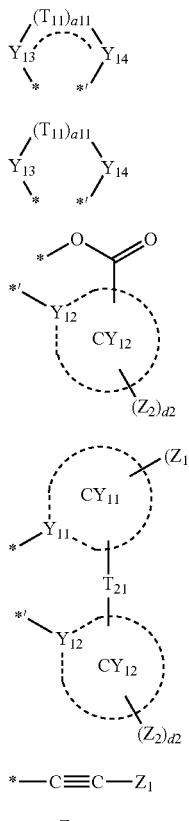

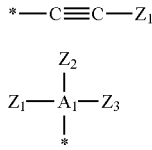

wherein, in Formulae 3A to 3F,
Y$_{13}$ may be O, N, N(Z$_1$), P(Z$_1$)(Z$_2$), or As(Z$_1$)(Z$_2$),
Y$_{14}$ may be O, N, N(Z$_3$), P(Z$_3$)(Z$_4$), or As(Z$_3$)(Z$_4$),
T$_{11}$ may be a single bond, a double bond, *—C(Z$_{11}$)(Z$_{12}$)—*', *—C(Z$_{11}$)=C(Z$_{12}$)—*', *=C(Z$_{11}$)—*', *—C(Z$_{11}$)=*', *=C(Z$_{11}$)—C(Z$_{12}$)=C(Z$_{13}$)—*', *—C(Z$_{11}$)=C(Z$_{12}$)—C(Z$_{13}$)=*', *—N(Z$_{11}$)—*' or a C$_5$-C$_{30}$ carbocyclic group unsubstituted or substituted with at least one Z$_{11}$,
a11 may be an integer from 1 to 10, and when a11 is 2 or more, two or more of T$_{11}$(s) are identical to or different from each other,
Y$_{11}$ and Y$_{12}$ may each independently be C or N,
T$_{21}$ may be a single bond, a double bond, O, S, C(Z$_{11}$)(Z$_{12}$), Si(Z$_{11}$)(Z$_{12}$), or N(Z$_{11}$),
ring CY$_{11}$ and ring CY$_{12}$ may each independently be a C$_5$-C$_{30}$ carbocyclic group or a C$_1$-C$_{30}$ heterocyclic group, A$_1$ may be P or As,
Z$_1$ to Z$_4$ and Z$_{11}$ to Z$_{13}$ are the same as described in connection with R$_{21}$,
d1 and d2 may each independently be an integer from 0 to 20, and
* and *' each indicate a binding site to M in Formula 1.

Regarding Formulae 3A to 3F, a C$_5$-C$_{30}$ carbocyclic group and a C$_1$-C$_{30}$ heterocyclic group are the same as described in connection with ring CY$_{21}$.

In one or more embodiments, L$_2$ of Formula 1 may be a group represented by Formula 3C or 3D.

For example, a group represented by

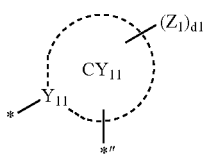

of Formula 3D may be a group represented by one of Formulae CY11-1 to CY11-34, (and/or)

a group represented by

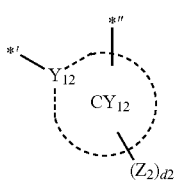

of Formulae 3C and 3D may be a group represented by one of Formulae CY12-1 to CY12-34:

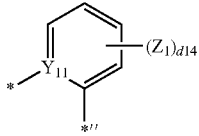
CY11-1

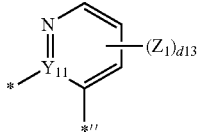
CY11-2

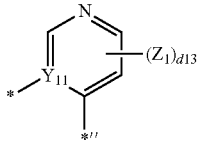
CY11-3

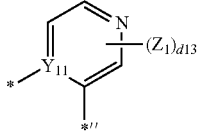
CY11-4

-continued
CY11-5
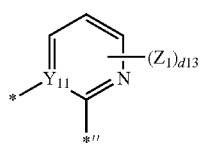
CY11-6
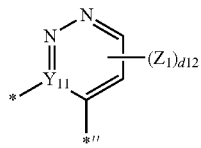
CY11-7
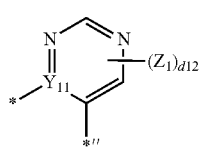
CY11-8
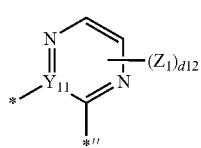
CY11-9
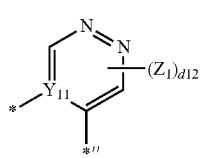
CY11-10
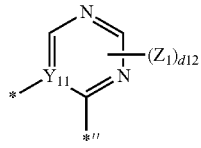
CY11-11
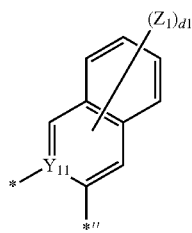
CY11-12
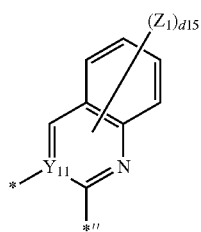
-continued
CY11-13
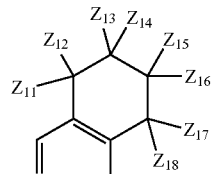
CY11-14
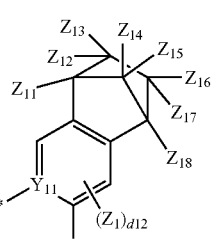
CY11-15
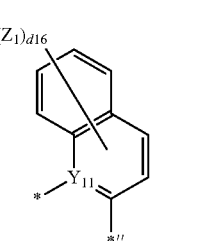
CY11-16
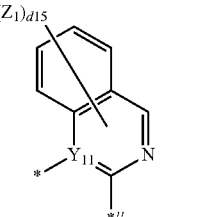
CY11-17
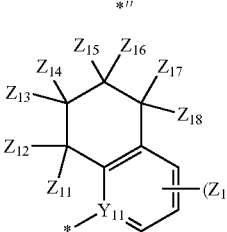
CY11-18
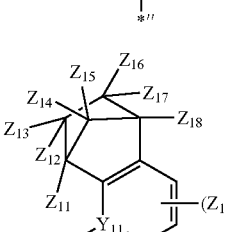
CY11-19
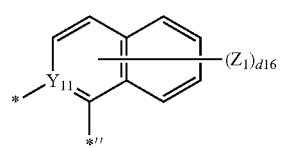

-continued
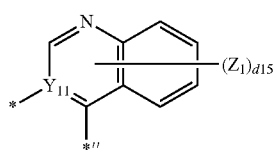
CY11-20
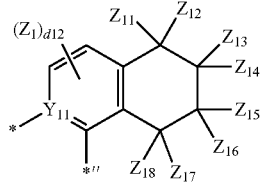
CY11-21
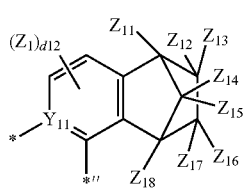
CY11-22
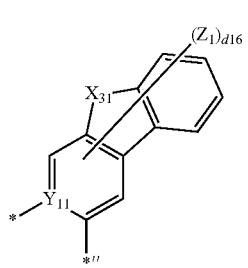
CY11-23
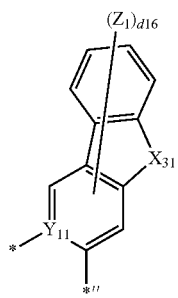
CY11-24
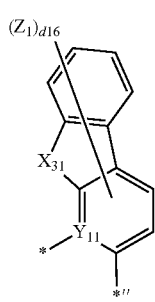
CY11-25
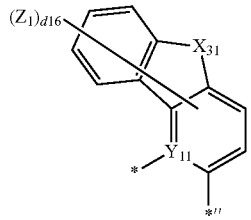
CY11-26
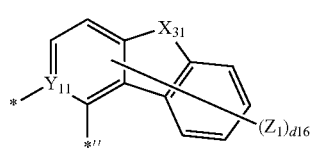
CY11-27
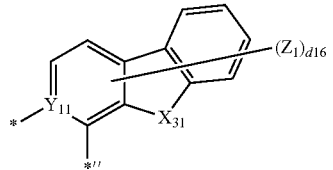
CY11-28
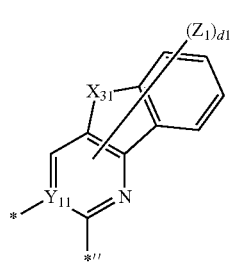
CY11-29
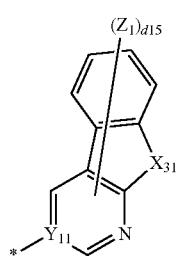
CY11-30
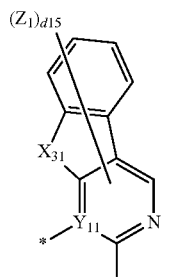
CY11-31
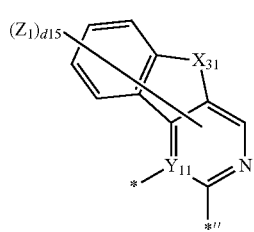
CY11-32

-continued
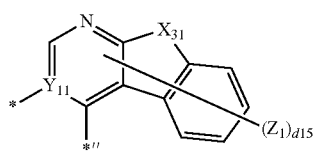
CY11-33
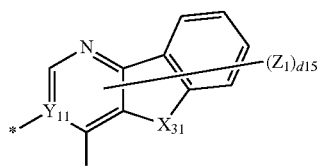
CY11-34
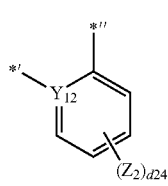
CY12-1
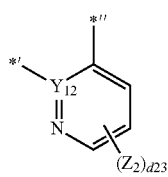
CY12-2
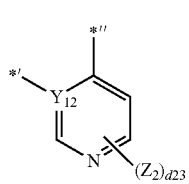
CY12-3
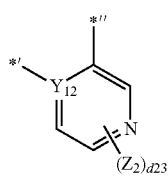
CY12-4
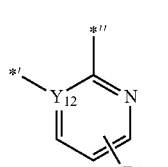
CY12-5
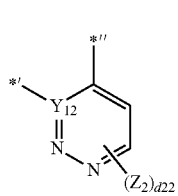
CY12-6
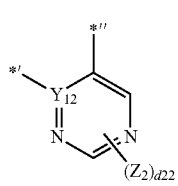
CY12-7
-continued
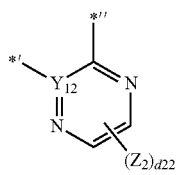
CY12-8
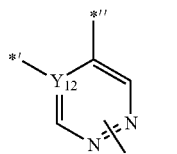
CY12-9
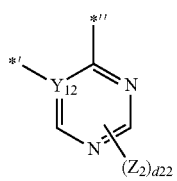
CY12-10
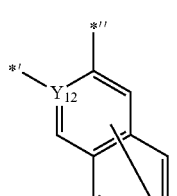
CY12-11
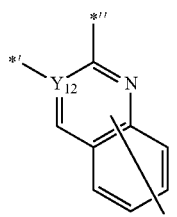
CY12-12
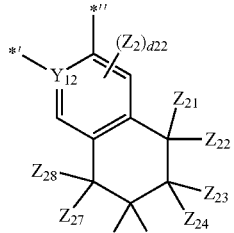
CY12-13
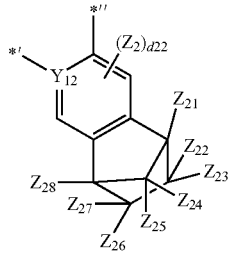
CY12-14

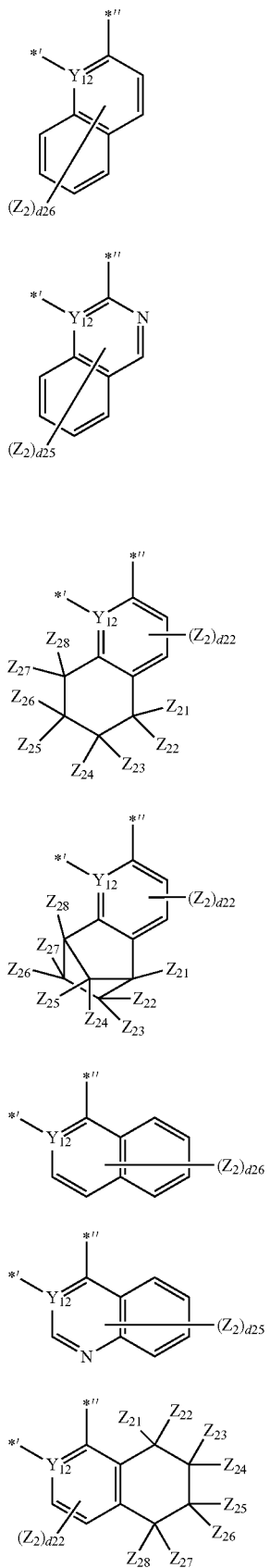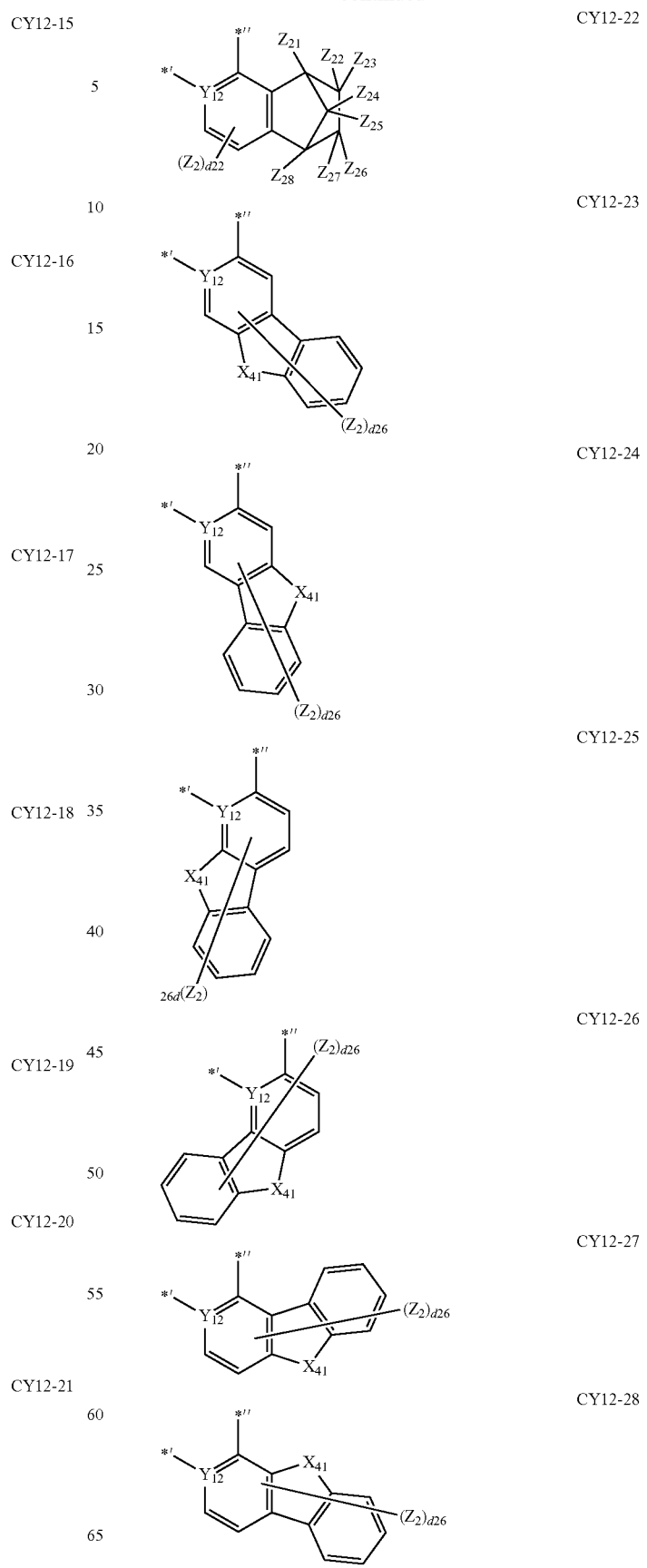

-continued

CY12-29
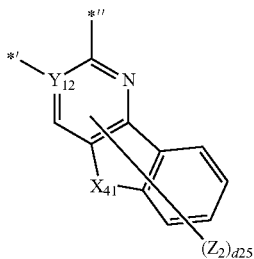

CY12-30
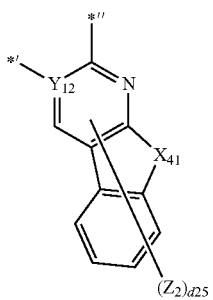

CY12-31
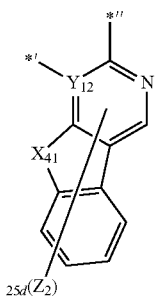

CY12-32

CY12-33
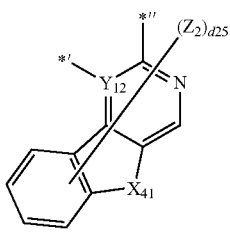

CY12-34 wherein, in Formulae CY11-1 to CY11-34 and CY12-1 to CY12-34, $X_{31}$ may be O, S, $N(Z_{11})$, $C(Z_{11})(Z_{12})$, or $Si(Z_{11})(Z_{12})$, $X_{41}$ may be O, S, $N(Z_{21})$, $C(Z_{21})(Z_{22})$, or $Si(Z_{21})(Z_{22})$, $Y_{11}$, $Y_{12}$, $Z_1$, and $Z_2$ are the same as described in the present specification, $Z_{11}$ to $Z_{18}$ and $Z_{21}$ to $Z_{28}$ are the same as described in connection with $R_{21}$, d12 and d22 may each independently be an integer from 0 to 2, d13 and d23 may each independently be an integer from 0 to 3, d14 and d24 may each independently be an integer from 0 to 4, d15 and d25 may each independently be an integer from 0 to 5, d16 and d26 may each independently be an integer from 0 to 6, and

* and *' in Formulae CY11-1 to CY11-34 and CY12-1 to CY12-34 may each be a binding site to M in Formula 1, and *" may be a binding site to a neighboring atom in Formula 3C or a binding site to $T_{21}$ in Formula 3D.

In one or more embodiments, $L_2$ in Formula 1 may be a group represented by one of Formulae 3-1(1) to 3-1(66) or 3-1(301) to 3-1(309):

3-1(1)
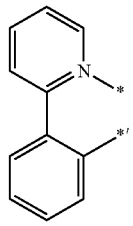

3-1(2)
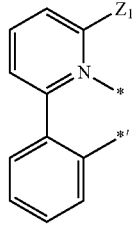

3-1(3)
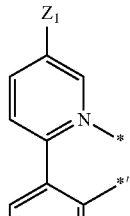

3-1(4)
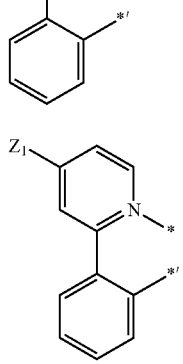

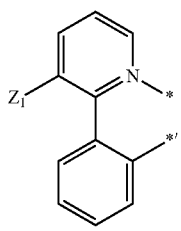 3-1(5)
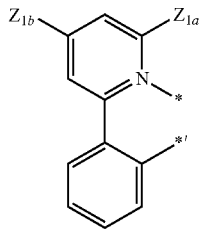 3-1(11)
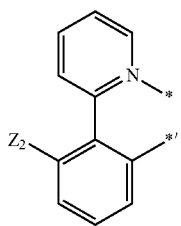 3-1(6)
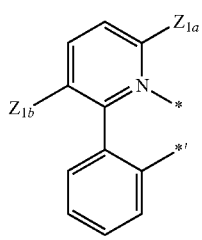 3-1(12)
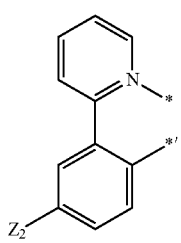 3-1(7)
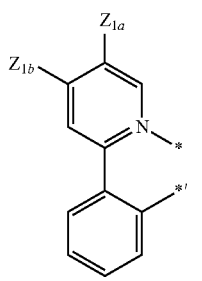 3-1(13)
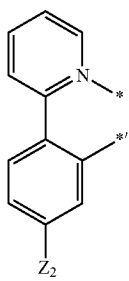 3-1(8)
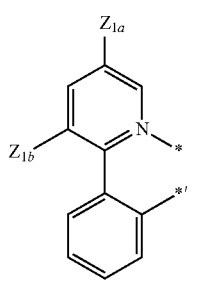 3-1(14)
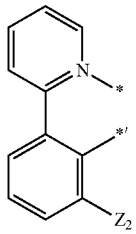 3-1(9)
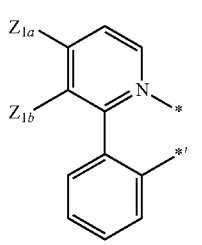 3-1(15)
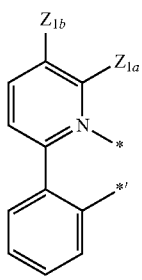 3-1(10)
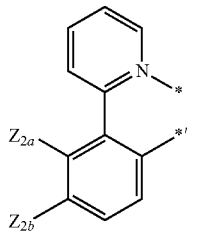 3-1(16)

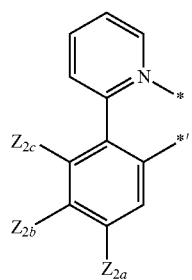 3-1(29)
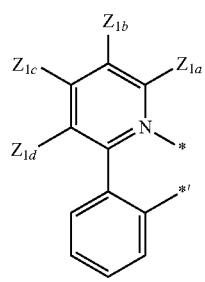 3-1(30)
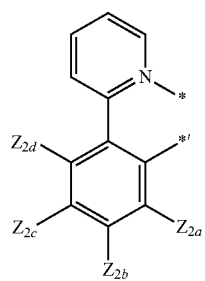 3-1(31)
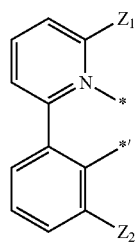 3-1(32)
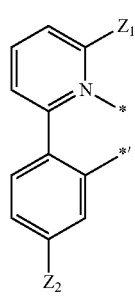 3-1(33)
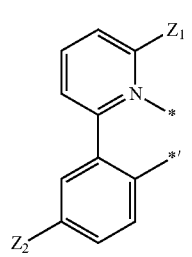 3-1(34)
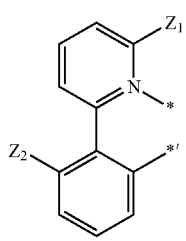 3-1(35)
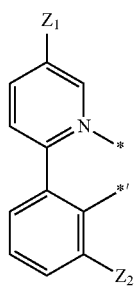 3-1(36)
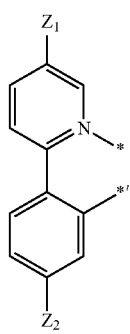 3-1(37)
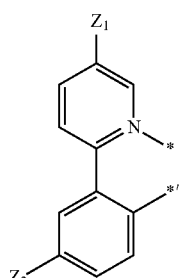 3-1(38)
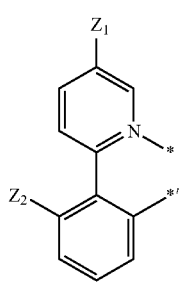 3-1(39)

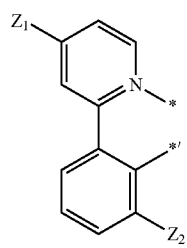 3-1(40)
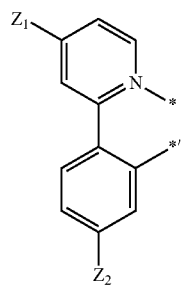 3-1(41)
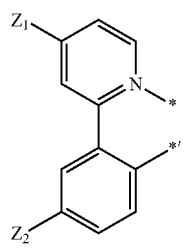 3-1(42)
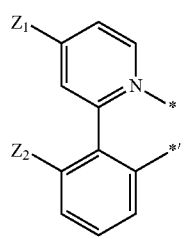 3-1(43)
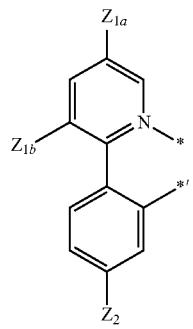 3-1(44)
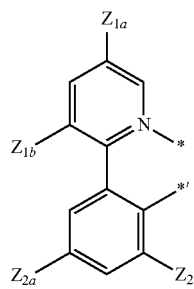 3-1(45)
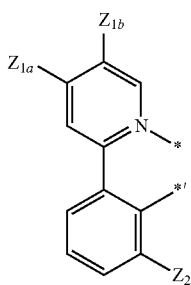 3-1(46)
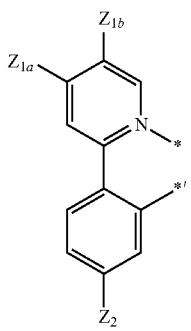 3-1(47)
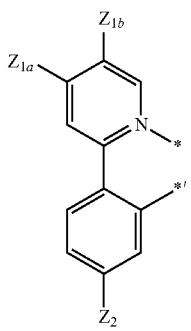 3-1(48)
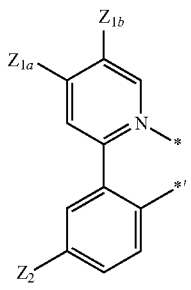 3-1(48)
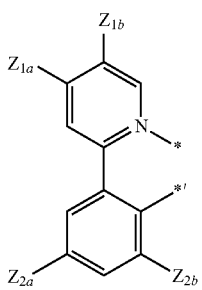 3-1(49)
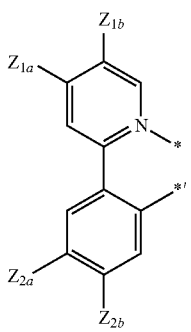 3-1(50)

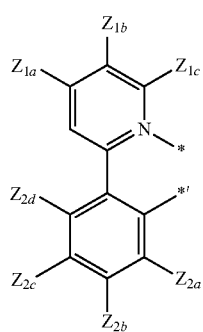
3-1(51)
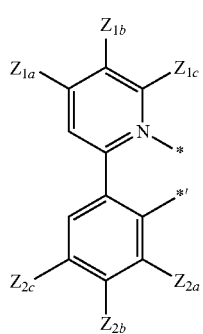
3-1(52)
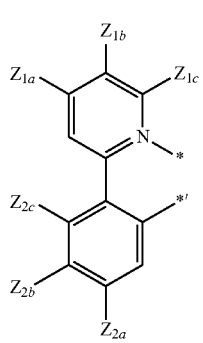
3-1(53)
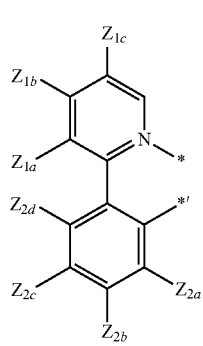
3-1(54)
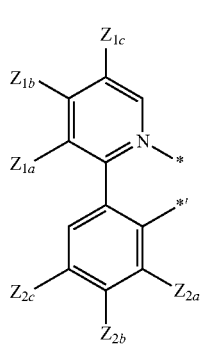
3-1(55)
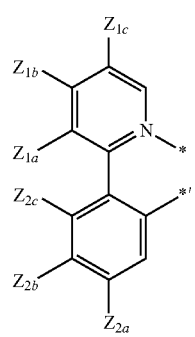
3-1(56)
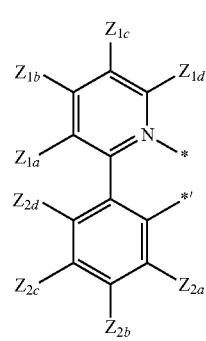
3-1(57)
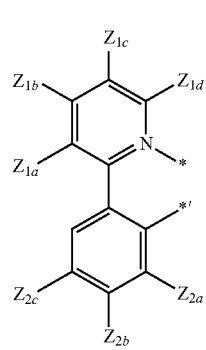
3-1(58)
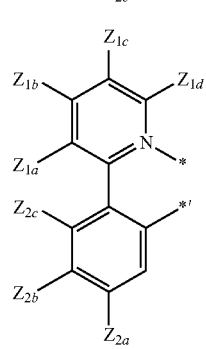
3-1(59)
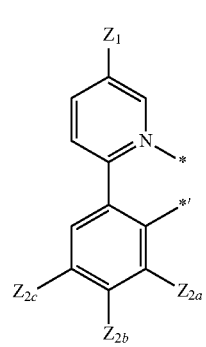
3-1(60)

-continued
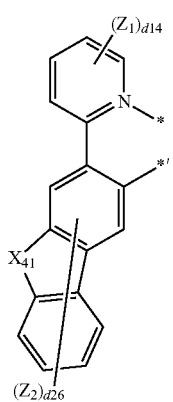
3-1(61)
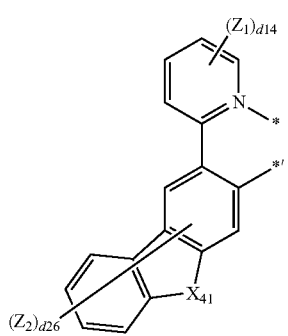
3-1(62)
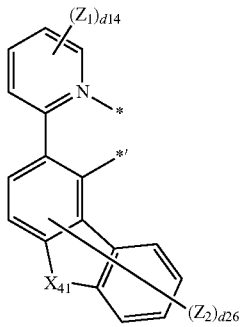
3-1(63)
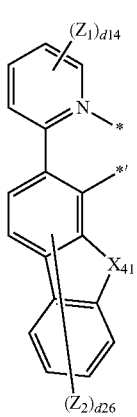
3-1(64)
-continued
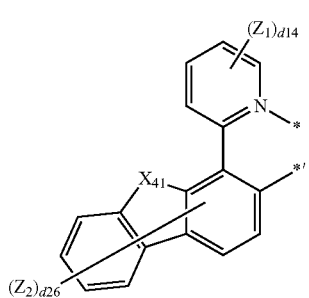
3-1(65)
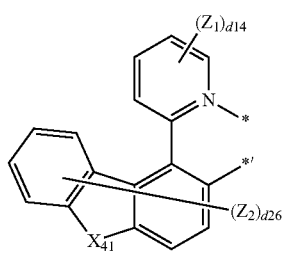
3-1(66)
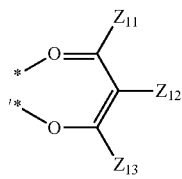
3-1(301)
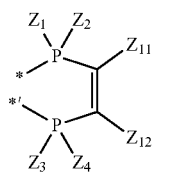
3-1(302)
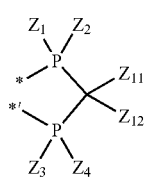
3-1(303)
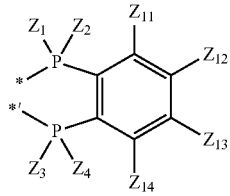
3-1(304)
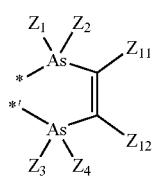
3-1(305)

-continued 3-1(306)
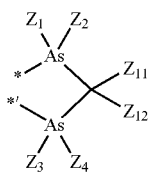

3-1(307)
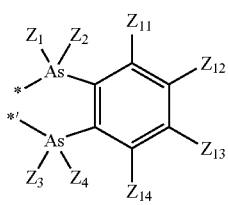

3-1(308)
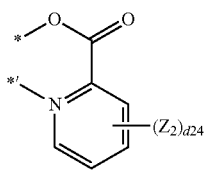

3-1(309)
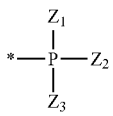

wherein, in Formulae 3-1(1) to 3-1(66) and 3-1(301) to 3-1(309), $X_{41}$ may be O, S, $N(Z_{21})$, $C(Z_{21})(Z_{22})$, or $Si(Z_{21})(Z_{22})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, $Z_{21}$ and $Z_{22}$ are the same as described in connection with $R_{21}$, d14 and d24 may each independently be an integer from 0 to 4, d26 may be an integer from 0 to 6, and

* and *' each indicate a binding site to M in Formula 1.

In one or more embodiments, $L_2$ in Formula 1 may include at least one —$Si(Q_3)(Q_4)(Q_5)$, at least one —$Ge(Q_3)(Q_4)(Q_5)$, or any combination thereof.

In one or more embodiments, $Z_1$ of Formulae 3-1(3), 3-1(36) to 3-1(39) and 3-1(60), $Z_{1a}$ of Formulae 3-1(13), 3-1(14), 3-1(25), 3-1(44) and 3-1(45), $Z_{1b}$ of Formulae 3-1(10), 3-1(22), 3-1(23), 3-1(30) and 3-1(46) to 3-1(53), and $Z_{1c}$ of Formulae 3-1(54) to 3-1(59) may be —$Si(Q_3)(Q_4)(Q_5)$ or —$Ge(Q_3)(Q_4)(Q_5)$.

The organometallic compound represented by Formula 1 may emit green light, for example, green light having a maximum emission wavelength in the range of about 500 nm to about 600 nm, or about 500 nm to about 560 nm.

In one or more embodiments, the organometallic compound may be one of Compounds 1 to 7:

1
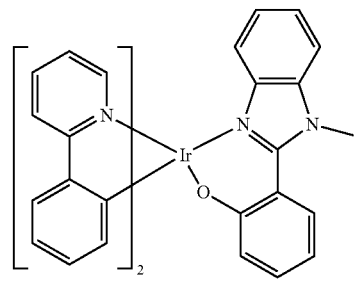

2
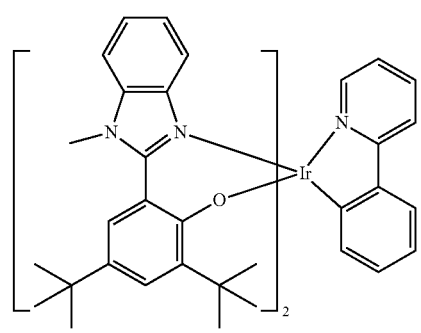

3
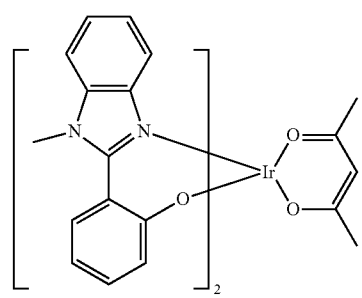

4
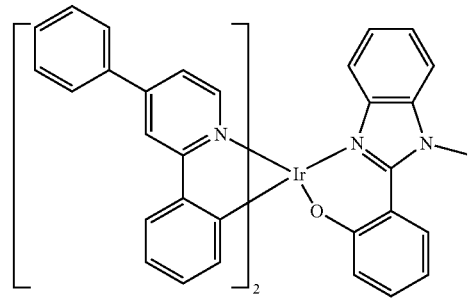

5
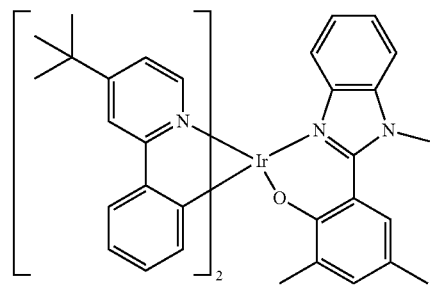

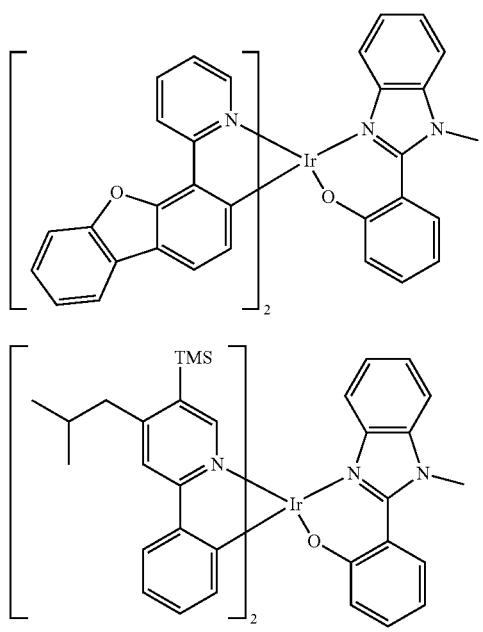

M in Formula 1 may be a transition metal. Accordingly, the organometallic compound represented by Formula 1 may emit phosphorescent light. Therefore, the organometallic compound represented by Formula 1 can be clearly distinguished from the organometallic compound that emits fluorescent light, not phosphorescent light, by using a metal (for example, Al, Be, Mg, etc.) rather than transition metal as the central metal.

$L_1$ in the organometallic compound represented by Formula 1 may be a ligand represented by Formula 2A or 2B, and n1, which is the number of $L_1$, may be 1, 2 or 3. That is, the organometallic compound necessarily includes at least one ligand represented by Formula 2A or Formula 2B, as a ligand linked to metal M.

In Formula 2A and 2B, ring $CY_1$ may be condensed with ring $CY_2$ which is linked to metal M via $X_1$. Thus, the emission efficiency of the organometallic compound represented by Formula 1 may be increased by the conjugation effect.

In one or more embodiments, ring $CY_2$ linked to metal M via $X_1$ in Formulae 2A and 2B may be a 5-membered ring. In one or more embodiments, $X_2$ of Formulae 2A and 2B may be carbon (C). Ring $CY_2$ of Formulae 2A and 2B may be linked to ring $CY_{21}$ via carbon (C). Accordingly, the maximum emission wavelength and/or full width at half maximum (FWHM) of photoluminescence (PL) spectrum and/or electroluminescence (EL) spectrum of the organometallic compound represented by Formula 1 may be variously controlled.

Since ring $CY_{21}$ of Formulae 2A and 2B is linked to metal M of Formula 1 via $Y_1$, a cyclometalated ring formed by metal M and ligand $L_1$ of Formula 1 may be a 6-membered ring. Thus, hole transport characteristics of the organometallic compound represented by Formula 1 may be enhanced.

The highest occupied molecular orbital (HOMO) energy level, lowest unoccupied molecular orbital (LUMO) energy level, band gap, $S_1$ energy level, and $T_1$ energy level of some compounds of the organometallic compound represented by Formula 1 were evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | Band gap (eV) | $S_1$ (eV) | $T_1$ (eV) |
| --- | --- | --- | --- | --- | --- |
| 1 | −4.606 | −1.237 | 3.369 | 2.626 | 2.469 |
| 2 | −4.520 | −1.294 | 3.226 | 2.626 | 2.482 |
| 3 | −4.477 | −1.004 | 3.473 | 2.699 | 2.435 |
| 4 | −4.592 | −1.520 | 3.072 | 2.459 | 2.276 |
| 5 | −4.451 | −1.104 | 3.374 | 2.686 | 2.483 |
| 6 | −4.726 | −1.404 | 3.322 | 2.629 | 2.376 |
| 7 | −4.554 | −1.210 | 3.344 | 2.612 | 2.436 |

From Table 1, it is confirmed that the organometallic compound represented by Formula 1 has such electrical characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is located between the first electrode and the second electrode and includes an emission layer, wherein the organic layer includes at least one organometallic compound represented by Formula 1.

The organic light-emitting device may have, due to the inclusion of an organic layer including the organometallic compound represented by Formula 1, a low driving voltage, a high external quantum efficiency, and a low roll-off ratio.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount (weight) of the organometallic compound represented by Formula 1 is smaller than an amount (weight) of the host). The emission layer may emit green light, for example, green light having a maximum luminescence wavelength in the range of about 500 nm to about 600 nm, or about 500 nm to about 560 nm.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region located between the first electrode and the emission layer and an electron transport region located between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIG. 1s a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), zinc oxide (ZnO), or any combination thereof. In one or more embodiments, the material for forming the first electrode 11 may include metal, such as magnesium (Mg), aluminum (Al), aluminum-lithium (Al—Li), calcium (Ca), magnesium-indium (Mg—In), magnesium-silver (Mg—Ag), or any combination thereof.

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or any combination thereof:

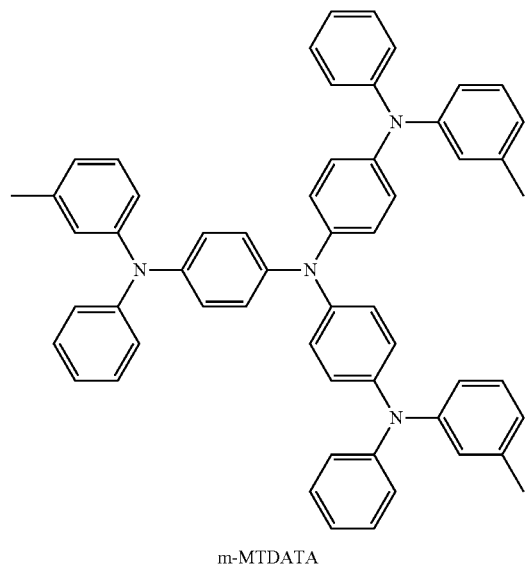

m-MTDATA

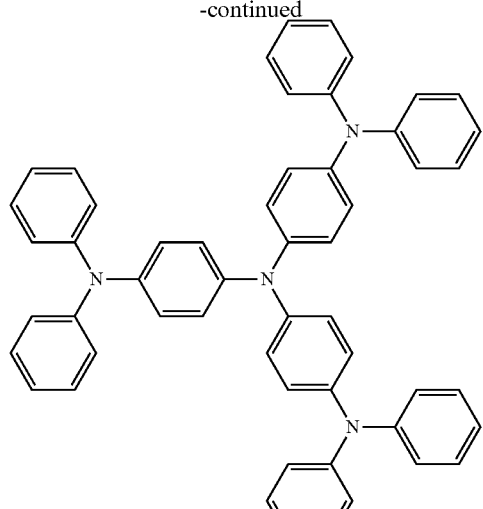
TDATA
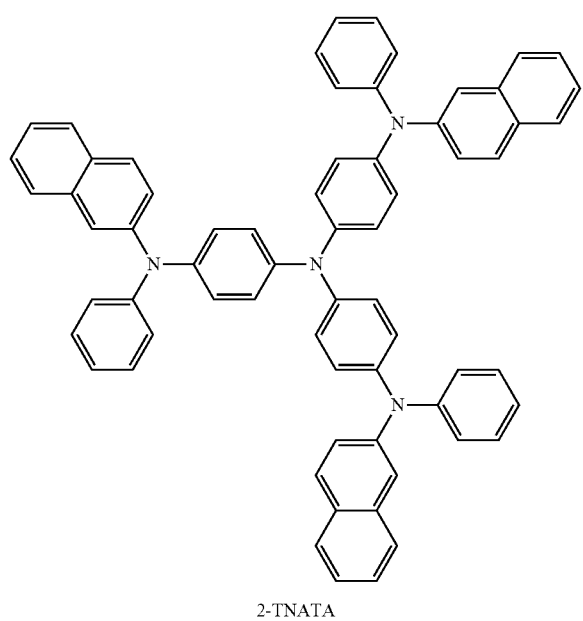
2-TNATA
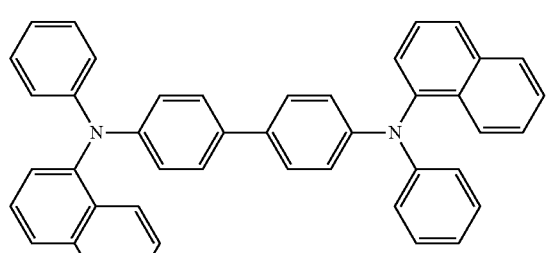
NPB
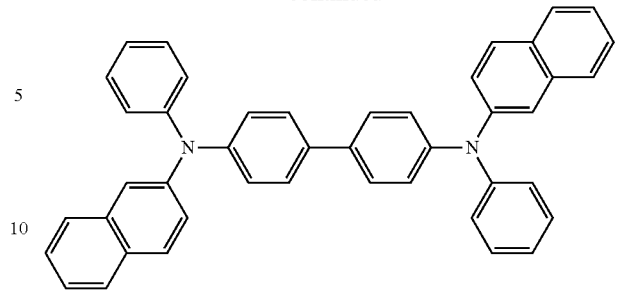
β-NPB
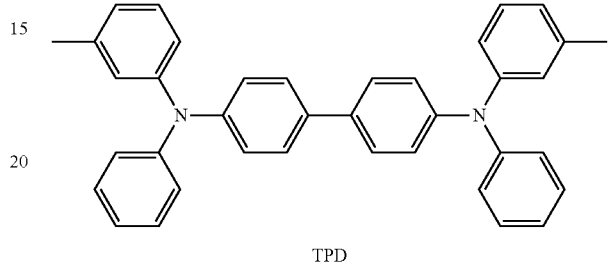
TPD
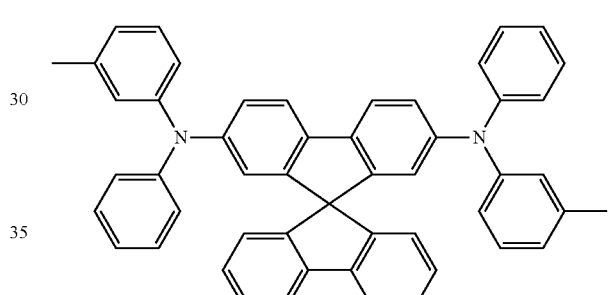
Spiro-TPD
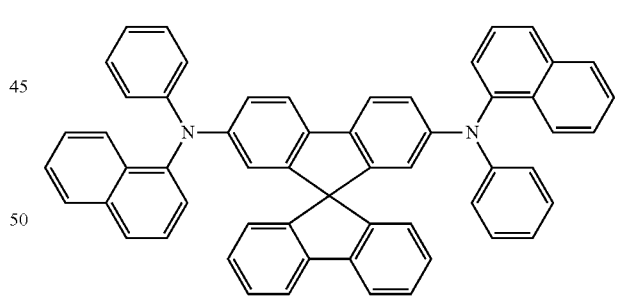
Spiro-NPB
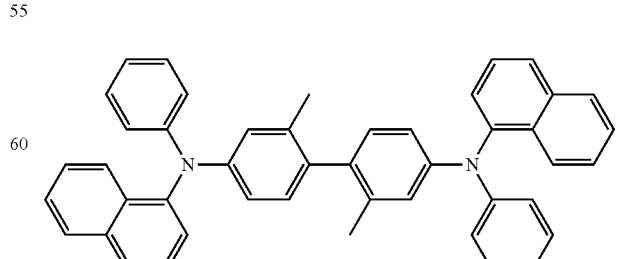
methylated NPB

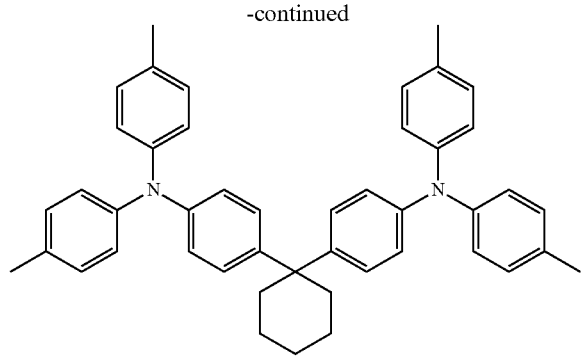

TAPC

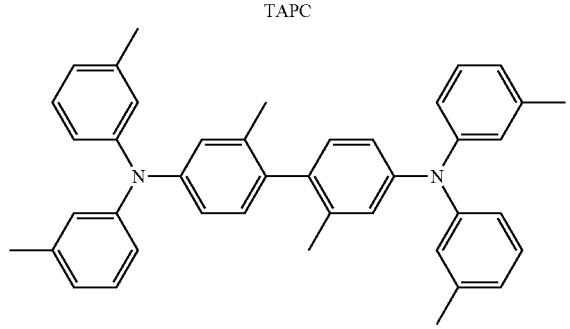

HMTPD

<Formula 201>

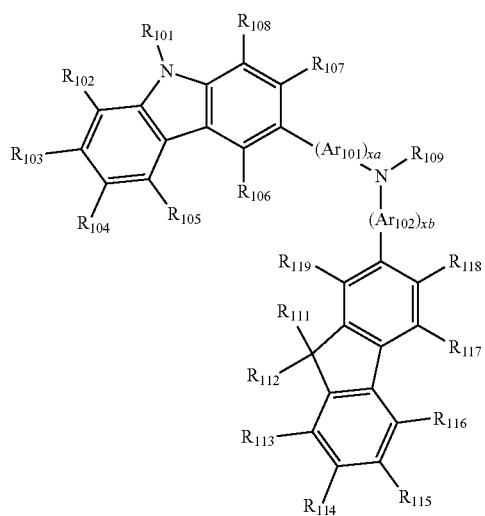

<Formula 202>

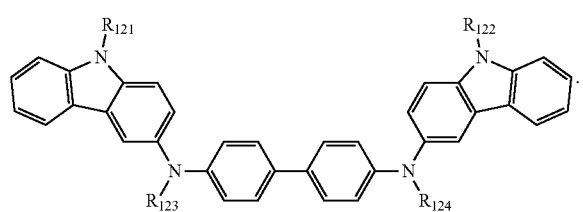

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0.

R$_{101}$ to R$_{108}$, R$_{111}$ to R$_{119}$ and R$_{121}$ to R$_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

R$_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:
<Formula 201A>
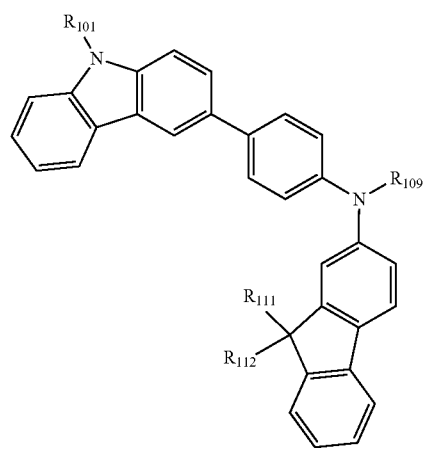
$R_{101}$, $R_{111}$, $R_{112}$, and $R_{109}$ in Formula 201A may be understood by referring to the description provided herein.
For example, the hole transport region may include one of Compounds HT1 to HT20 or any combination thereof:
HT1
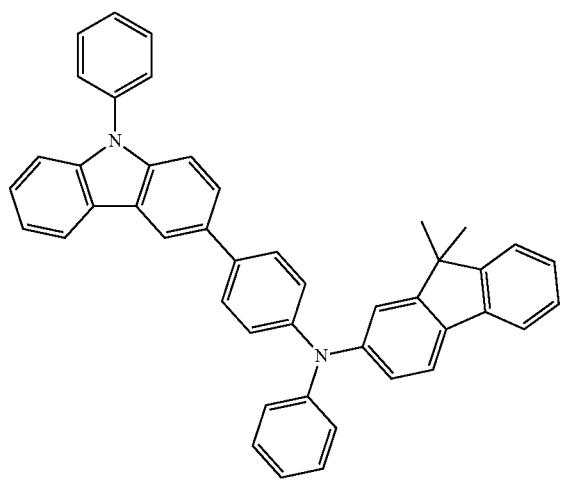
HT2
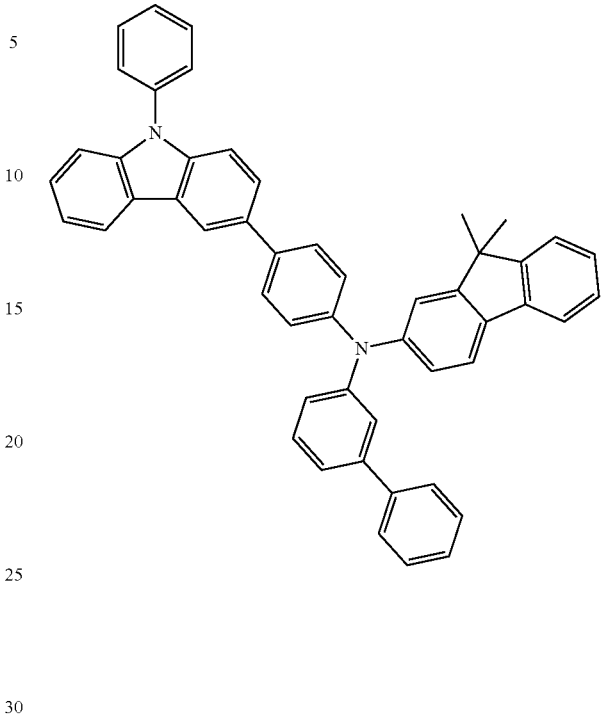
HT3
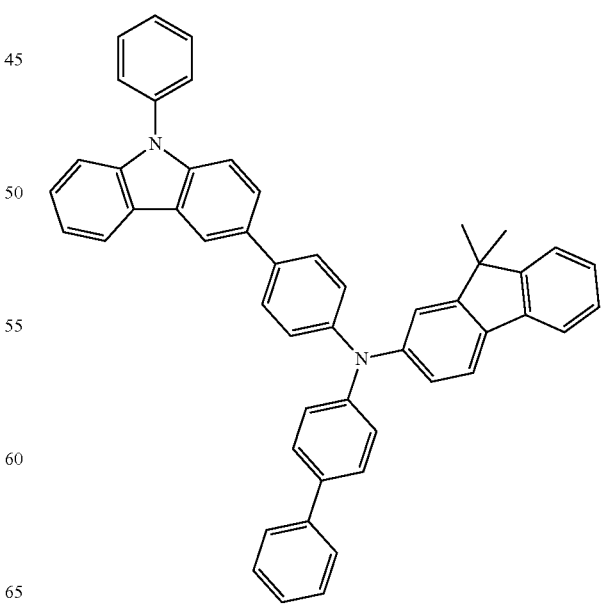

-continued
HT4
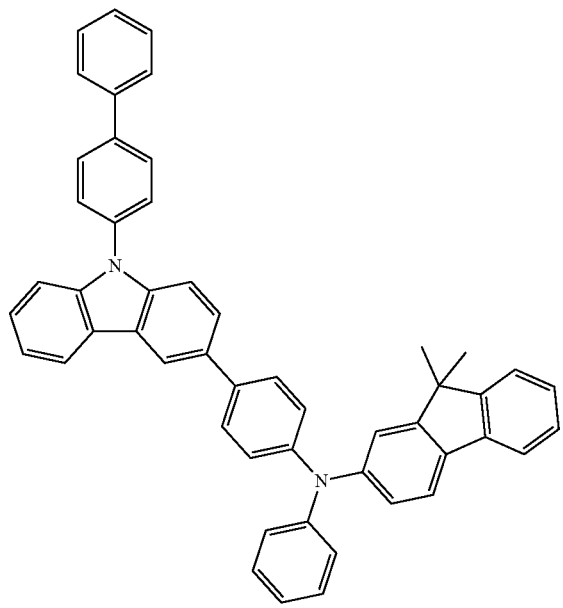
HT6
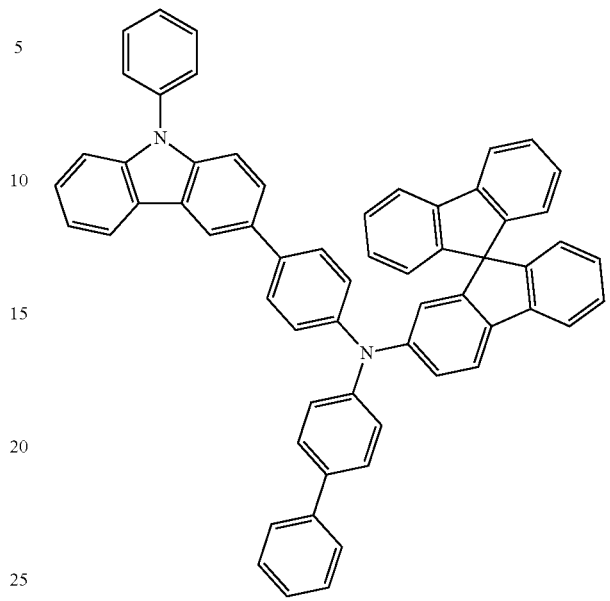
HT5
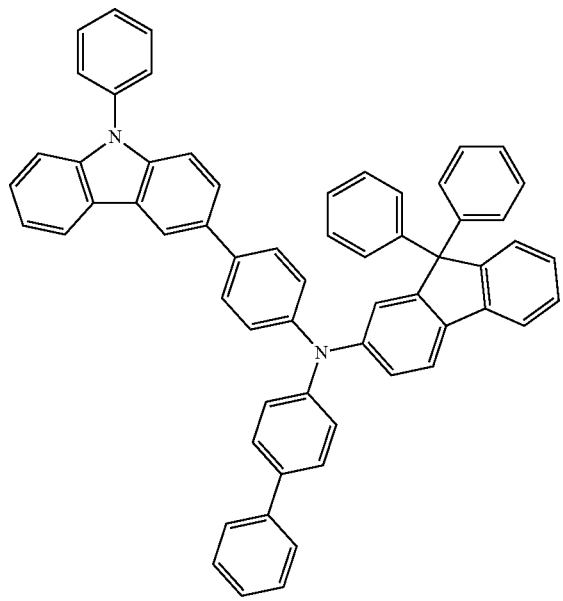
HT7
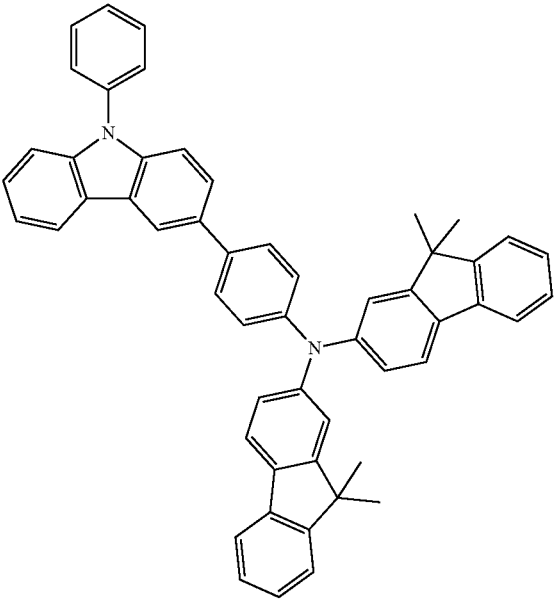

HT8
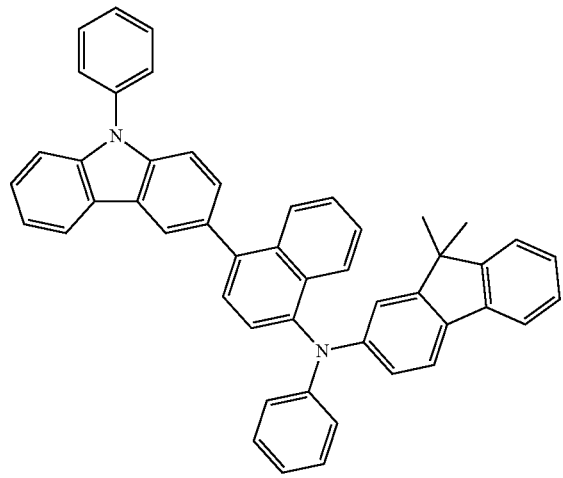
HT9
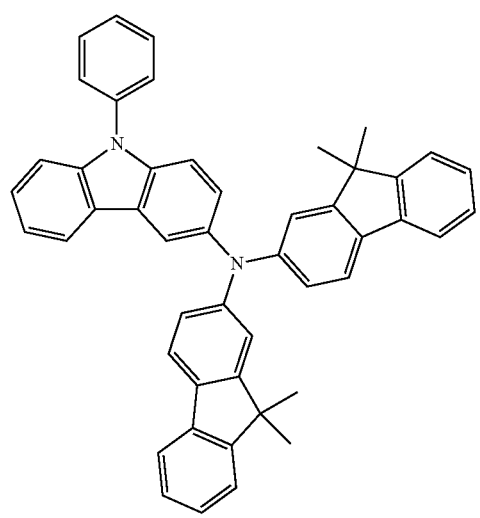
HT10
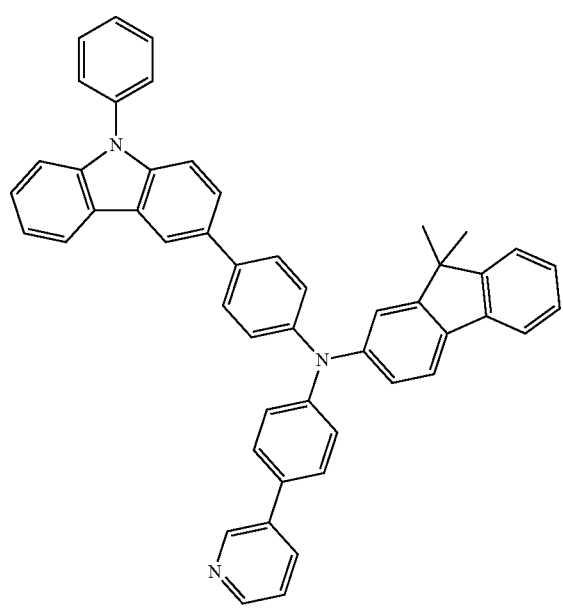
HT11
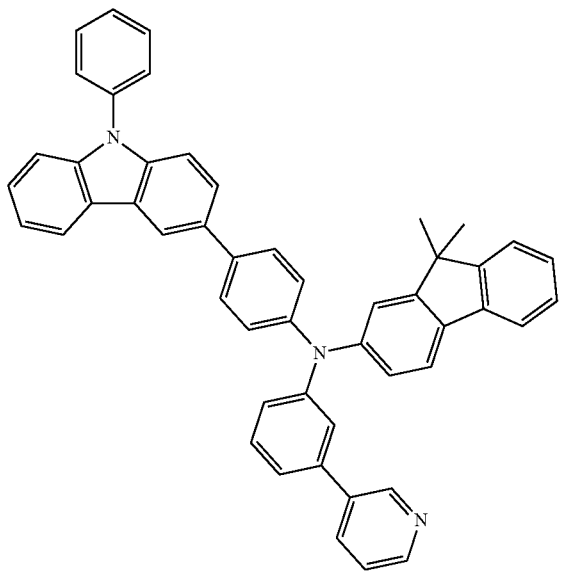
HT12
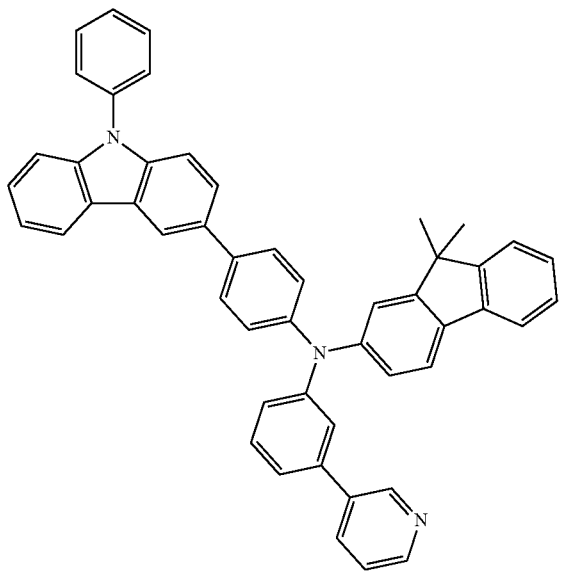
HT13
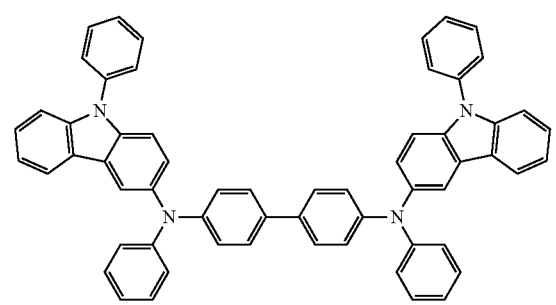

HT14

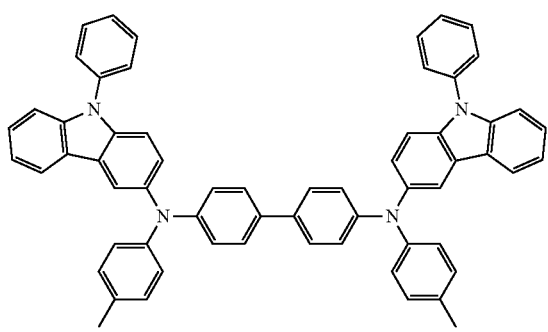

HT15

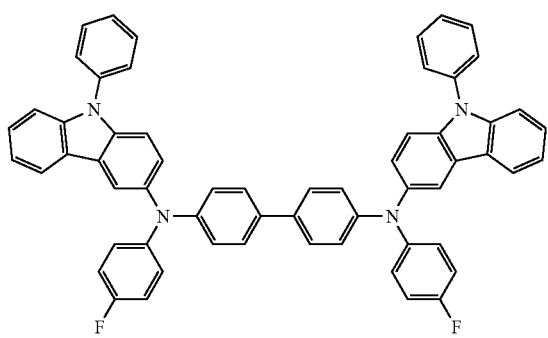

HT16

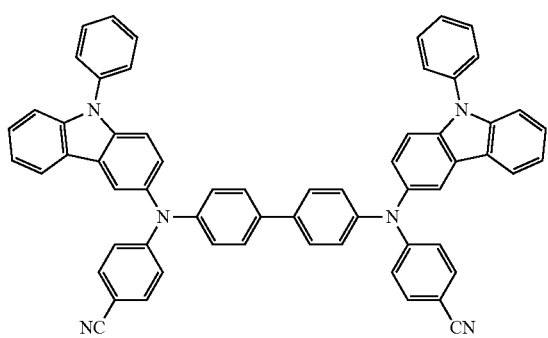

HT17

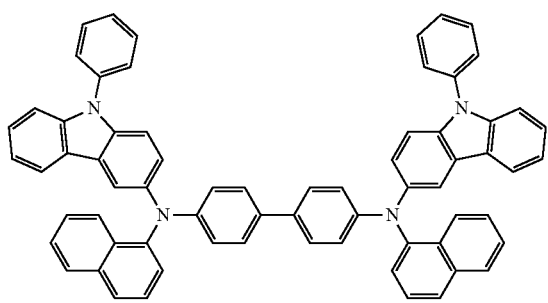

HT18

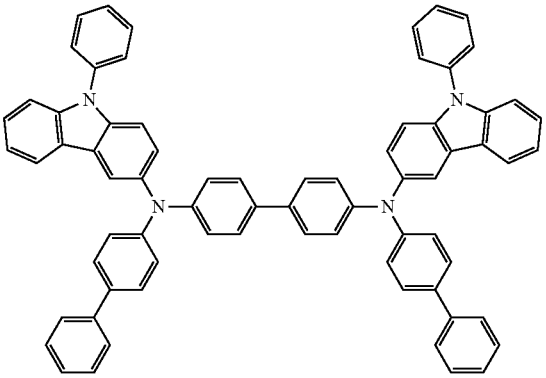

HT19

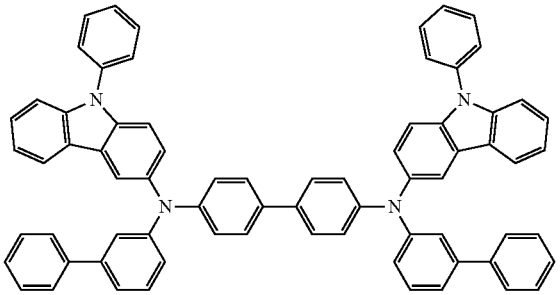

HT20

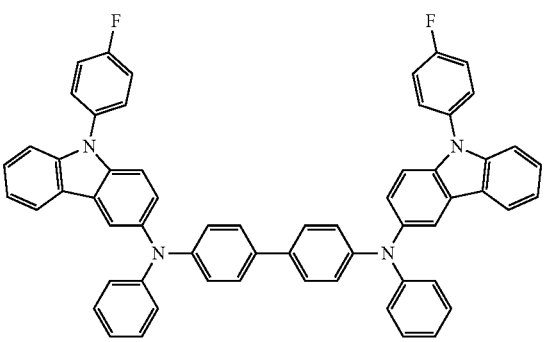

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination thereof. For example, the p-dopant may include: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

HT-D1

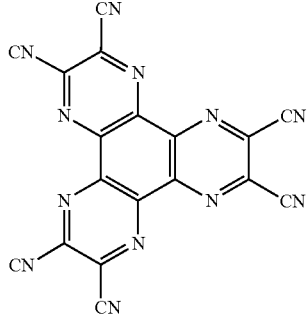

F4-TCNQ

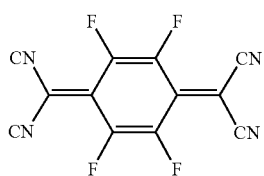

F6-TCNNQ

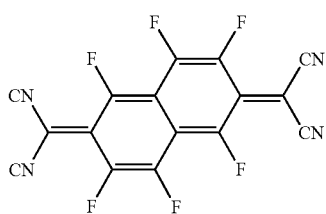

The hole transport region may include a buffer layer.

Also, the buffer layer may compensate for an optical resonance distance according to a wavelength of light emitted from the emission layer, and thus, emission efficiency of a formed organic light-emitting device may be improved.

Meanwhile, when the hole transport region includes an electron blocking layer, a material for forming the electron blocking layer may include a material that is used in the hole transport region as described above, a host material described below, or any combination thereof. For example, when the hole transport region includes an electron blocking layer, mCP, etc. may be used as the material for forming the electron blocking layer.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, or any combination thereof:

TPBi

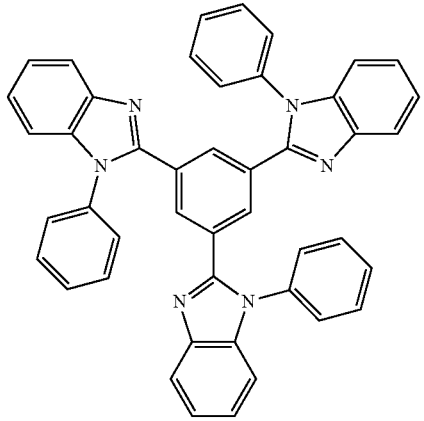

TBADN

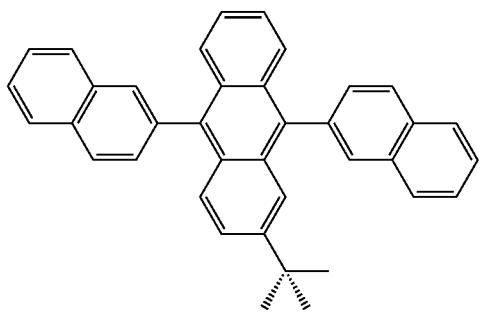

ADN

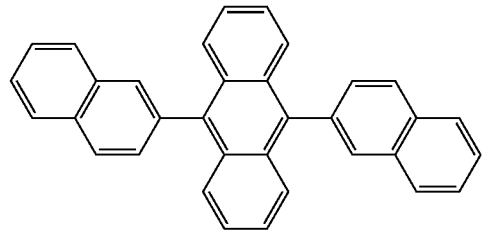

CBP

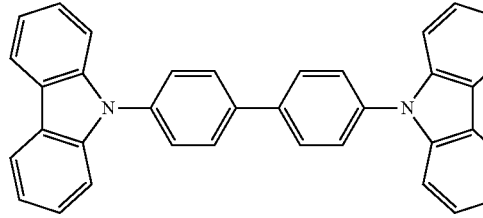

CDBP

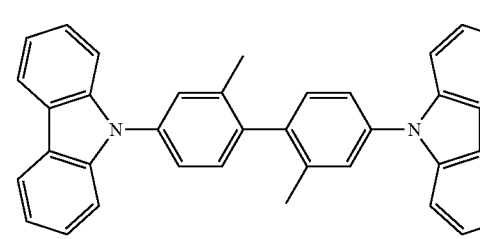

TCP

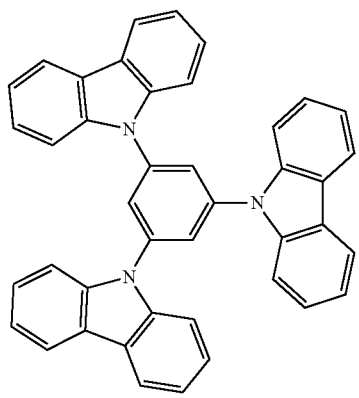

mCP

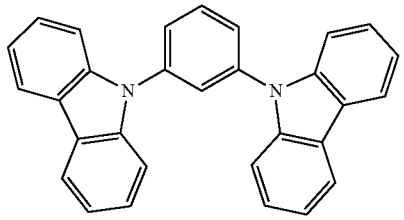

H50

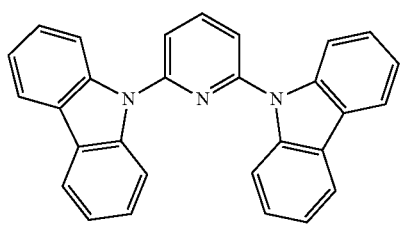

H51

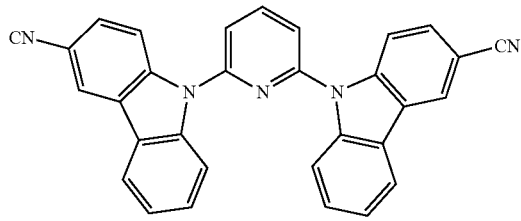

H52

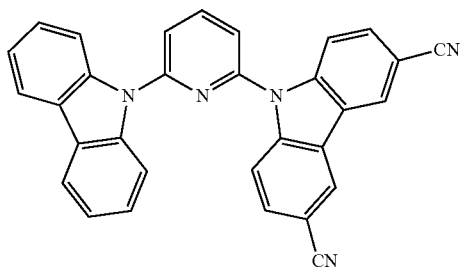

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof.

BCP

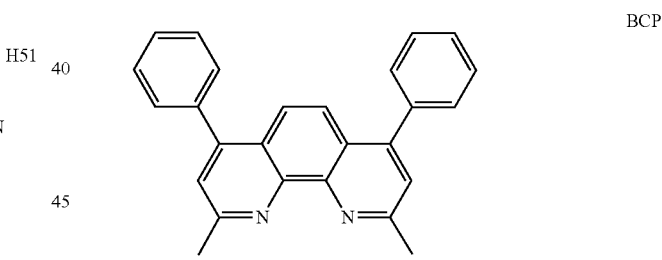

Bphen

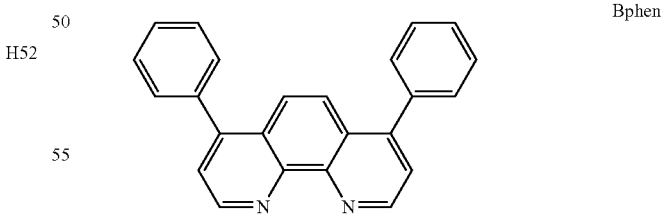

A thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, Alq$_3$, BAlq, TAZ, NTAZ, or any combination thereof:

Alq₃
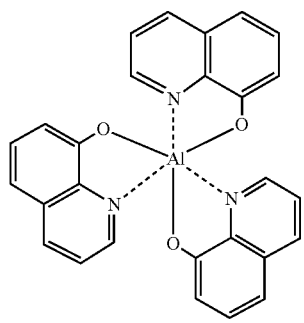
BAlq
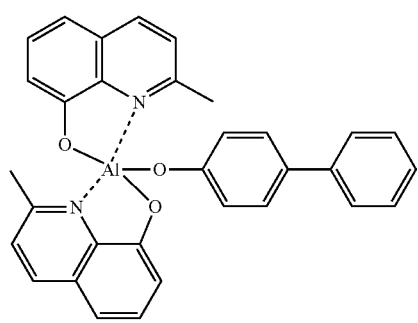
TAZ
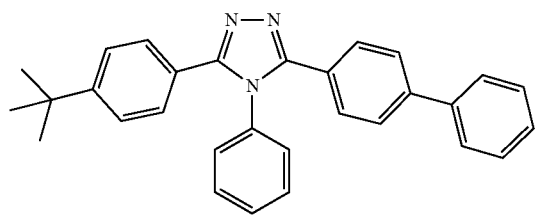
NTAZ
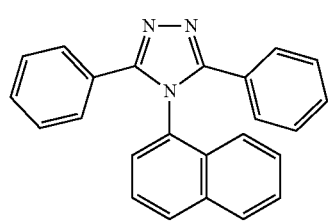
ET1
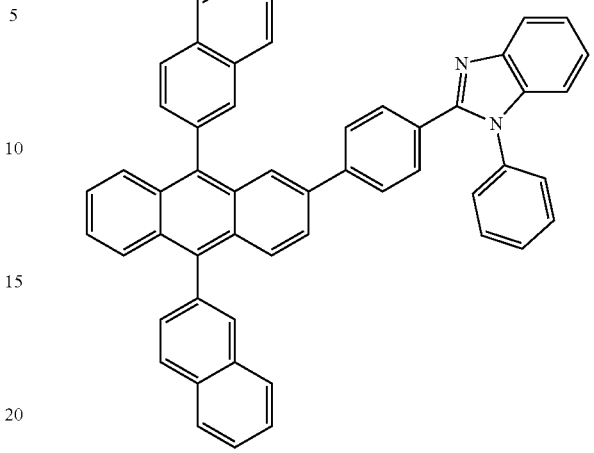
ET2
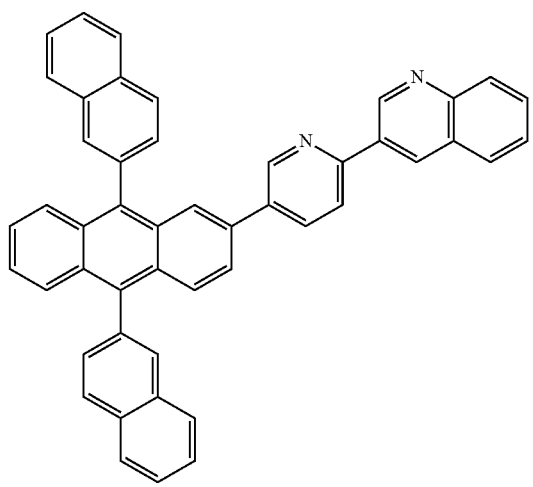
ET3
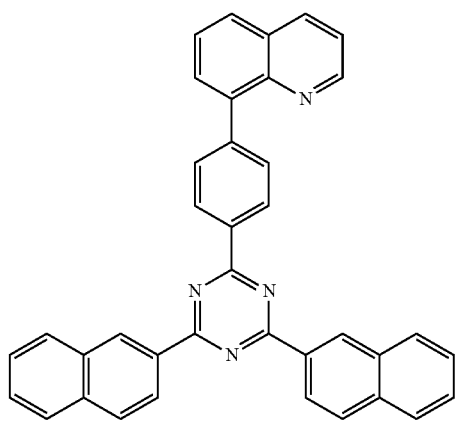
In one or more embodiments, the electron transport layer may include one of Compounds ET1 to ET25 or any combination thereof:

127
-continued
ET4
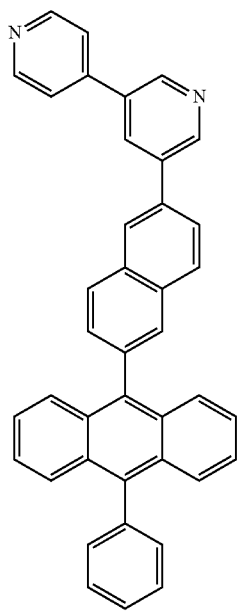
ET5
128
-continued
ET7
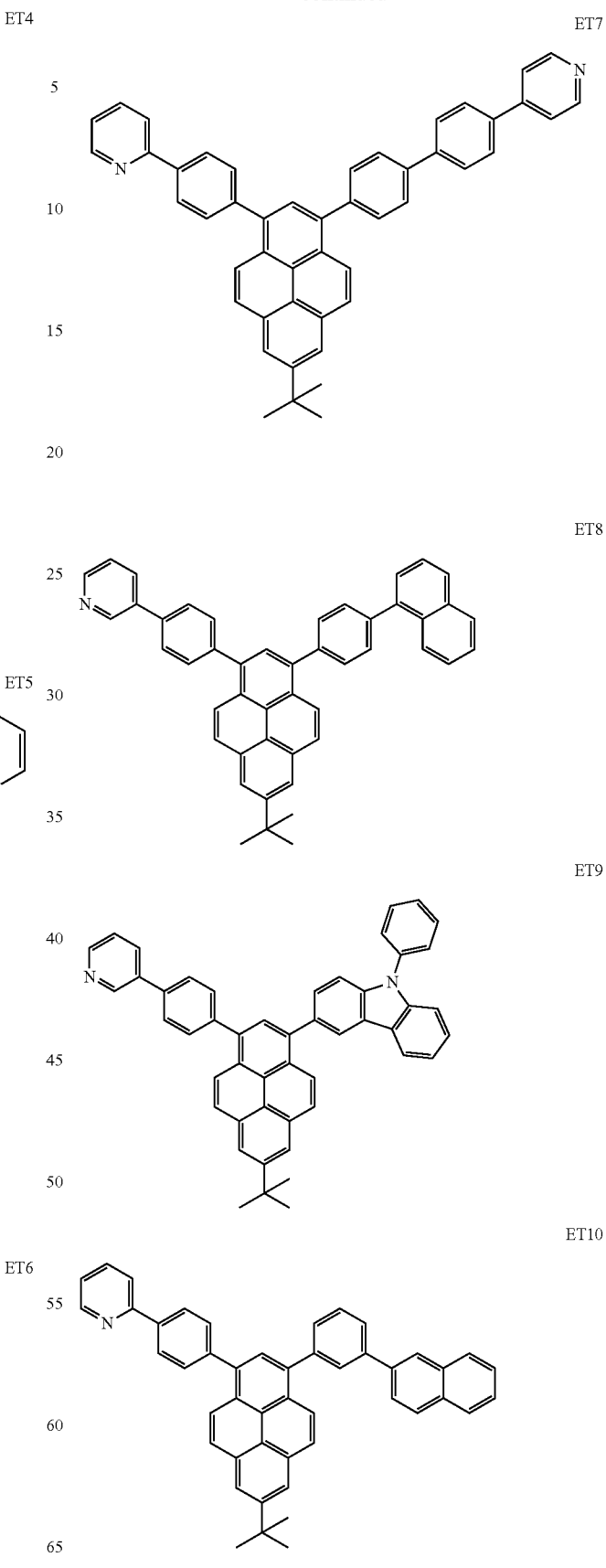
ET8
ET9
ET6
ET10

ET11
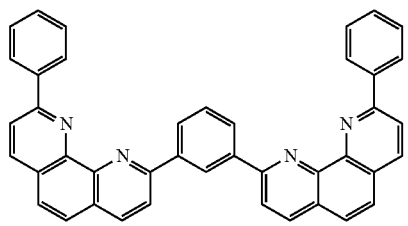
HT15
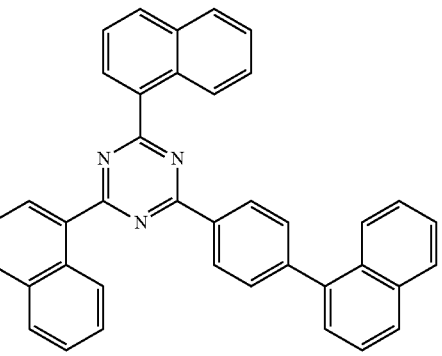
ET12
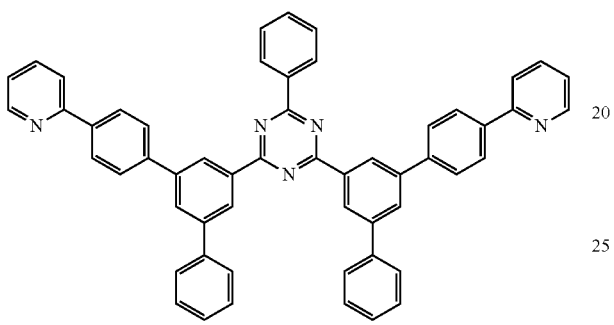
HT16
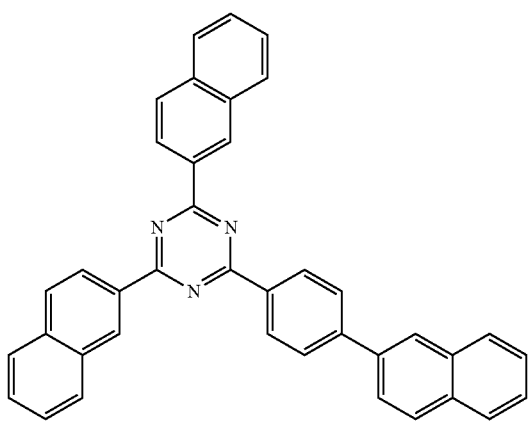
ET13
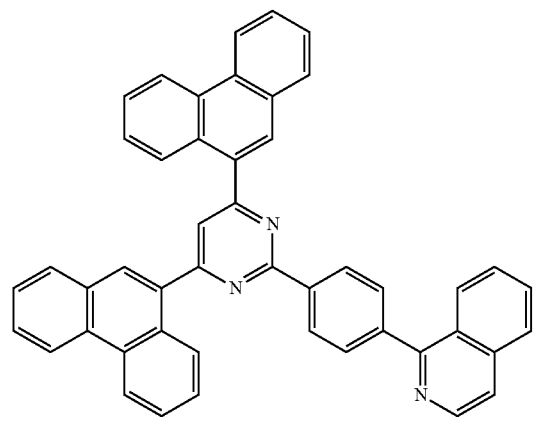
HT17
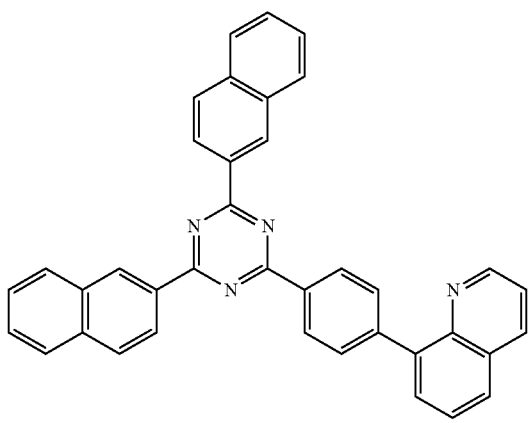
ET14
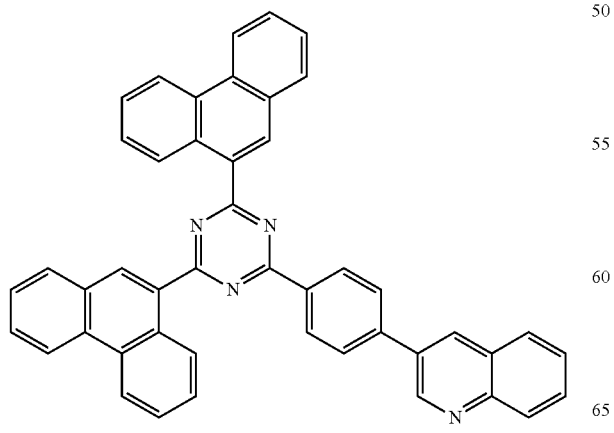
HT18
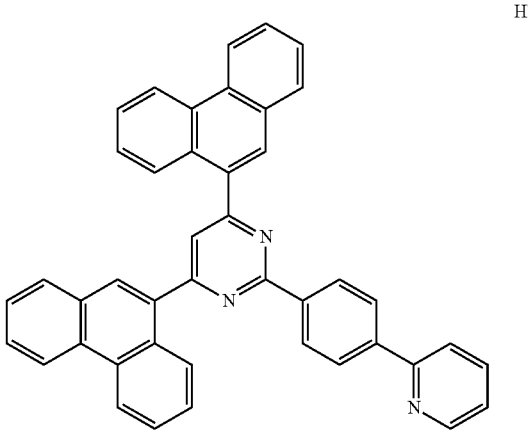

ET19
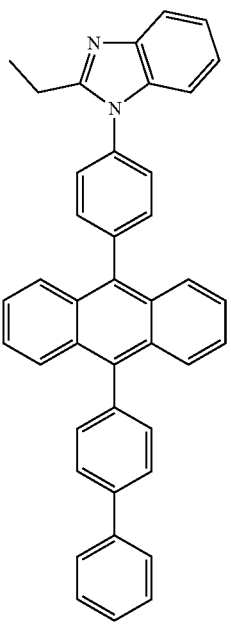
ET22
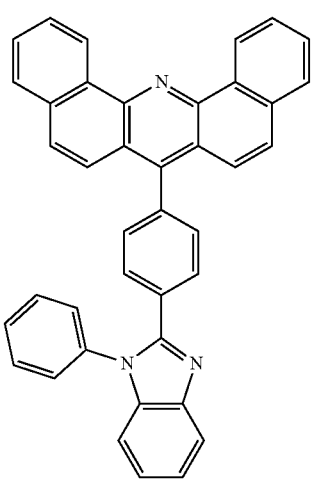
ET23
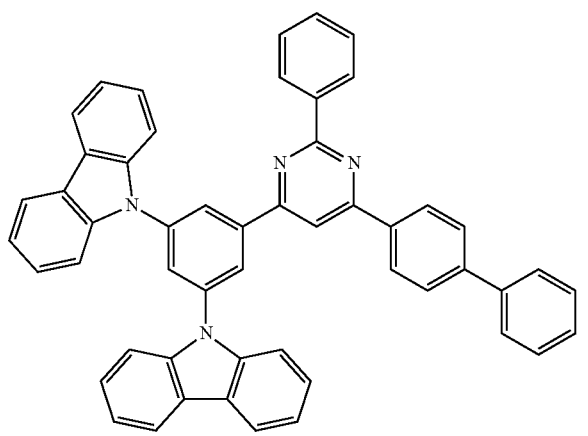
ET20
ET21
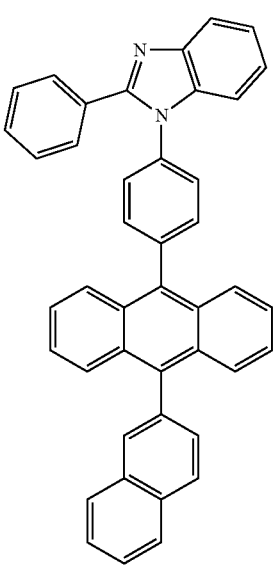
ET24
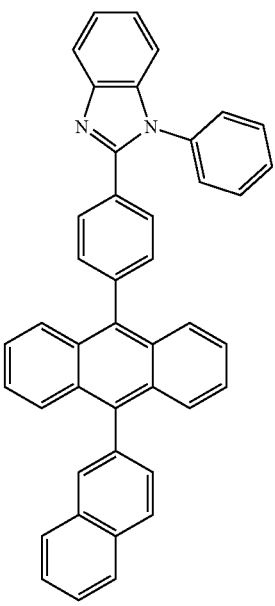

ET25

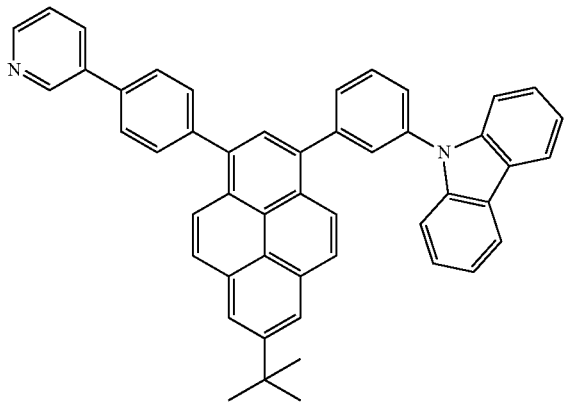

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a $L_1$ complex. The $L_1$ complex may include, for example, Compound ET-D1 or ET-D2:

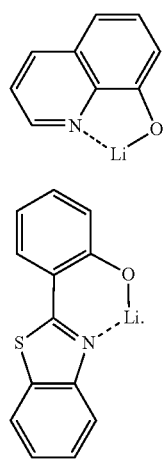

ET-D1

ET-D2

The electron transport region may include an electron injection layer (EIL) that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may include metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched C alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_6$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a norbornanyl(bicyclo[2.2.1]heptyl) group, a bicyclo[1.1.1]pentyl group, a bicyclo[2.1.1]hexyl group, a bicyclo[2.2.2]octyl group, and the like.

The term "$C_1$-$C_{10}$ heterocycloalkyl group" as used herein refers to a monocyclic group that includes at least one heteroatom selected from N, O, P, Si, S, Se, Ge and B as a ring-forming atom and 1 to 10 carbon atoms, and the $C_1$-$C_{10}$ heterocycloalkylene group refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge and B as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_6$ heteroaryl group" as used herein refers to a monovalent group having at least one hetero atom selected from N, O, P, Si, S, Se, Ge and B as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, Ge and B as a ring-forming atom and a cyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group.

When the $C_1$-$C_{60}$ heteroaryl group and the $C_1$-$C_{60}$ heteroarylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, S, Se, Ge and B, other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" are an adamantane group, a norbornane (bicyclo[2.2.1]heptane) group, a norbornene group, a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge and B other than 1 to 30 carbon atoms. The $C_1$-$C_{60}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene group 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, or any combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof.

$Q_1$ to $Q_9$, $Q_{11}$ to $Q_{19}$, $Q_{21}$ to $Q_{29}$ and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Synthesis of Compound 1)

Synthesis of Compound 1(1)

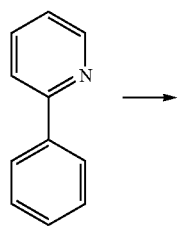

-continued

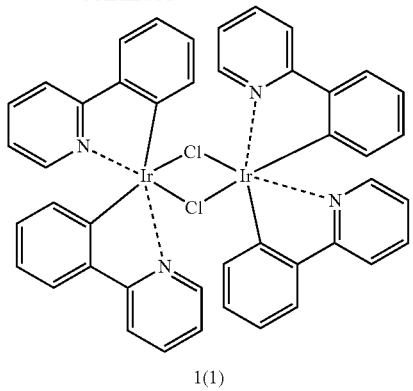

1(1)

Phenylpyridine (1.52 g, 9.81 mmol) and $IrCl_3 \cdot 3H_2O$ (1.54 g, 4.36 mmol) were mixed with a mixture (49 mL, 0.2 M) including 2-ethoxyethanol and water at the ratio of 3:1, and then, the resultant mixture was refluxed for 24 hours. After the reaction was completed, the mixture was cooled to room temperature, and then stirred at room temperature for 1 hour. The solid obtained therefrom was filtered, washed sequentially with $H_2O$, methanol (MeOH), and n-Hexane, and dried in a vacuum oven for 12 hours to synthesize 3 g of Compound 1 (1).

Synthesis of Compound 1

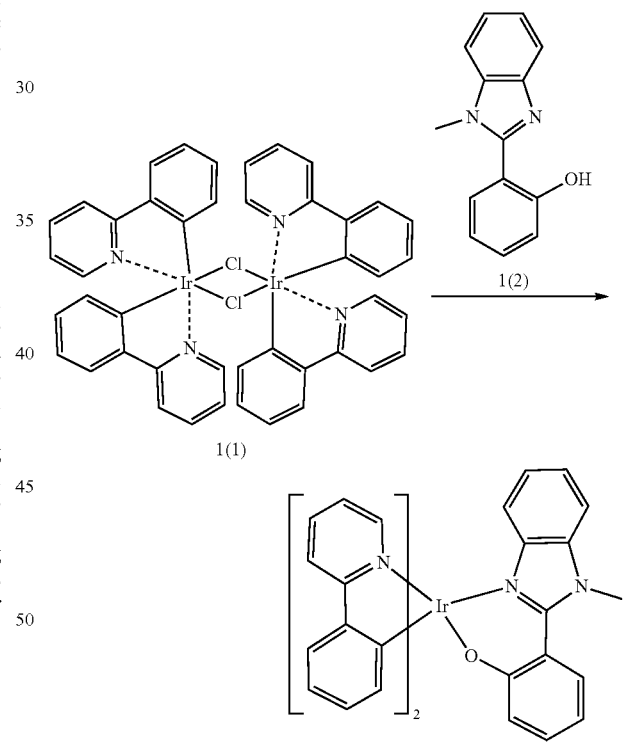

Compound 1(1) (3 g, 2.80 mmol), Compound 1(2)(2-(1-methyl-1H-benzo[d]imidazol-2-yl)phenol) (1.26 g, 5.60 mmol, 2 equiv.) and $Na_2CO_3$ (0.89 g, 3 equiv.) were mixed with 2-ethoxyethanol, and then, refluxed for 3 hours. The solid obtained therefrom was filtered, washed sequentially with $H_2O$, MeOH, and n-Hexane, dried in a vacuum oven, and then purified by column chromatography to obtain Compound 1 (1.5 g, purity of 99% or more). The obtained compound was confirmed by Mass Spectrometry and HPLC analysis.

HRMS(MALDI) calcd for $C_{36}H_{27}IrN_4O$: m/z 724.1814, Found: 724.1817

Synthesis Example 2 (Synthesis of Compound 2)

Synthesis of Compound 2(1)

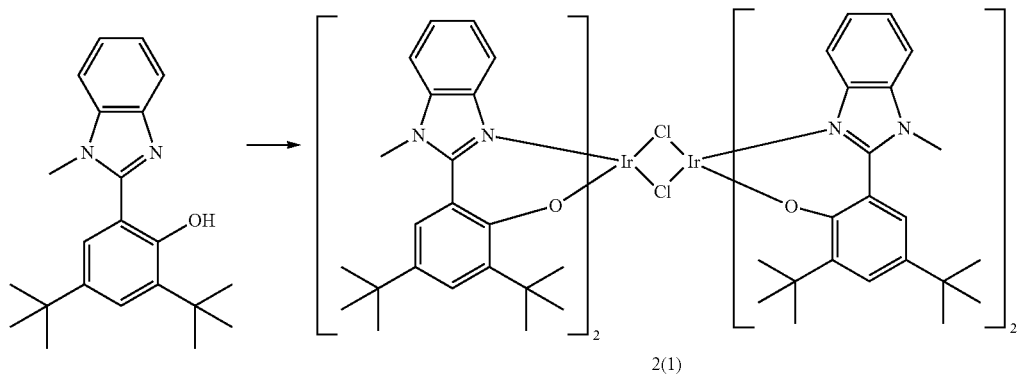

2(1)

Compound 2(1) was synthesized in the same manner as used to prepare Compound 1(1) of Synthesis Example 1, except that 2,4-di-tert-butyl-6-(1-methyl-1H-benzo[d]imidazol-2-yl)phenol was used instead of phenylpyridine.

Synthesis of Compound 2

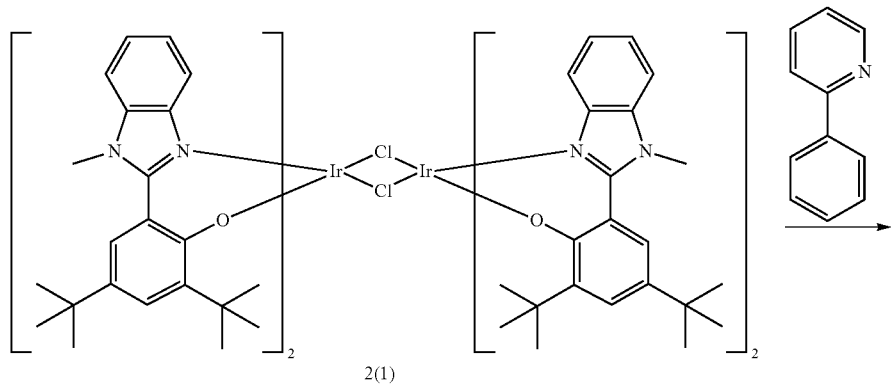

2(1)

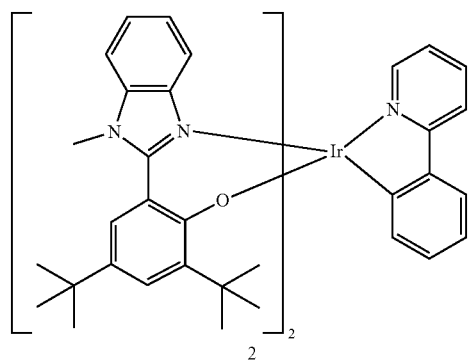

2

Compound 2 was synthesized in the same manner as used to prepare Compound 1 of Synthesis Example 1, except that Compound 2(1) and phenylpyridine were used instead of Compound 1(1) and Compound 1(2), respectively.

Synthesis Example 3 (Synthesis of Compound 3)

Synthesis of Compound 3(1)

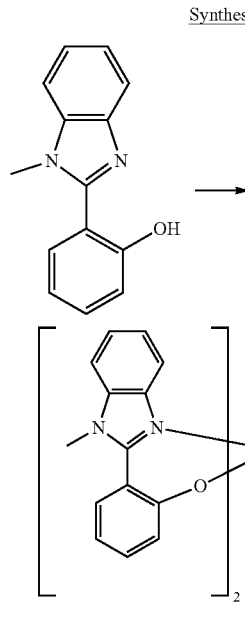

3(1)

Compound 3(1) was synthesized in the same manner as used to prepare Compound 1(1) of Synthesis Example 1, except that 2-(1-methyl-1H-benzo[d]imidazol-2-yl)phenol was used instead of phenylpyridine.

Synthesis of Compound 3

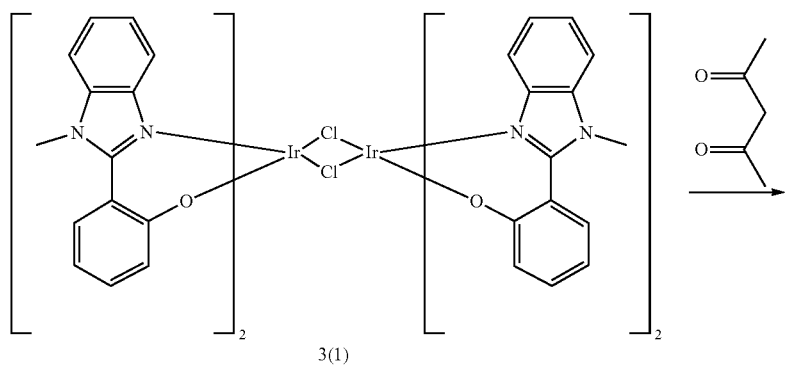

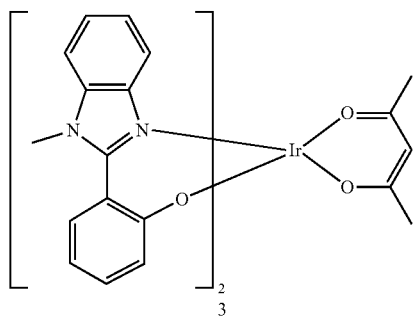

Compound 3 was synthesized in the same manner as used to synthesize Compound 1 of Synthesis Example 1, except that Compound 3(1) and pentane-2,4-dione were used instead of Compound 1(1) and Compound 1(2), respectively.

Synthesis Example 4 (Synthesis of Compound 4)

Synthesis of Compound 4(1)

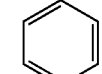

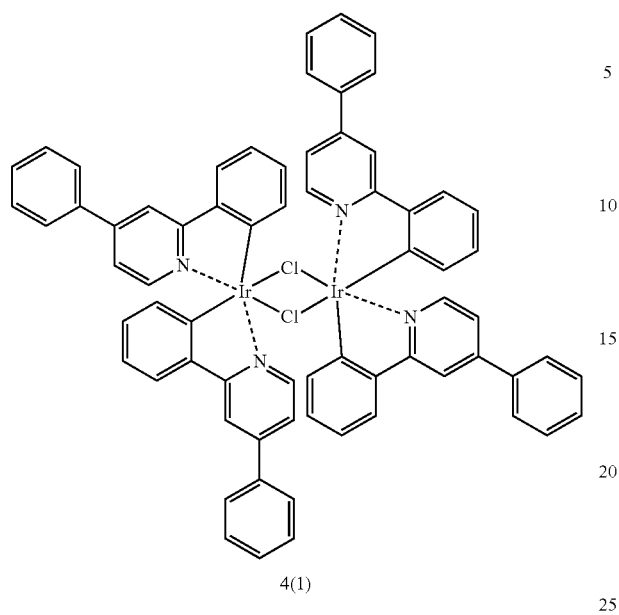
4(1)
Compound 4(1) was synthesized in the same manner as used to prepare Compound 1(1) of Synthesis Example 1, except that 2,4-diphenylpyridine was used instead of phenylpyridine.
Synthesis of Compound 4
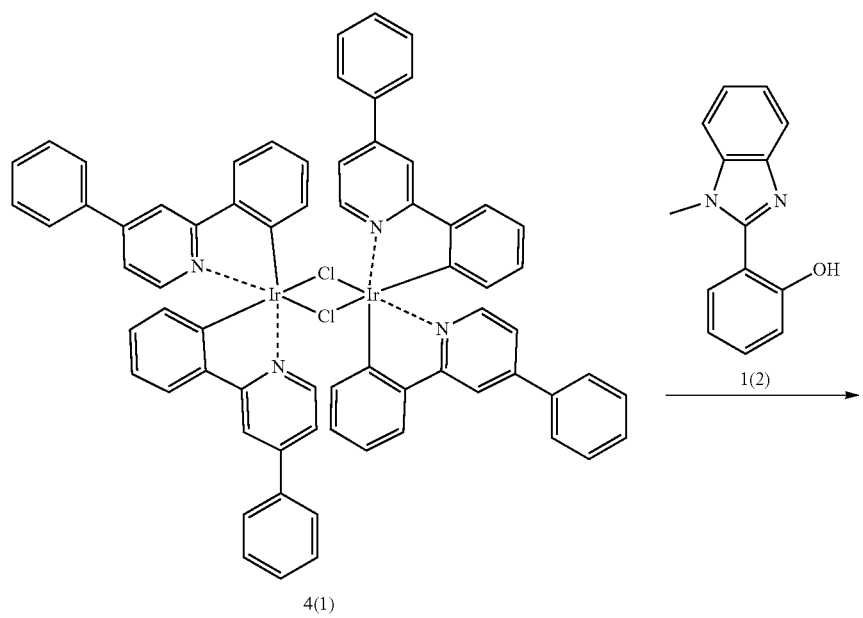
4(1)    1(2)

-continued

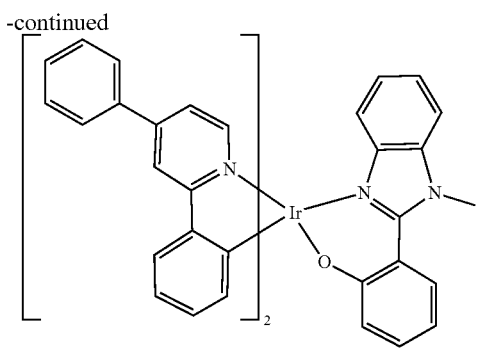

4

Compound 4 was obtained in the same manner as used to synthesize Compound 1 of Synthesis Example 1, except that Compound 4(1) was used instead of Compound 1(1).

Synthesis Example 5 (Synthesis of Compound 5)

Synthesis of Compound 5(1)

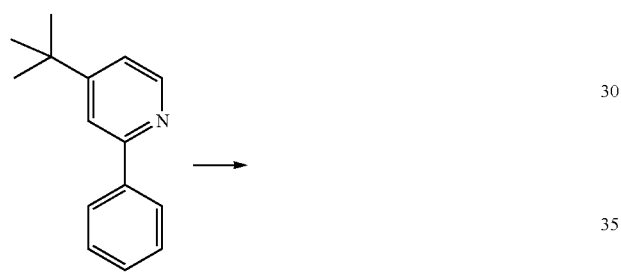

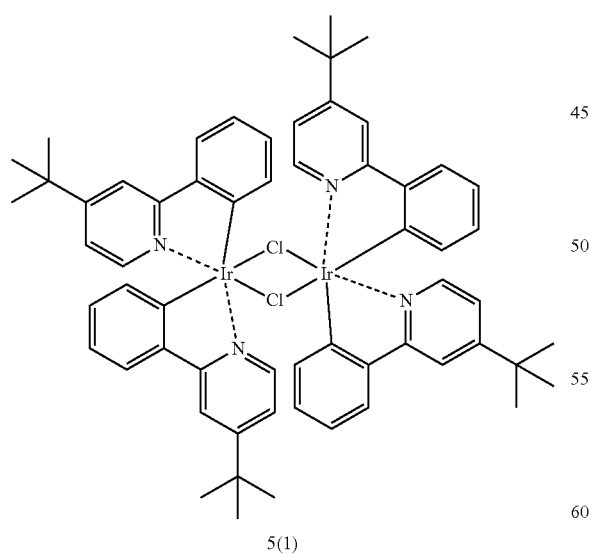

5(1)

Compound 5(1) was synthesized in the same manner as used to prepare Compound 1(1) of Synthesis Example 1, except that 4-tert-butyl-2-phenylpyridine was used instead of phenylpyridine.

Synthesis of Compound 5

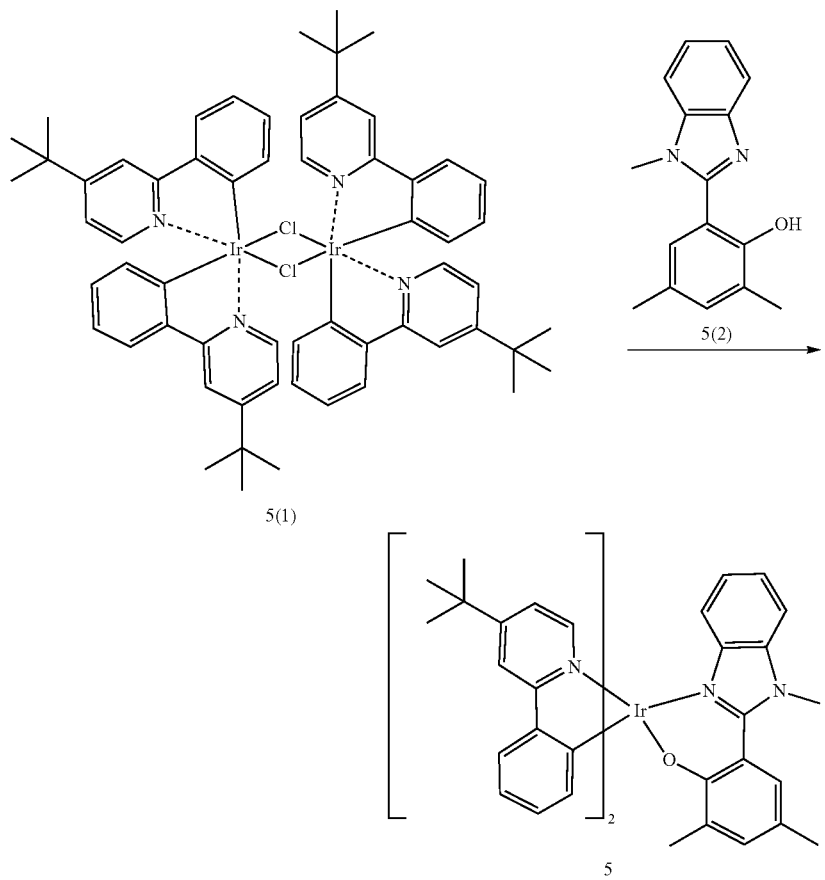

Compound 5 was synthesized in the same manner as used to synthesize Compound 1 of Synthesis Example 1, except that Compound 5(1) and Compound 5(2)(2,4-dimethyl-6-(1-methyl-1H-benzo[d]imidazol-2-yl)phenol) were used instead of Compound 1(1) and Compound 1(2), respectively.

Synthesis Example 6 (Synthesis of Compound 6)

Synthesis of Compound 6(1)

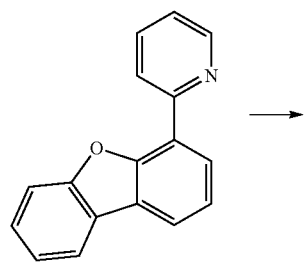

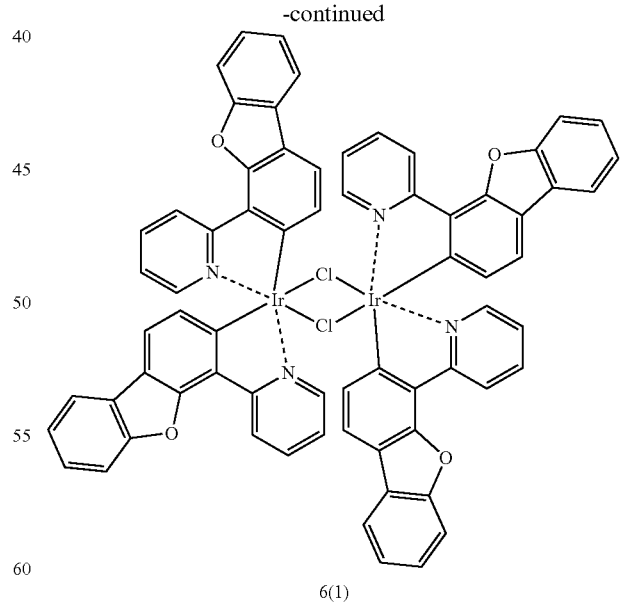

6(1)

Compound 6(1) was synthesized in the same manner as used to prepare Compound 1(1) of Synthesis Example 1, except that 2-(4-dibenzofuryl)pyridine was used instead of phenylpyridine.

Synthesis of Compound 6

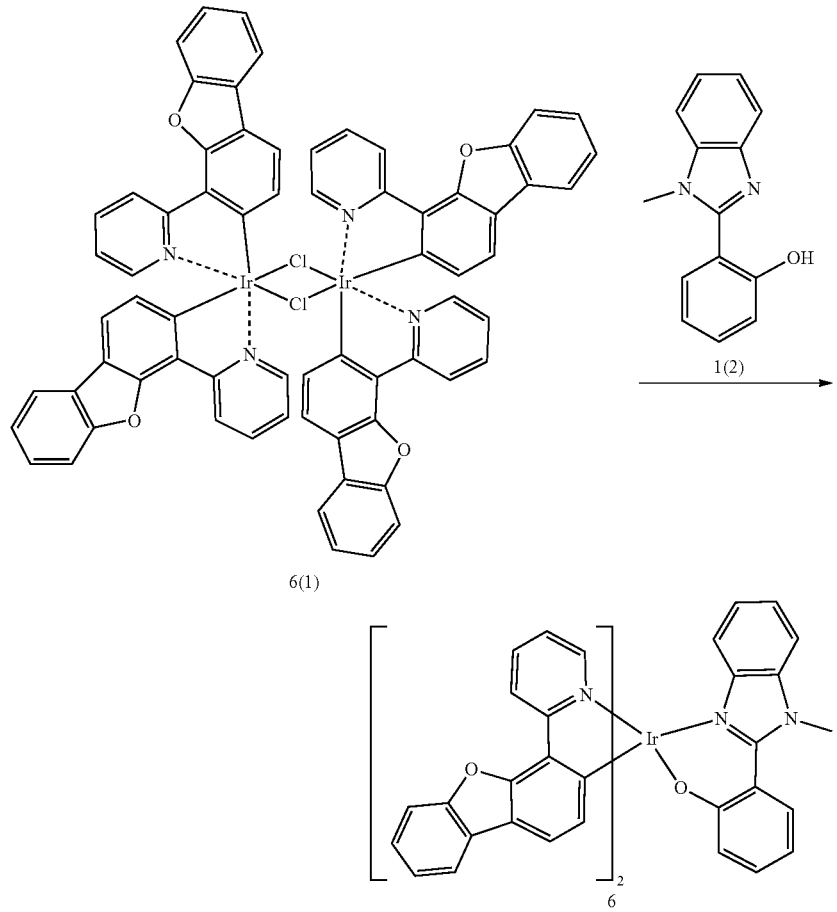

6(1)

6

Compound 6 was obtained in the same manner as used to synthesize Compound 1 of Synthesis Example 1, except that Compound 6(1) was used instead of Compound 1(1).

Synthesis Example 7 (Synthesis of Compound 7)

Synthesis of Compound 7(1)

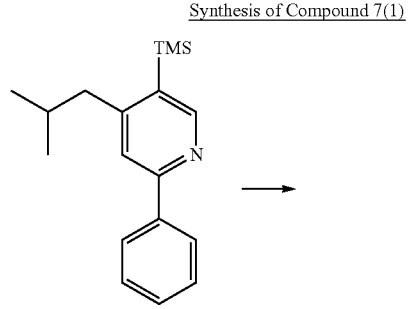

-continued

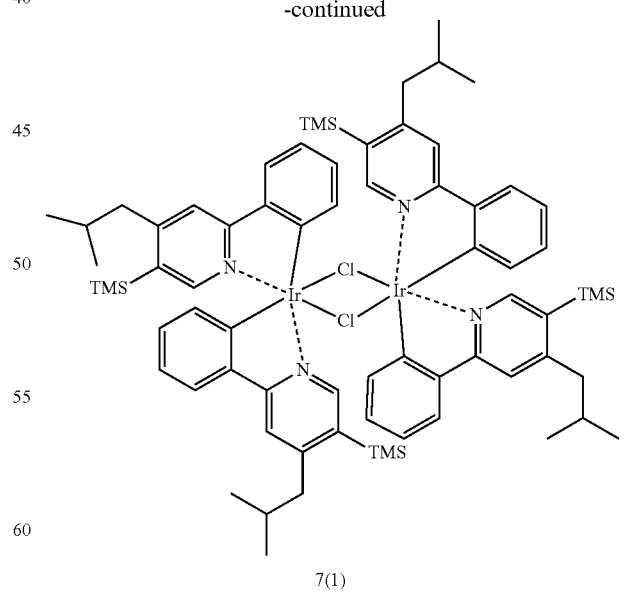

7(1)

Compound 7(1) was synthesized in the same manner as used to prepare Compound 1(1) of Synthesis Example 1, except that 4-isobutyl-5-(trimethylsilyl)-2-phenylpyridine was used instead of phenylpyridine.

Synthesis of Compound 7

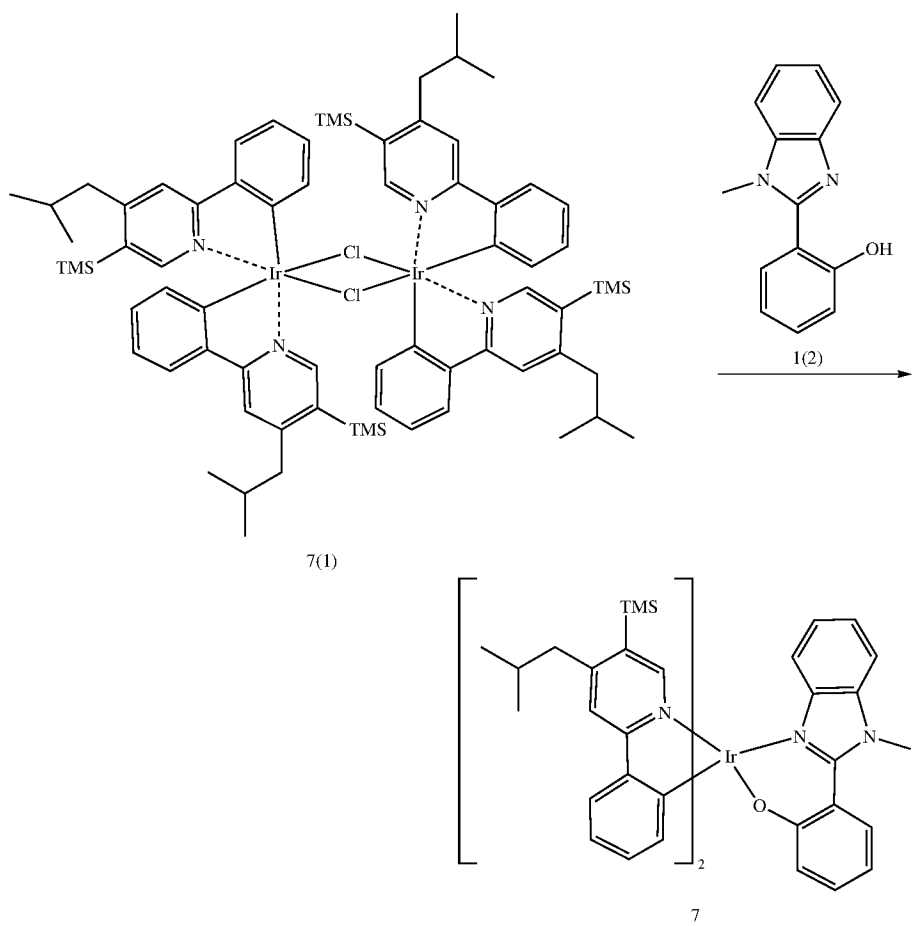

Compound 7 was obtained in the same manner as used to synthesize Compound 1 of Synthesis Example 1, except that Compound 7(1) was used instead of Compound 1(1).

Evaluation Example 1: Evaluation of Radiative Decay Rate

CBP and Compound 1 were co-deposited in a weight ratio of 9:1 at a vacuum pressure of $10^{-7}$ torr to form a 40 nm-thick film.

Regarding the film, by using FluoTime 300, which is a TRPL measurement system of PicoQuant Inc., and PLS340 (excitation wavelength=340 nanometers, spectral width=20 nanometers), which is the pumping source of PicoQuant Inc., the PL spectrum was evaluated at room temperature, and then, the wavelength of the main peak of the spectrum was determined, and the number of photons emitted from the film at the wavelength of the main peak by the photon pulse (pulse width=500 picoseconds) applied to the film by the PLS340 was measured repeatedly according to time based on time-correlated single photon counting (TCSPC), thereby producing a TRPL curve capable of sufficiently fitting. The obtained result was fitted with two or more exponential decay functions to obtain $T_{decay}$ (Ex), that is, decay time of the film. Then, the radiative decay rate, which is the reciprocal thereof, was calculated. Results thereof are shown in Table 2. A function for fitting is as shown in <Equation 10>, and from among $T_{decay}$ values obtained from each exponential decay function used for fitting, the largest $T_{decay}$ was obtained as $T_{decay}$ (Ex). In this regard, the same measurement was performed during the same measurement time as that for obtaining TRPL curve in the dark state (in which pumping signals entering a film are blocked) to obtain a baseline or a background signal curve for use as a baseline for fitting.

$$f(t) = \sum_{i=1}^{n} A_i \exp(-t/T_{decay,i}) \qquad \langle \text{Equation 10} \rangle$$

The radiative decay rate of each of Compounds 1 to 2 and A to E was measured repeatedly, and the results are shown in Table 2.

TABLE 2

| Compound No. | Radiative decay rate (s$^{-1}$) |
|---|---|
| 1 | 7.38 × 10$^5$ |
| 2 | 7.55 × 10$^5$ |
| A | 1.93 × 10$^5$ |
| B | 3.27 × 10$^5$ |
| C | 5.02 × 10$^5$ |

TABLE 2-continued

| Compound No. | Radiative decay rate (s$^{-1}$) |
|---|---|
| D | 5.12 × 10$^5$ |
| E | 6.01 × 10$^5$ |

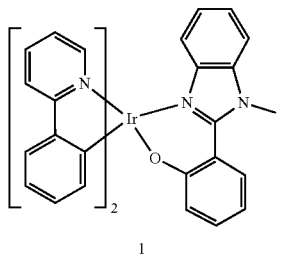

1

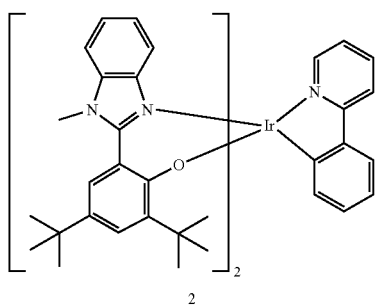

2

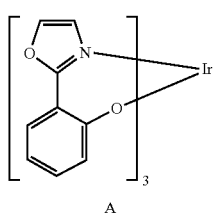

A

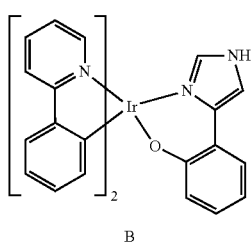

B

TABLE 2-continued

| Compound No. | Radiative decay rate (s$^{-1}$) |
|---|---|

C

D

E

From Table 2, it can be seen that Compounds 1 and 2 have a higher radiative decay rate than Compounds A to E.

Example 1

As an anode, a glass substrate with ITO/Ag/ITO deposited thereon to a thickness of 70/1000/70 Å was cut to a size of 50 mm×50 mm×0.5 mm, sonicated with isopropyl alcohol and pure water, each for 5 minutes, and then cleaned by exposure to ultraviolet rays and ozone for 30 minutes. Then the resultant glass substrate was loaded onto a vacuum deposition apparatus.

2-TNATA was vacuum-deposited on the anode to form a hole injection layer having a thickness of 600 Å, and 4,4'-bis[N-(1-naphthyl)-N-phenylamino] biphenyl (hereinafter referred to as NPB) was vacuum-deposited on the hole injection layer to form a hole transport layer having a thickness of 1350 Å.

Then, CBP (host) and Compound 1 (dopant) were co-deposited at a weight ratio of 98:2 on the hole transport layer to form an emission layer having a thickness of 400 Å.

Thereafter, BCP was vacuum-deposited on the emission layer to form a hole blocking layer having a thickness of 50 Å, Alq$_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing an organic light-emitting device.

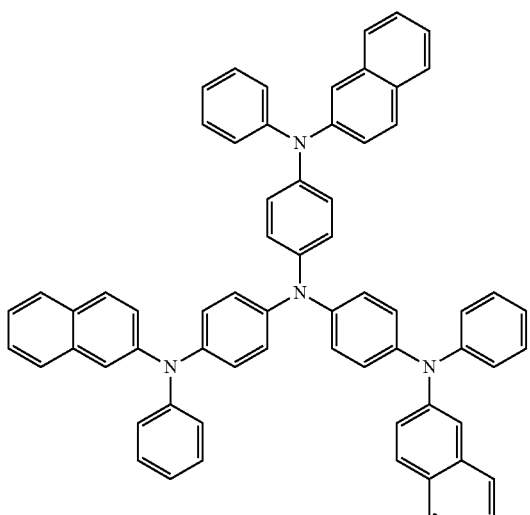

2-TNATA

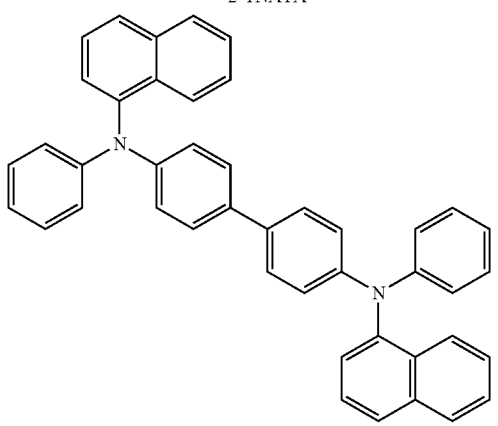

NPB

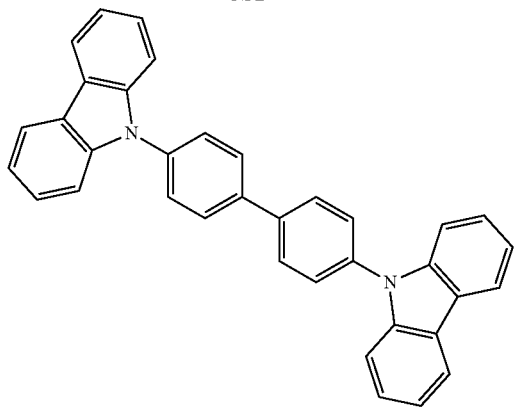

CBP

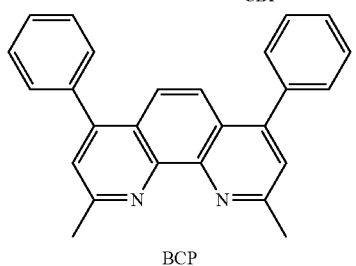

BCP

Examples 2 to 7 and Comparative Examples B to E

Organic light-emitting devices were manufactured in the same manner as in Example 1, except that compounds shown in Table 3 were each used instead of Compound 1 as a dopant in forming an emission layer.

Evaluation Example 2: Evaluation of Properties of Organic Light-Emitting Devices For each organic light-emitting device manufactured according to Examples 1 to 7 and Comparative Examples B to E, driving voltage, maximum value of external quantum efficiency (Max EQE), roll-off ratio (%), and maximum emission wavelength of a main peak of an EL spectrum, and the lifespan ($T_{97}$) were evaluated. The results are shown in Table 3. As evaluation apparatuses, a current-voltage meter (Keithley 2400) and a luminance meter (Minolta Cs-1000A) were used. The roll-off ratio was calculated according to Equation 20 below.

Roll off ratio={1−(efficiency (at 3,500 nit)/maximum emission efficiency)}×100%   <Equation 20>

TABLE 3

| | Dopant in emission layer | Driving voltage (V) | Max EQE (%) | Roll-off ratio (%) | Maximum emission wavelength (nm) |
|---|---|---|---|---|---|
| Example 1 | 1 | 4.12 | 102% | 9% | 533 |
| Example 2 | 2 | 4.24 | 105% | 10% | 540 |
| Example 3 | 3 | 4.26 | 105% | 10% | 541 |
| Example 4 | 4 | 4.35 | 123% | 10% | 561 |
| Example 5 | 5 | 4.15 | 110% | 9% | 539 |
| Example 6 | 6 | 4.13 | 120% | 11% | 541 |
| Example 7 | 7 | 4.03 | 135% | 10% | 537 |
| Comparative Example B | B | 5.12 | 67% | 13% | 524 |
| Comparative Example C | C | 4.37 | 74% | 12% | 590 |
| Comparative Example D | D | 4.30 | 68% | 15% | 617 |
| Comparative Example E | E | 4.52 | 72% | 16% | 562 |

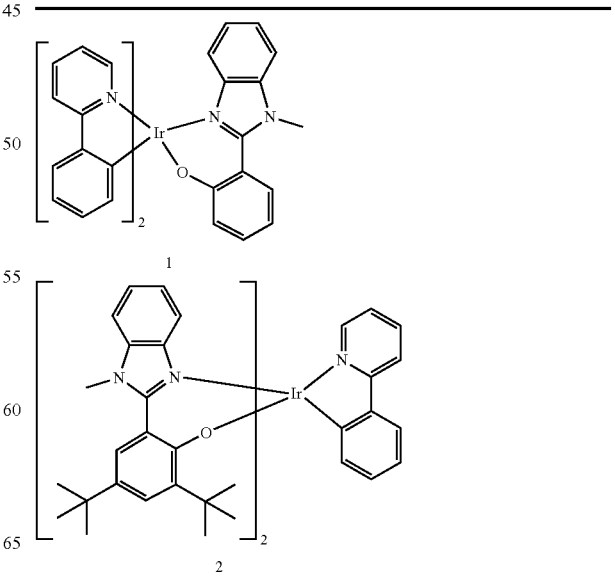

TABLE 3-continued

| Dopant in emission layer | Driving voltage (V) | Max EQE (%) | Roll-off ratio (%) | Maximum emission wavelength (nm) |
|---|---|---|---|---|

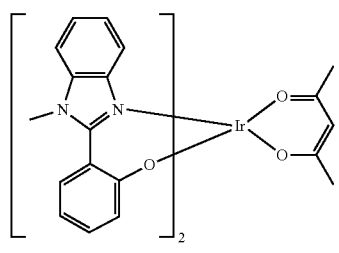

3

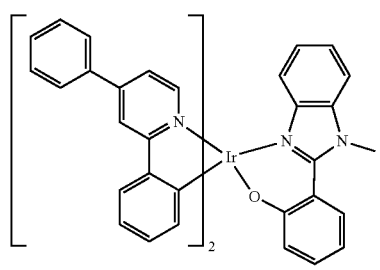

4

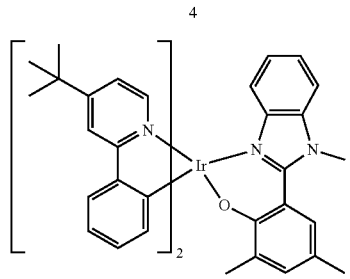

5

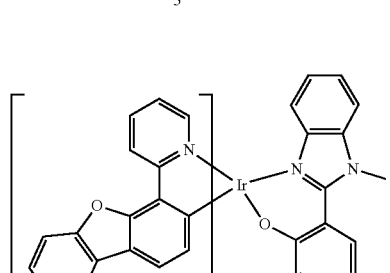

6

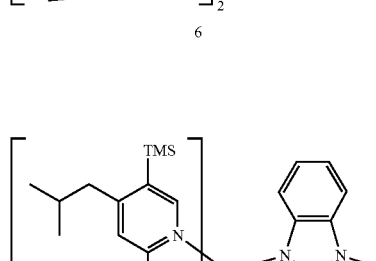

7

TABLE 3-continued

| Dopant in emission layer | Driving voltage (V) | Max EQE (%) | Roll-off ratio (%) | Maximum emission wavelength (nm) |
|---|---|---|---|---|

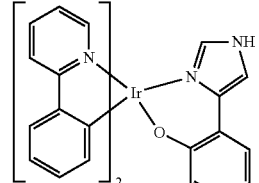

B

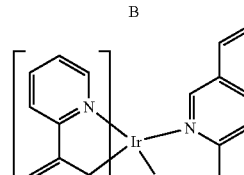

C

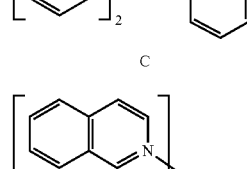

D

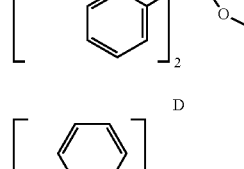

E

From Table 3, it can be seen that the organic light-emitting device of Example 1 to 7 emits green light, and has improved driving voltage, improved external quantum efficiency and improved roll-off ratio compared to the organic light-emitting device of Comparative Example B to E.

Since the organometallic compounds have excellent electrical characteristics and/or radiative decay rates, an electronic device using the organometallic compounds, for example, organic light-emitting device using the organometallic compounds has excellent characteristics in terms of driving voltage, external quantum efficiency (EQE), and the roll-off ratio. Therefore, the use of the organometallic compounds may enable the embodiment of a high-quality organic light-emitting device and an electron device including the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound which is represented by Formula 1 and capable of emitting phosphorescent light:

$$M(L_1)_{n1}(L_2)_{n2} \quad \text{<Formula 1>}$$

wherein, in Formula 1,

M is Ir, os, or Pt, $L_1$ is a ligand represented by Formula 2A or 2B, n1 is 1 or 2, wherein, when n1 is 2, the two $L_1$(s) are identical to or different from each other, $L_2$ is a monodentate ligand, a bidentate ligand, a tridentate ligand, or a tetradentate ligand, n2 is 1 or 2, wherein, when n2 is 2, the two $L_2$(s) are identical to or different from each other, and $L_1$ and $L_2$ are different from each other, wherein, when M is Ir or Os, the sum of n1 and n2 is 3 or 4, and when M is Pt, the sum of n1 and n2 is 2 or 3,

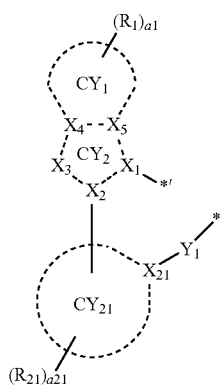

<Formula 2A>

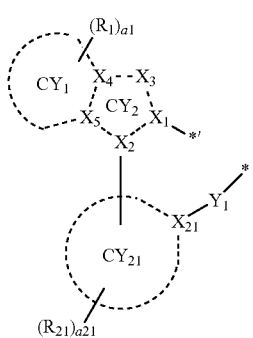

<Formula 2B> wherein, in Formulae 2A and 2B, $Y_1$ is O, S, N($R_a$), C($R_a$)($R_b$), or Si($R_a$)($R_b$), $X_1$, $X_4$, $X_5$, and $X_{21}$ are each independently C or N, $X_2$ is C, $X_3$ is O, S, Se, B($R_2$), N($R_2$), P($R_2$), C($R_2$)($R_3$), Si($R_2$)($R_3$), Ge($R_2$)($R_3$), N, C($R_2$), or Si($R_2$), provided that:

(I) when $L_1$ is a ligand represented by Formula 2A, $X_2$, $X_4$, and $X_5$ are each C, $X_{21}$ is C, $CY_1$ is a benzene group, $CY_{21}$ is a benzene group, and $X_3$ is O, or S, then n1 is 2, and (II) when $L_1$ is a ligand represented by Formula 2A, $X_2$, $X_4$, and $X_5$ are each C, $X_{21}$ is C, $CY_1$ is a benzene group, $CY_{21}$ is a benzene group or a pyridine group, and $X_3$ is N($R_2$), then (i) n1 is 2 or (ii) $R_2$ is a substituted or unsubstituted $C_2$-$C_{60}$ alkyl group, a substituted or unsubstituted $C_3$-$C_{10}$ cycloalkyl group, a substituted or unsubstituted $C_6$-$C_{60}$ aryl group, or a substituted or unsubstituted $C_1$-$C_{60}$ heteroaryl group, or (iii) any combination thereof, ring $CY_1$ and ring $CY_{21}$ are each independently a $C_5$-$C_{30}$ carbocyclic group or a $C_1$-$C_{30}$ heterocyclic group, ring $CY_2$ is a 5-membered ring, $R_a$, $R_b$, $R_1$ to $R_3$, and $R_{21}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$alkoxy group, a substituted or unsubstituted $C_1$-$C_{60}$alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), a1 and a21 are each independently an integer from 0 to 20, two or more of a plurality of $R_1$(s) are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_{21}$(s) are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_a$, $R_b$, $R_1$ to $R_3$, and $R_{21}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_{21}$,

* and *' each indicate a binding site to M in Formula 1, and at least one substituent of each of the substituted $C_1$-$C_{60}$ alkyl group, the substituted $C_2$-$C_{60}$alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof;

a $C_1$-$C_{60}$ alkyl group, a $C_2$-$C_{60}$alkenyl group, a $C_2$-$C_{60}$ alkynyl group, a $C_1$-$C_{60}$ alkoxy group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si(($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), —P($Q_{38}$)($Q_{39}$), or any combination thereof; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein a bond between $X_1$ of Formulae 2A and 2B and M of Formula 1 is a coordination bond, and a bond between $Y_1$ of Formulae 2A and 2B and M of Formula 1 is a covalent bond.

3. The organometallic compound of claim 1, wherein ring $CY_1$ and ring $CY_{21}$ are each independently a cyclopentene group, a cyclohexene group, a benzene group, a naphthalene group, an anthracene group, a phenanthrene group, a triphenylene group, a pyrene group, a chrysene group, cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a group.

4. The organometallic compound of claim 1, wherein $R_a$, $R_b$, $R_1$ to $R_3$, and $R_{21}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(═O)(Q$_8$)(Q$_9$), or —P(Q$_8$)(Q$_9$), wherein Q$_1$ to Q$_9$ are each independently:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a C$_1$-C$_{10}$ alkyl group, a phenyl group, or any combination thereof.

5. The organometallic compound of claim 1, wherein a group represented by

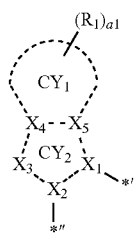

of Formula 2A is represented by one of Formulae 2A-1 to 2A-3, a group represented by

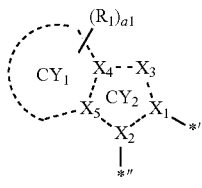

in Formula 2B is represented by one of Formulae 2B-1 to 2B-3:

2A-1

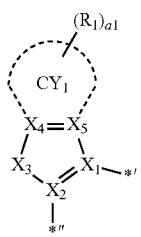

2A-2

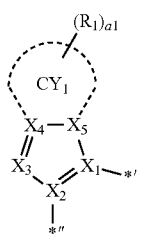

2A-3

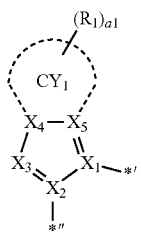

2B-1

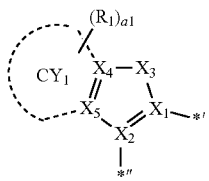

2B-2

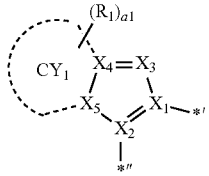

2B-3

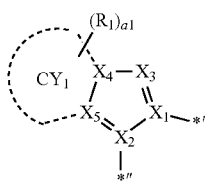

wherein, in Formulae 2A-1 to 2A-3 and 2B-1 to 2B-3, $X_1$ is N, $X_2$ is C, ring $CY_1$, $R_1$, and a1 are the same as in claim 1, *' is a binding site to M of Formula 1, and *''' is a binding site to ring $CY_{21}$ in Formulae 2A and 2B, in Formulae 2A-1 and 2B-1, $X_3$ is O, S, Se, $B(R_2)$, $N(R_2)$, $P(R_2)$, $C(R_2)(R_3)$, $Si(R_2)(R_3)$, or $Ge(R_2)(R_3)$, and $X_4$ and $X_5$ are each C, in Formulae 2A-2 and 2B-2, $X_3$ is N, $C(R_2)$, or $Si(R_2)$, $X_4$ is C, and $X_5$ is C or N, and in Formulae 2A-3 and 2B-3, $X_3$ is N, $C(R_2)$ or $Si(R_2)$, $X_4$ is C or N, and $X_5$ is C.

6. The organometallic compound of claim 1, wherein a group represented by

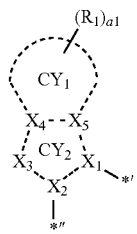

in Formula 2A is represented by one of Formulae 2A(1) to 2A(7), a group represented by

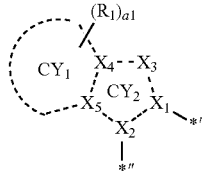

in Formula 2B is represented by one of Formulae 2B(1) to 2B(7):

2A(1)

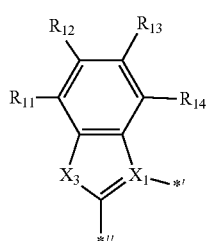

2A(2)

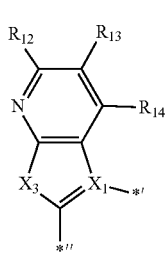

2A(3) 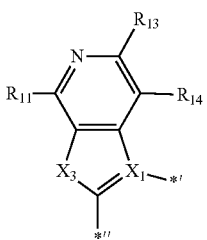

2A(4) 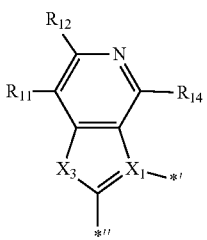

2A(5) 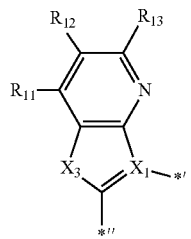

2A(6) 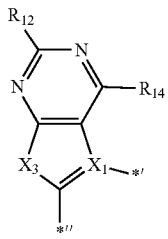

2A(7) 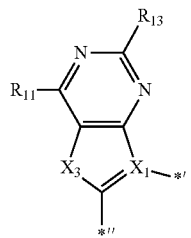

2B(1) 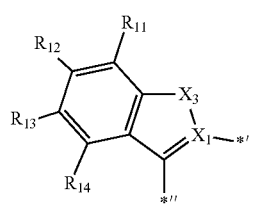

2B(2) 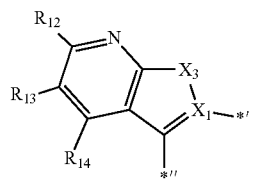

2B(3) 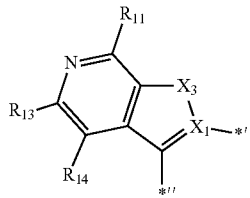

2B(4) 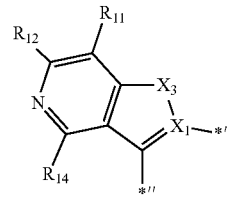

2B(5) 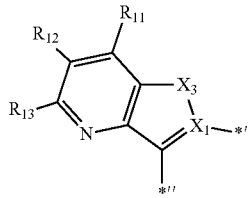

2B(6) 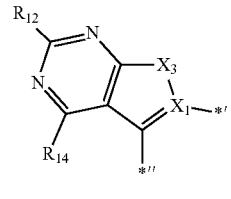

2B(7) 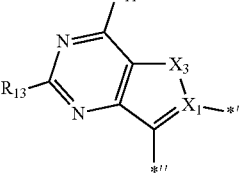

wherein, in Formulae 2A(1) to 2A(7) and 2B(1) to 2B(7),
$X_1$ is N,
*' indicates a binding site to M of Formula 1,
*'' is a binding site to ring $CY_{21}$ in Formulae 2A and 2B,
$X_3$ is O, S, Se, $B(R_2)$, $N(R_2)$, $P(R_2)$, $C(R_2)(R_3)$, $Si(R_2)(R_3)$, or $Ge(R_2)(R_3)$, and
$R_{11}$ to $R_{14}$ are the same as described in connection with $R_1$ in claim 1, and $R_2$ and $R_3$ are the same as described in claim 1.

7. The organometallic compound of claim 1, wherein a group represented by

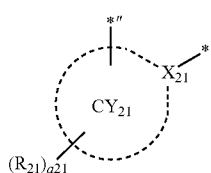

in Formulae 2A and 2B is a group represented by one of Formulae CY21-1 to CY21-25:

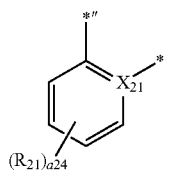 CY21-1
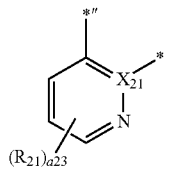 CY21-2
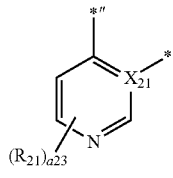 CY21-3
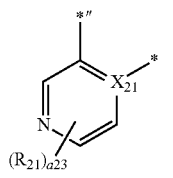 CY21-4
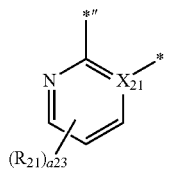 CY21-5
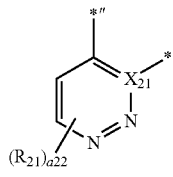 CY21-6
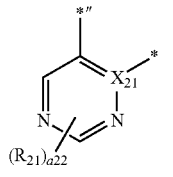 CY21-7
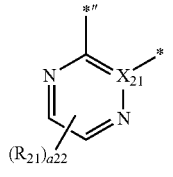 CY21-8
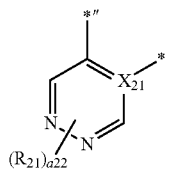 CY21-9
-continued
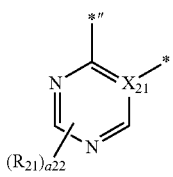 CY21-10
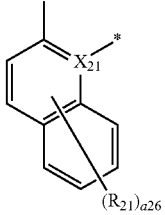 CY21-11
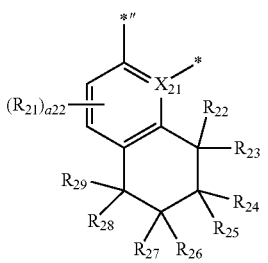 CY21-12
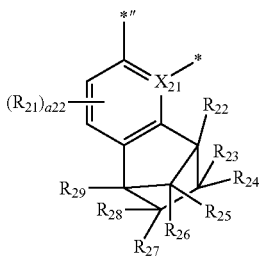 CY21-13
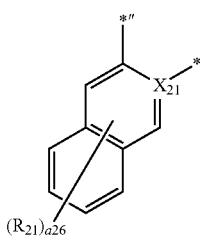 CY21-14
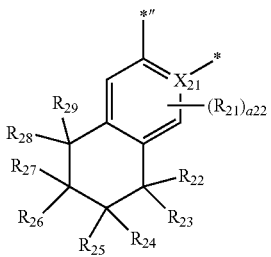 CY21-15

CY21-16 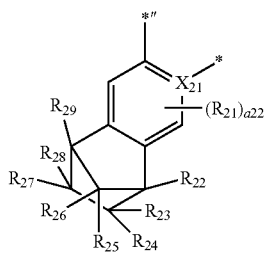

CY21-17 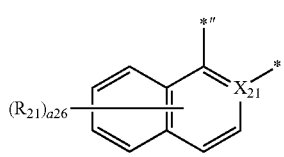

CY21-18 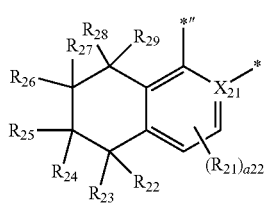

CY21-19 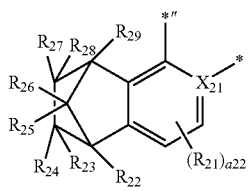

CY21-20 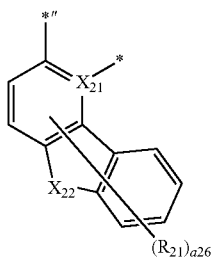

CY21-21 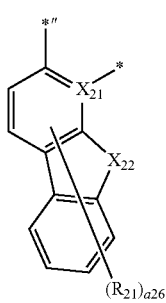

CY21-22 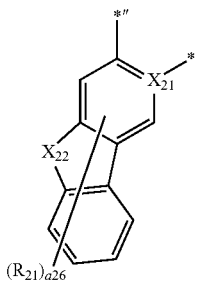

CY21-23 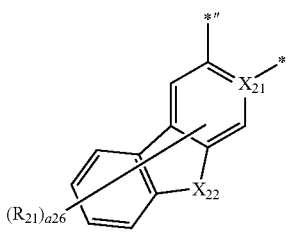

CY21-24 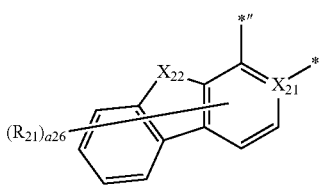

CY21-25 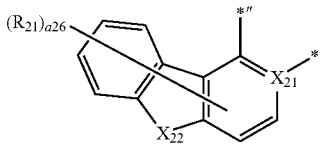

wherein, in Formulae CY21-1 to CY21-25, $X_{21}$ and $R_{21}$ are the same as described in claim 1, $X_{22}$ is $C(R_{22})(R_{23})$, $N(R_{22})$, O, S, or $Si(R_{22})(R_{23})$, $R_{22}$ to $R_{29}$ are the same as described in connection with $R_{21}$ in claim 1, a26 is an integer from 0 to 6, a24 is an integer from 0 to 4, a23 is an integer from 0 to 3, a22 is an integer from 0 to 2,

*″ is a binding site to $X_2$ in Formulae 2A and 2B, and

* is a binding site to $Y_1$ in Formula 1.

8. The organometallic compound of claim 7, wherein a group represented by

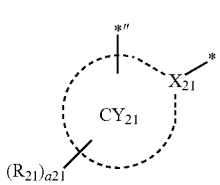

in Formulae 2A and 2B is a group represented by one of Formulae CY21(1) to CY21(56) or a group represented by one of Formulae CY21-20 to CY21-25:

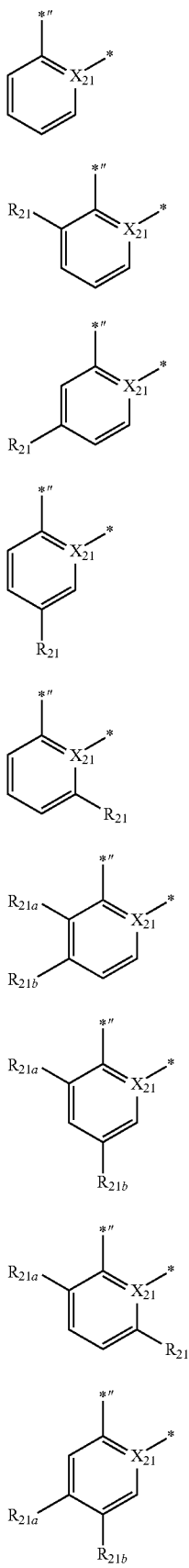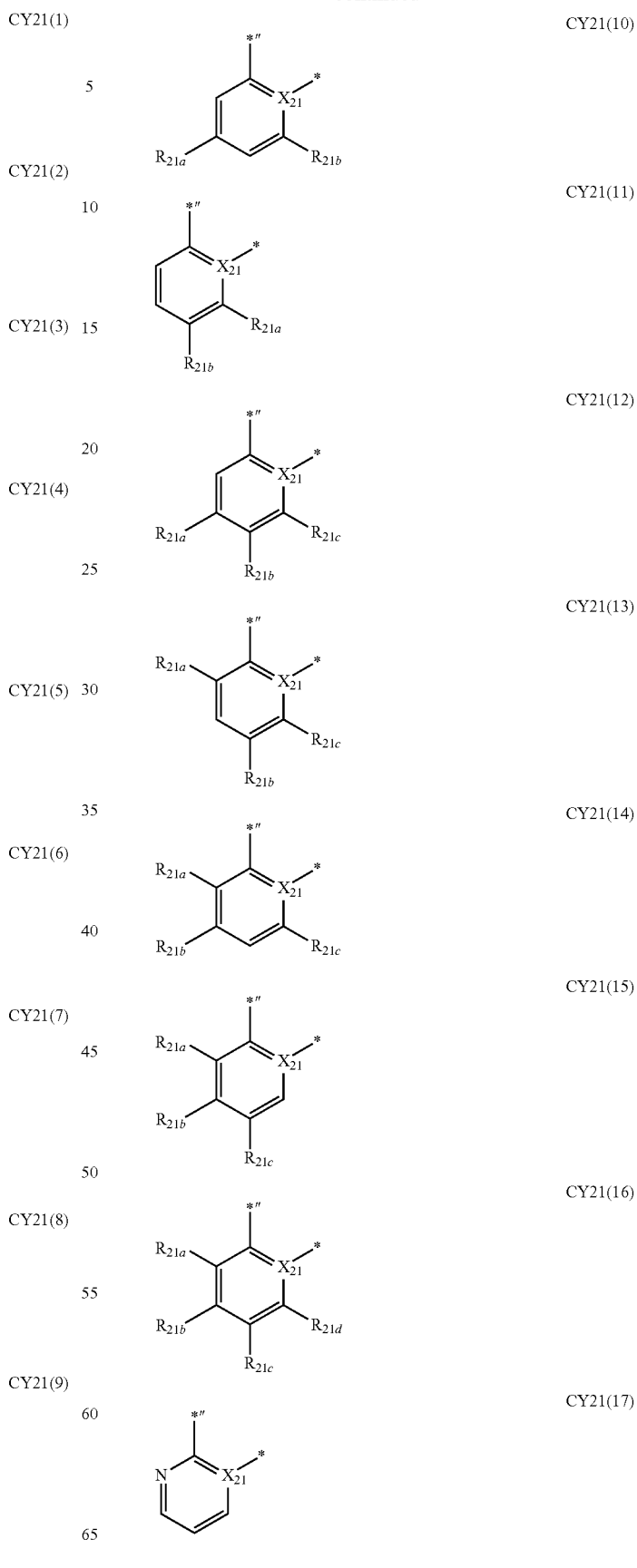

-continued
CY21(18)
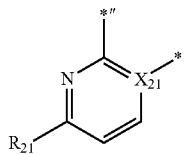
CY21(19)
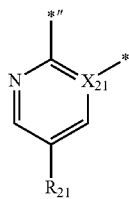
CY21(20)
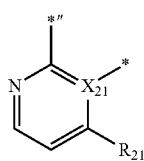
CY21(21)
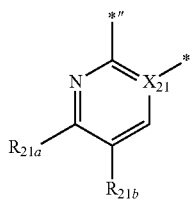
CY21(22)
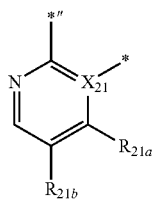
CY21(23)
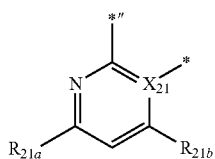
CY21(24)
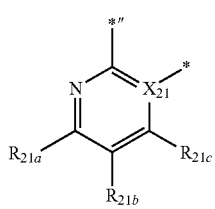
CY21(25)
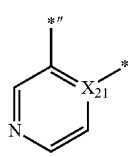
-continued
CY21(26)
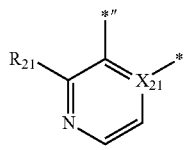
CY21(27)
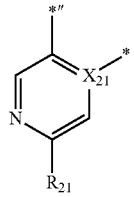
CY21(28)
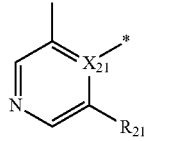
CY21(29)
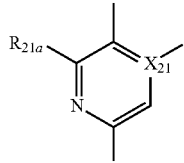
CY21(30)
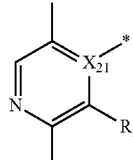
CY21(31)
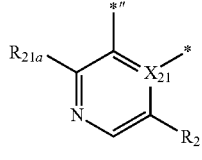
CY21(32)
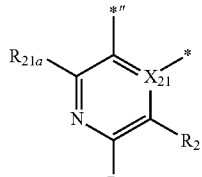
CY21(33)
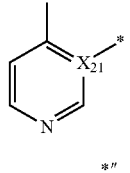
CY21(34)
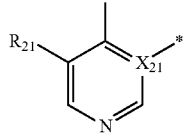

-continued
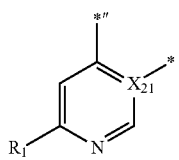
CY21(35)
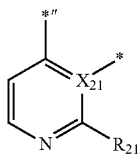
CY21(36)
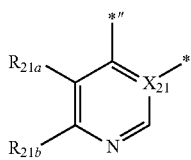
CY21(37)
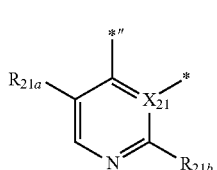
CY21(38)
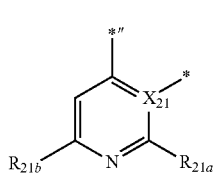
CY21(39)
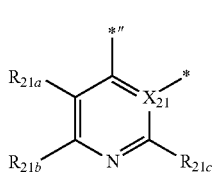
CY21(40)
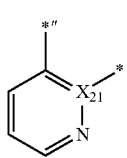
CY21(41)
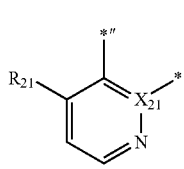
CY21(42)
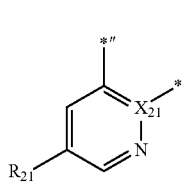
CY21(43)
-continued
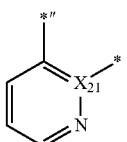
CY21(44)
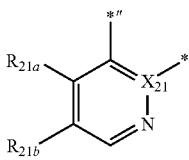
CY21(45)
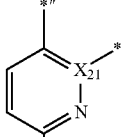
CY21(46)
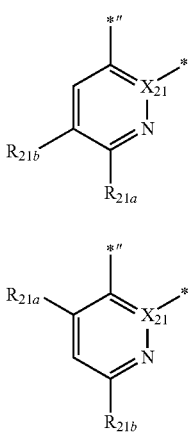
CY21(47)
CY21(48)
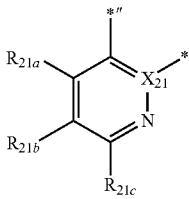
CY21(49)
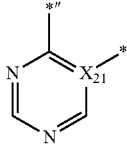
CY21(50)
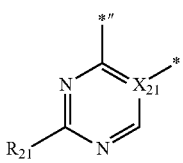
CY21(51)
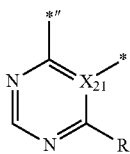

-continued

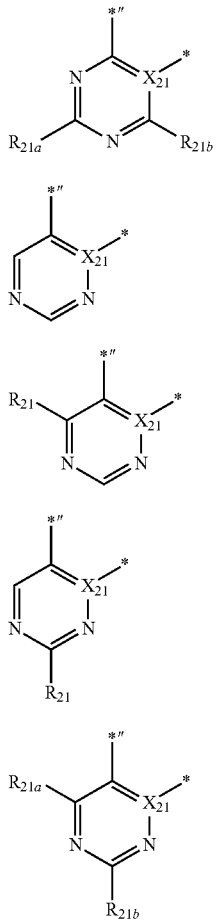

CY21(52)

CY21(53)

CY21(54)

CY21(55)

CY21(56)

wherein, in Formulae CY21(1) to CY21(56),
$X_{21}$ and $R_{21}$ are the same as described in claim 1,
$R_{21a}$ to $R_{21d}$ are the same as described in connection with $R_{21}$ described in claim 1, and each of $R_{21}$ and $R_{21a}$ to $R_{21d}$ is not hydrogen,
*''' is a binding site to $X_2$ in Formulae 2A and 2B, and
* is a binding site to $Y_1$ in Formula 1.

9. The organometallic compound of claim 1, wherein $L_2$ in Formula 1 is a bidentate ligand represented by Formula 3:

<Formula 3>

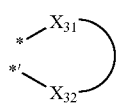

wherein, in Formula 3, $X_{31}$ and $X_{32}$ are each O; or $X_{31}$ is N and $X_{32}$ is C,

indicates a group that connects $X_{31}$ and $X_{32}$ to each other, and
* and *' each indicate a binding site to M in Formula 1.

10. The organometallic compound of claim 1, wherein $L_2$ in Formula 1 is a group represented by one of Formulae 3A to 3F:

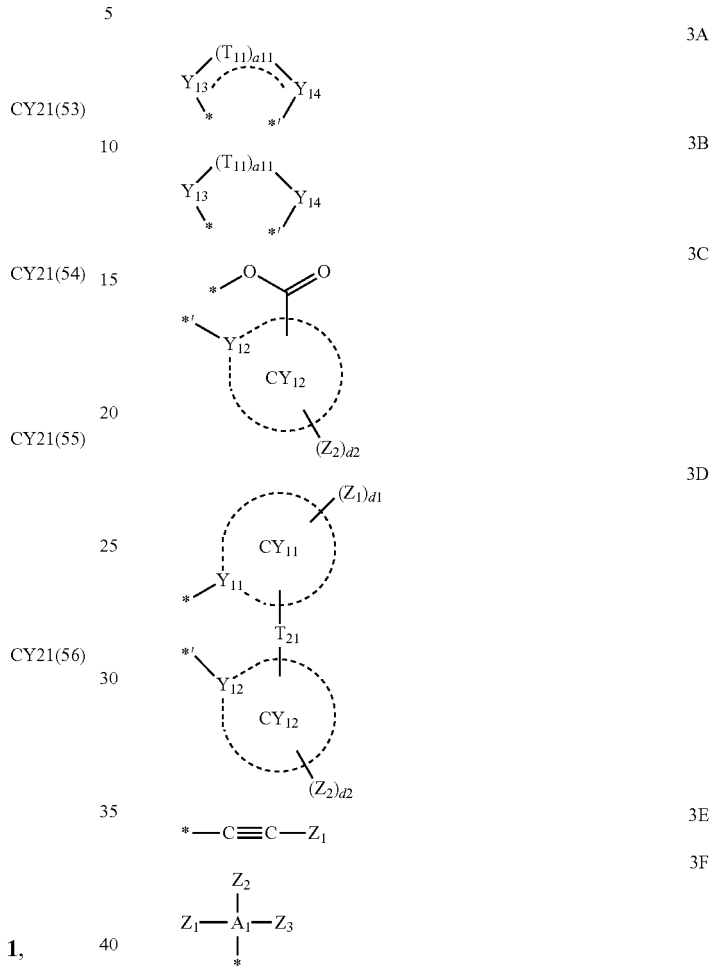

3A

3B

3C

3D

3E

*—C≡C—$Z_1$

3F $Z_1$—$A_1$—$Z_3$ with $Z_2$ above and * below wherein, in Formulae 3A to 3F,
$Y_{13}$ is O, N, N($Z_1$), P($Z_1$)($Z_2$), or AS($Z_1$)($Z_2$),
$Y_{14}$ is O, N, N($Z_3$), P($Z_3$)($Z_4$), or As($Z_3$)($Z_4$),
$T_{11}$ is a single bond, a double bond, *—C($Z_{11}$)($Z_{12}$)—*', *—C($Z_{11}$)=C($Z_{12}$)—*', *=C($Z_{11}$)—*', *—C($Z_{11}$)=*', *=C($Z_{11}$)—C($Z_{12}$)=C($Z_{13}$)—*', *—C($Z_{11}$)=C($Z_{12}$)—C($Z_{13}$)=*', *—N($Z_{11}$)—*', or a $C_5$-$C_{30}$ carbocyclic group which is unsubstituted or substituted with at least one $Z_{11}$,
a11 is an integer from 1 to 10, and when a11 is 2 or more, two or more of $T_{11}$(s) are identical to or different from each other,
$Y_{11}$ and $Y_{12}$ are each independently C or N,
$T_{21}$ is a single bond, a double bond, O, S, C($Z_{11}$)($Z_{12}$), Si($Z_{11}$)($Z_{12}$), or N($Z_{11}$),
ring $CY_{11}$ and ring $CY_{12}$ are each independently a $C_5$-$C_{30}$ carbocyclic group or a $C_1$-$C_{30}$ heterocyclic group,
$A_1$ is P or As,
$Z_1$ to $Z_4$ and $Z_{11}$ to $Z_{13}$ are the same as described in connection with $R_{21}$,
d1 and d2 are each independently an integer from 0 to 20, and
* and *' each indicate a binding site to M in Formula 1.

11. The organometallic compound of claim 10, wherein $L_2$ in Formula 1 is a ligand represented by Formula 3D, a group represented by
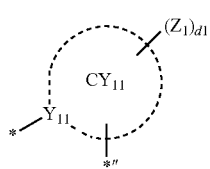
in Formula 3D is a group represented by one of Formulae CY11-1 to CY11-34, and
a group represented by
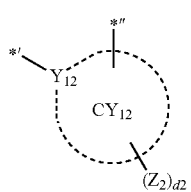
in Formula 3D is a group represented by one of Formulae CY12-1 to CY12-34:
CY11-1
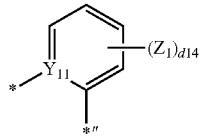
CY11-2
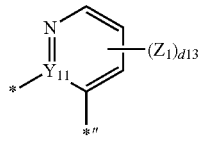
CY11-3
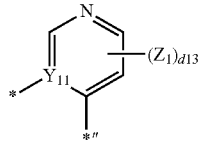
CY11-4
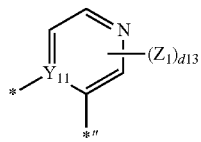
CY11-5
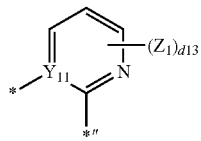
CY11-6
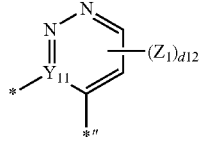
CY11-7
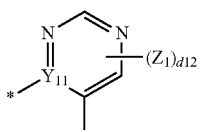
CY11-8
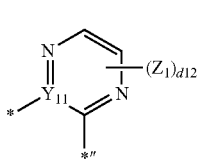
CY11-9
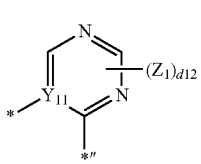
CY11-10
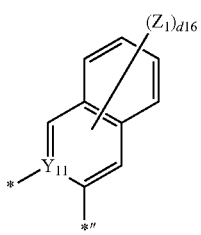
CY11-11
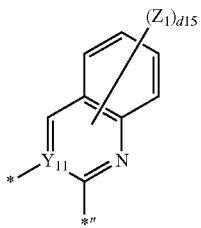
CY11-12
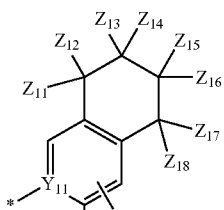
CY11-13
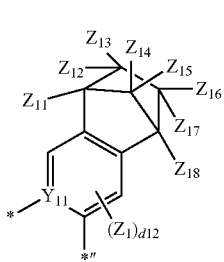
CY11-14

-continued
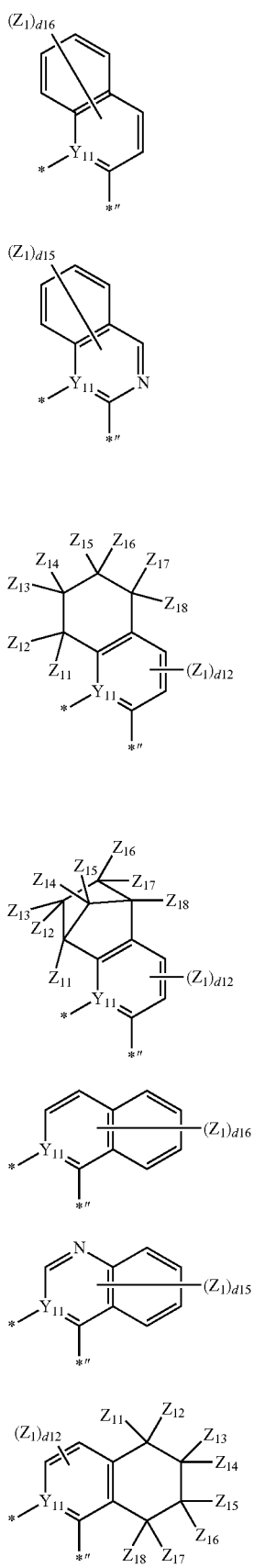
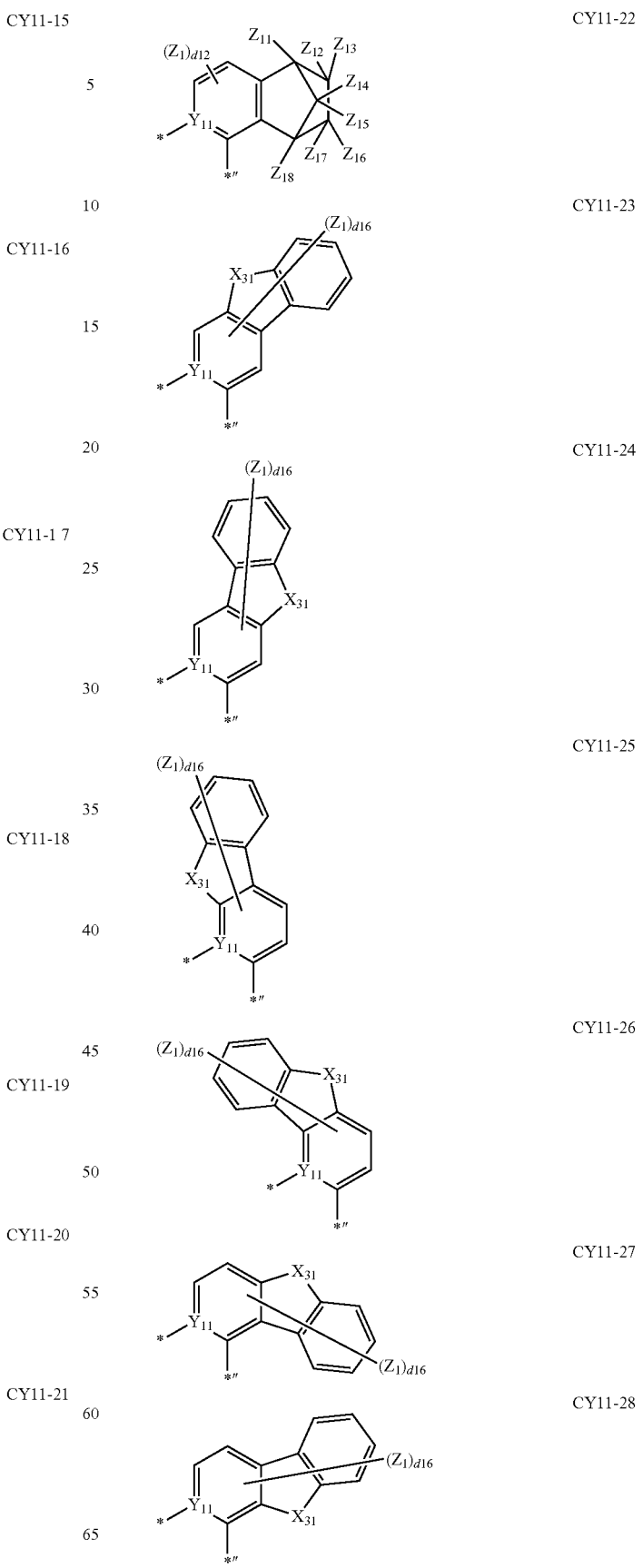

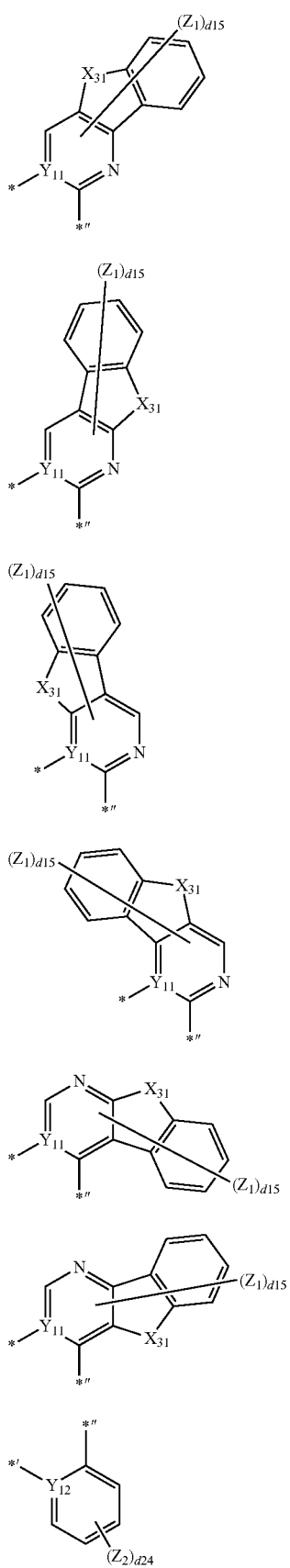
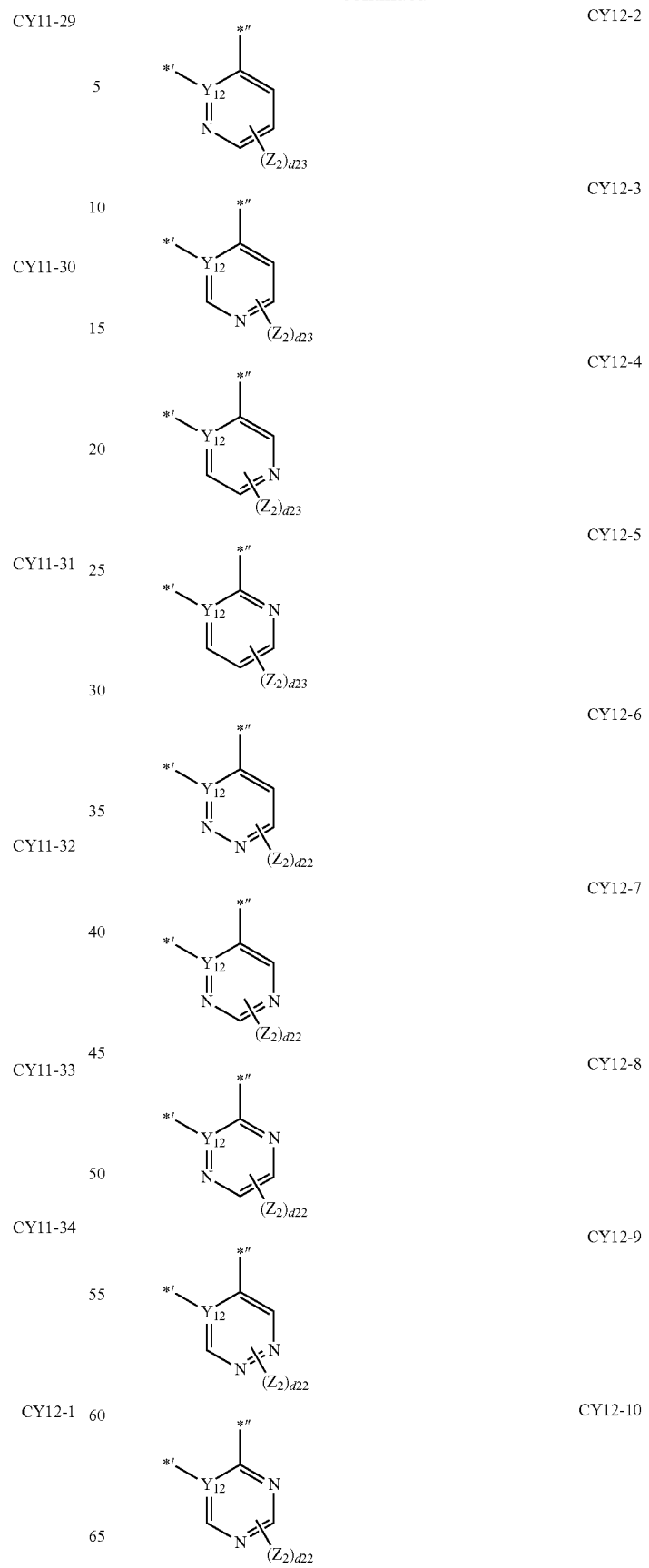

-continued
CY12-11
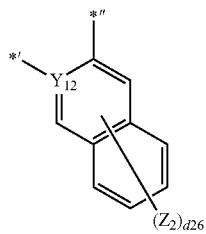
CY12-12
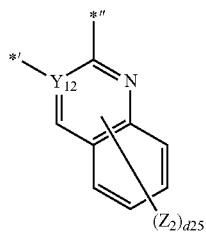
CY12-13
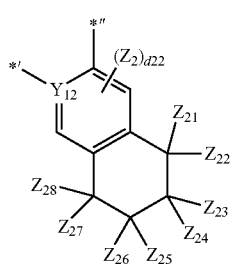
CY12-14
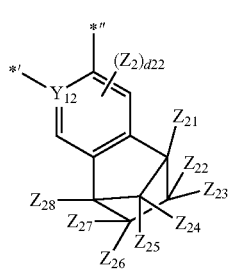
CY12-15
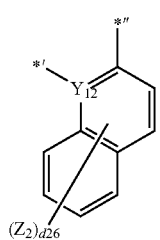
CY12-16
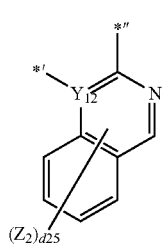
-continued
CY12-17
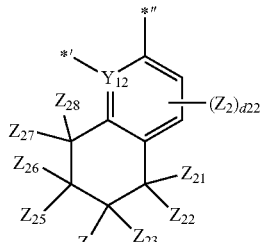
CY12-18
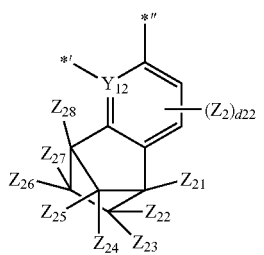
CY12-19
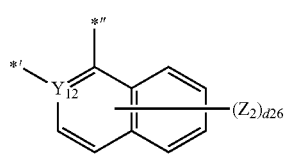
CY12-20
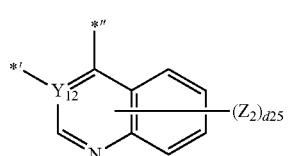
CY12-21
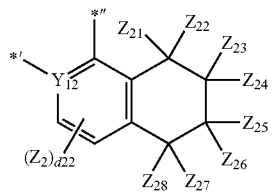
CY12-22
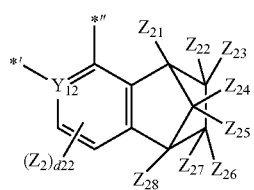
CY12-23
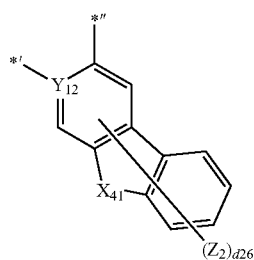

-continued

CY12-24
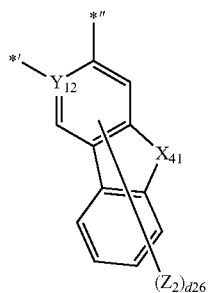

CY12-25
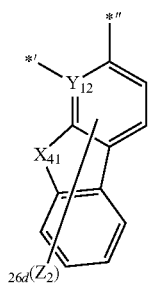

CY12-26
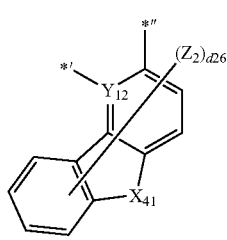

CY12-27
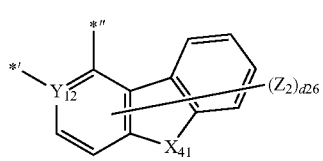

CY12-28
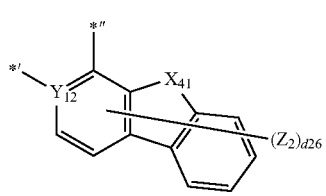

CY12-29
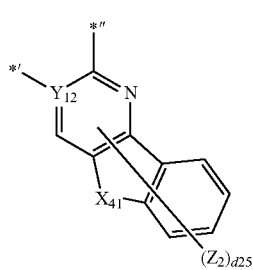

-continued

CY12-30
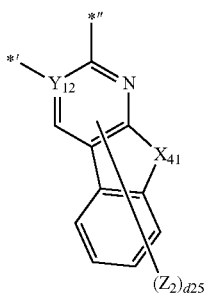

CY12-31
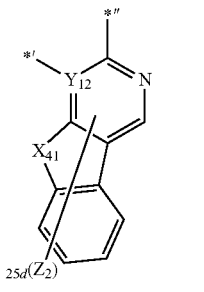

CY12-32
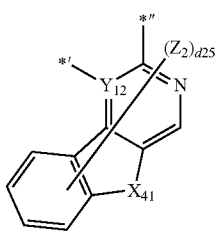

CY12-33
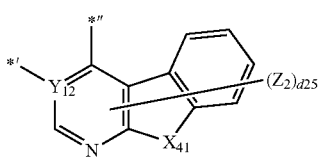

CY12-34
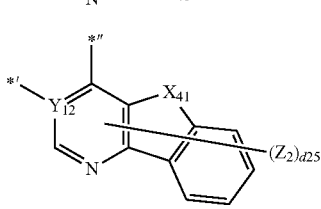

wherein, in Formulae CY11-1 to CY11-34 and CY12-1 to CY12-34, $X_{31}$ is O, S, $N(Z_{11})$, $C(Z_{11})(Z_{12})$, or $Si(Z_{11})(Z_{12})$, $X_{41}$ is O, S, $N(Z_{21})$, $C(Z_{21})(Z_{22})$, or $Si(Z_{21})(Z_{22})$, $Y_{11}$, $Y_{12}$, $Z_1$, and $Z_2$ are the same as described in claim 10, $Z_{11}$ to $Z_{18}$ and $Z_{21}$ to $Z_{28}$ are the same as described in connection with $R_{21}$ in claim 1, d12 and d22 are each independently an integer from 0 to 2, d13 and d23 are each independently an integer from 0 to 3, d14 and d24 are each independently an integer from 0 to 4, d15 and d25 are each independently an integer from 0 to 5, d16 and d26 are each independently an integer from 0 to 6, and in Formulae CY11-1 to CY11-34 and CY12-1 to CY12-34, * and *' are each a binding site to M in Formula 1, and *''' is a binding site to $T_{21}$ in Formula 3D.
12. The organometallic compound of claim 1, wherein $L_2$ in Formula 1 is represented by one of Formulae 3-1(1) to 3-1(66) and 3-1(301) to 3-1(309):
3-1(1)
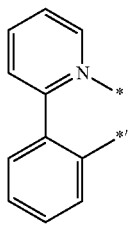
3-1(2)
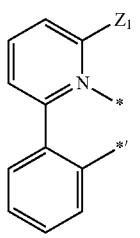
3-1(3)
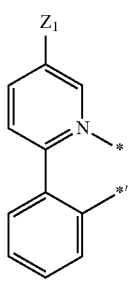
3-1(4)
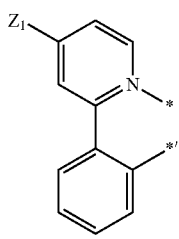
3-1(5)
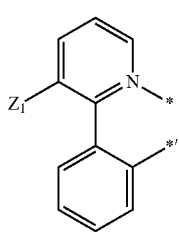
3-1(6)
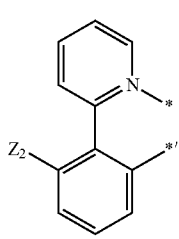
-continued
3-1(7)
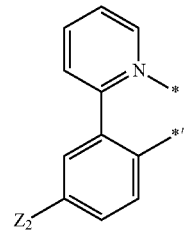
3-1(8)
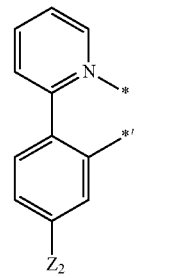
3-1(9)
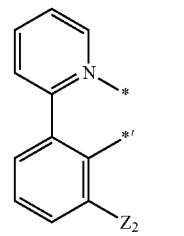
3-1(10)
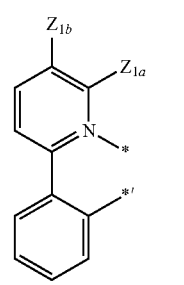
3-1(11)
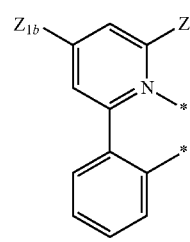
3-1(12)
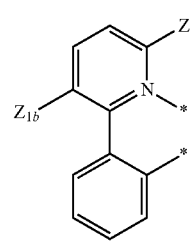

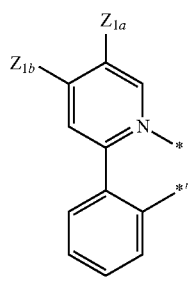 3-1(13)
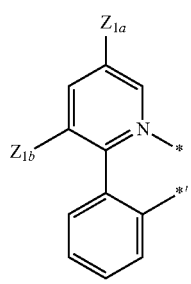 3-1(14)
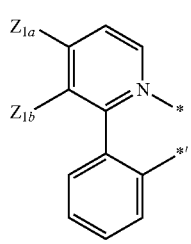 3-1(15)
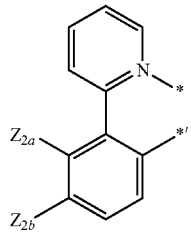 3-1(16)
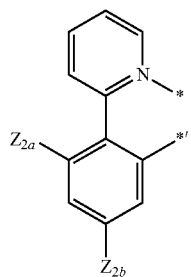 3-1(17)
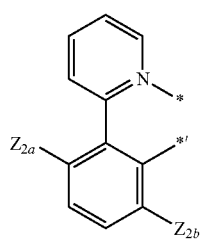 3-1(18)
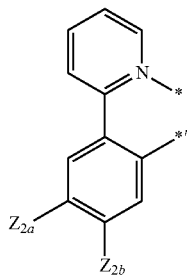 3-1(19)
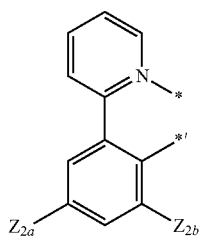 3-1(20)
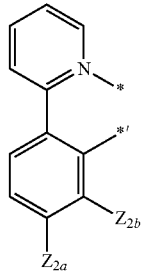 3-1(21)
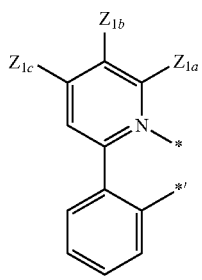 3-1(22)
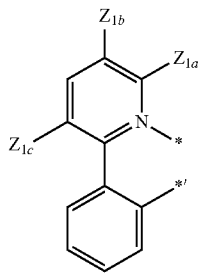 3-1(23)
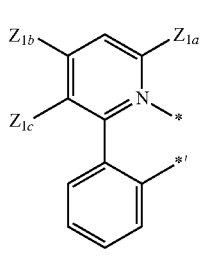 3-1(24)

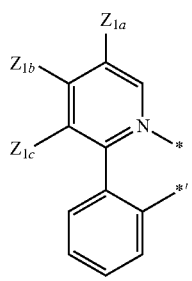 3-1(25)
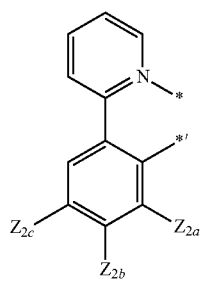 3-1(26)
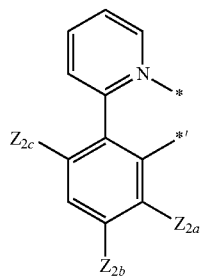 3-1(27)
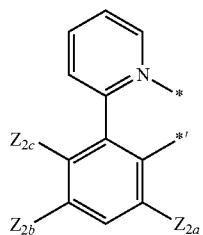 3-1(28)
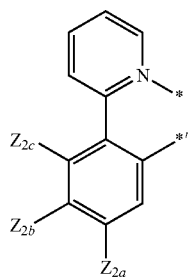 3-1(29)
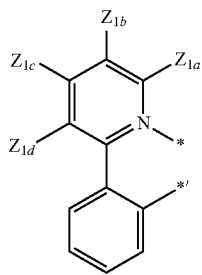 3-1(30)
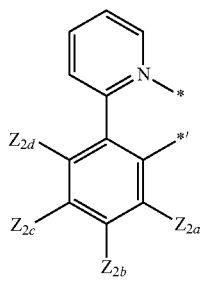 3-1(31)
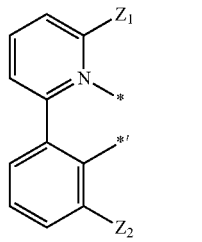 3-1(32)
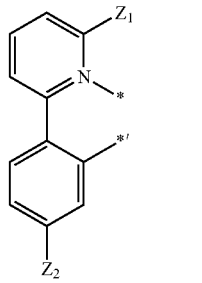 3-1(33)
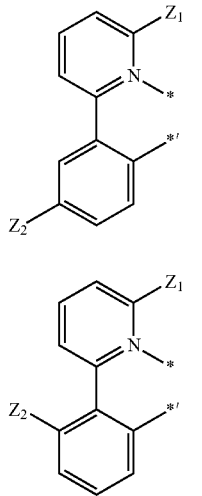 3-1(34)
3-1(35)

-continued
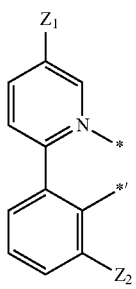
3-1(36)
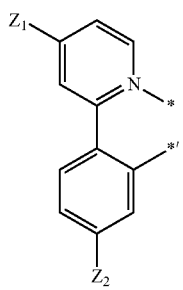
3-1(41)
3-1(37)
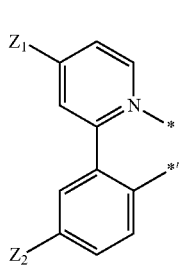
3-1(42)
3-1(38)
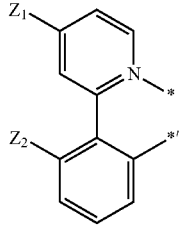
3-1(43)
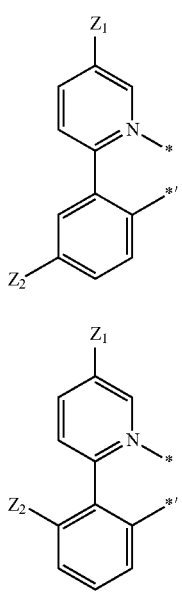
3-1(39)
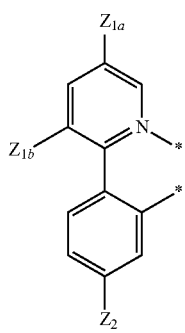
3-1(44)
3-1(40)
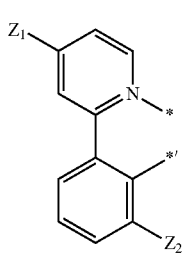
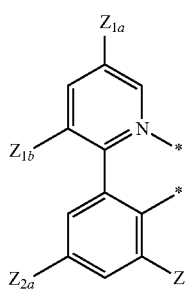
3-1(45)

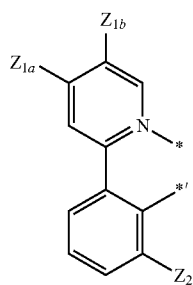 3-1(46)
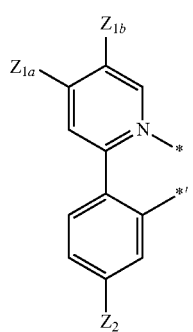 3-1(47)
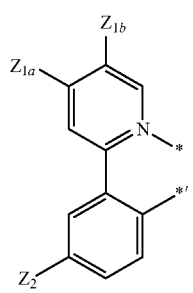 3-1(48)
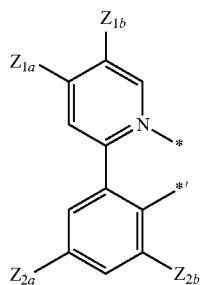 3-1(49)
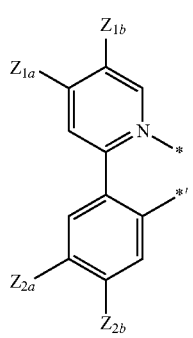 3-1(50)
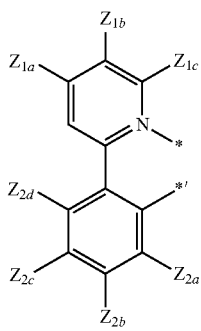 3-1(51)
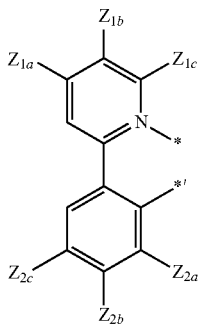 3-1(52)
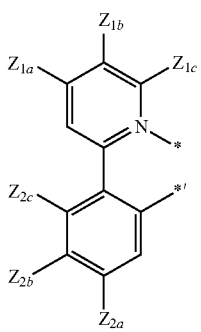 3-1(53)
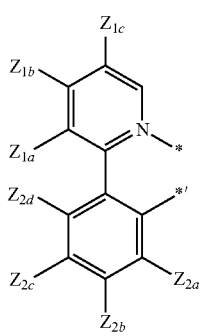 3-1(54)
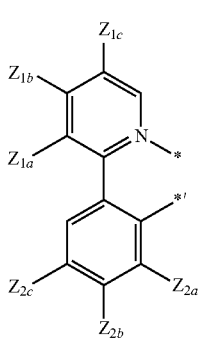 3-1(55)

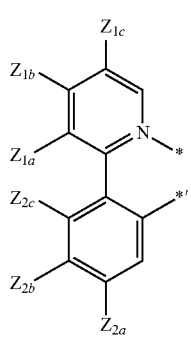 3-1(56)
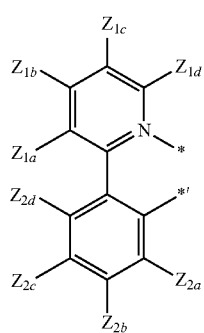 3-1(57)
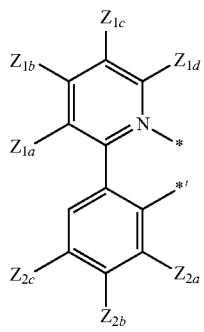 3-1(58)
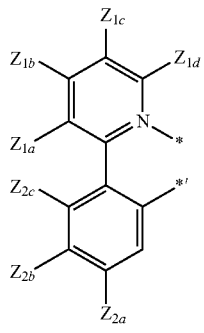 3-1(59)
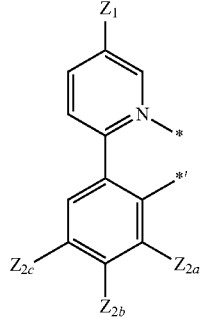 3-1(60)
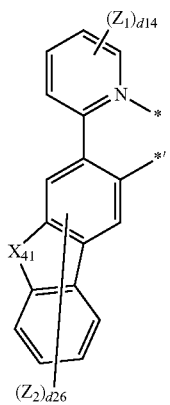 3-1(61)
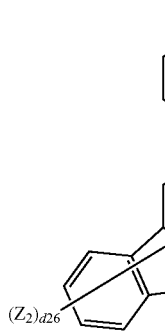 3-1(62)
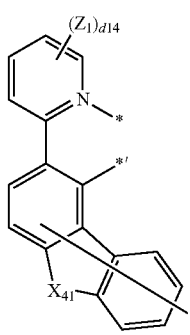 3-1(63)
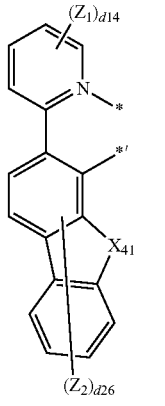 3-1(64)

205
-continued 3-1(65)
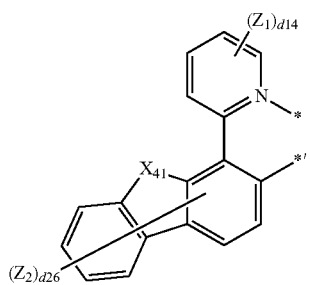

3-1(66)
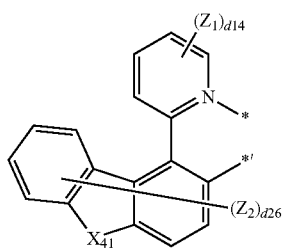

3-1(301)
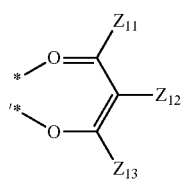

3-1(302)
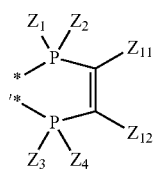

3-1(303)
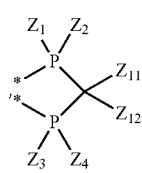

3-1(304)
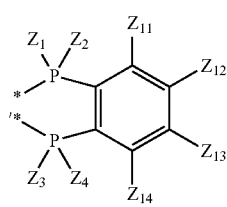

3-1(305)
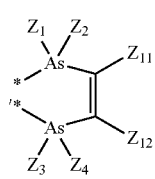

3-1(306)
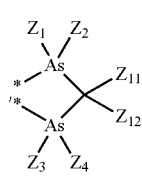

206
-continued 3-1(307)
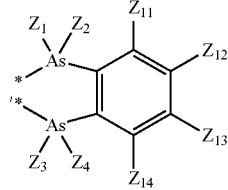

3-1(308)
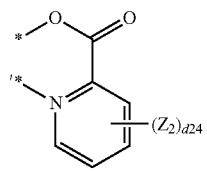

3-1(309)
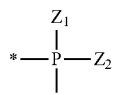

wherein, in Formulae 3-1(1) to 3-1(66) and 3-1(301) to 3-1(309), $X_{41}$ is O, S, $N(Z_{21})$, $C(Z_{21})(Z_{22})$, or $Si(Z_{21})(Z_{22})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, and $Z_{11}$ to $Z_{14}$ are the same as described in connection with $R_{21}$ in claim 1, d14 and d24 are each independently an integer from 0 to 4, d26 is an integer from 0 to 6, and

* and *' each indicate a binding site to M in Formula 1.

13. The organometallic compound of claim 1, wherein the organometallic compound is one of Compounds 2 and 3:

2

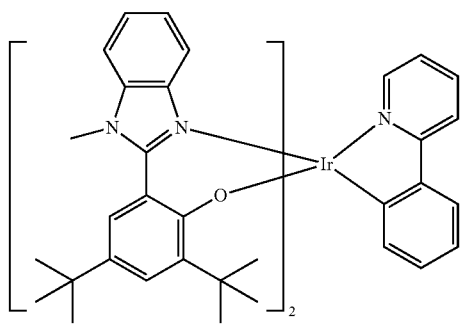

3

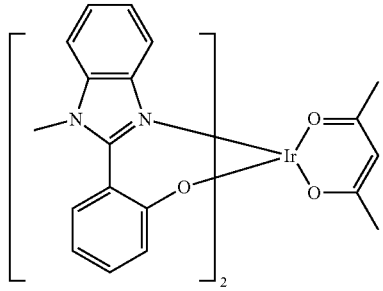

14. An organic light-emitting device comprising:
a first electrode,
a second electrode; and
an organic layer between the first electrode and the second electrode, wherein the organic layer comprises an emission layer and at least one of the organometallic compound of claim 1.

15. The organic light-emitting device of claim 14, wherein the first electrode is an anode,
the second electrode is a cathode,
the organic layer further comprises a hole transport region located between the first electrode and the emission layer and an electron transport region located between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

16. The organic light-emitting device of claim 14, wherein the organometallic compound is included in the emission layer.

17. The organic light-emitting device of claim 16, wherein the emission layer further comprises a host and the amount of the host is greater than the amount of the organometallic compound.

18. An electronic apparatus comprising the organic light-emitting device of claim 14.

* * * * *